United States Patent
Shibasaki et al.

(10) Patent No.: US 7,723,814 B2
(45) Date of Patent: May 25, 2010

(54) INSB THIN FILM MAGNETIC SENSOR AND FABRICATION METHOD THEREOF

(75) Inventors: Ichiro Shibasaki, Tokyo (JP); Hirotaka Geka, Tokyo (JP); Atsushi Okamoto, Tokyo (JP)

(73) Assignee: Asahi Kasei Kabushiki Kaisha, Osaka-shi (JP)

( * ) Notice: Subject to any disclaimer, the term of this patent is extended or adjusted under 35 U.S.C. 154(b) by 138 days.

(21) Appl. No.: 12/087,149

(22) PCT Filed: Dec. 27, 2006

(86) PCT No.: PCT/JP2006/326038
§ 371 (c)(1),
(2), (4) Date: Jun. 27, 2008

(87) PCT Pub. No.: WO2007/077865
PCT Pub. Date: Jul. 12, 2007

(65) Prior Publication Data
US 2009/0001351 A1    Jan. 1, 2009

(30) Foreign Application Priority Data
Dec. 27, 2005 (JP) ............................. 2005-376435

(51) Int. Cl.
*H01L 21/00* (2006.01)
(52) U.S. Cl. ........................ 257/421; 438/48
(58) Field of Classification Search ............. 257/421; 438/48
See application file for complete search history.

(56) References Cited

U.S. PATENT DOCUMENTS
5,385,864 A    1/1995    Kawasaki et al.

FOREIGN PATENT DOCUMENTS
| JP | 7-249577 A | 9/1995 |
| JP | 2000-138403 A | 5/2000 |
| JP | 2000-183424 A | 6/2000 |
| JP | 2000-208830 A | 7/2000 |

OTHER PUBLICATIONS

Atsudhi Okamoto, et al., Transport properties of Sn-doped InSb thin films and applications to Hall element, Journal of Crystal Growth, 251 (2003), pp. 560-564.
Atsushi Okamoto, et. al., Transport properties of InSb and InAs thin films on GaAs substrates, Journal of Crystal Growth, 278, (2005), pp. 604-609.

*Primary Examiner*—Douglas M Menz
(74) *Attorney, Agent, or Firm*—Birch, Stewart, Kolasch & Birch, LLP

(57) ABSTRACT

The present invention relates to a thin film lamination to be used in a micro InSb thin film magnetic sensor which can directly detect a magnetic flux density with high sensitivity and has small power consumption and consumption current, and the InSb thin film magnetic sensor. The InSb thin film magnetic sensor uses an InSb thin film as a magnetic sensor section or a magnetic detecting section. The sensor includes an InSb layer that is an InSb thin film formed on a substrate, and an $Al_xGa_yIn_{1-x-y}Sb$ mixed crystal layer ($0 \leq x$, $y \leq 1$) which shows resistance higher than the InSb layer or insulation, or p-type conduction, and has a band gap larger than that of InSb. The mixed crystal layer is provided between the substrate and the InSb layer, and has a content of Al and Ga atoms (x+y) in the range of 5.0 to 17%.

27 Claims, 10 Drawing Sheets

INSB THIN FILM MAGNETIC SENSOR AND FABRICATION METHOD THEREOF

TECHNICAL FIELD

The present invention relates to a thin-film lamination, an InSb thin-film magnetic sensor using the same, and a method for manufacturing the same, and more specifically, to a thin-film lamination to be used for a micro InSb thin-film magnetic sensor which can directly detect a magnetic flux density with high sensitivity and whose power consumption current is small, and a high-sensitivity InSb thin-film magnetic sensor using the same; and a method for manufacturing the same.

BACKGROUND ART

In mobile devices and small-sized battery-driven electronic devices, a power supply using a battery is used for driving electronic circuits for driving a sensor and controlling and processing sensor signals. For electronic components and magnetic sensors to be used in the electronic devices, power voltage reduction of the electronic power consumption has been demanded.

In a new application of a non-contact high-accuracy rotary sensor, a weak magnetic field sensor, a direction sensor using earth magnetism, and detection of a magnetic ink print pattern by detecting a weak magnetic field caused by magnetic ink, a Hall element and a magneto resistance element are required to satisfy the demands of high performance and high reliability, and high sensitivity for magnetic fields, high input resistances, and very small sizes. Moreover excellent flatness on the device surfaces, high element manufacturing accuracy, and less variation in performance and less variation in manufacturing accuracy are demanded. Further, lower dependency on temperatures around room temperature is also demanded. Such demands are many, and the demanded specifications are strict. Further, a micro size magnetic sensor has been demanded.

Particularly recently, application of a magnetic sensor such as a Hall element is being studied and the magnetic sensor is required to satisfy the demand of sensitivity for detection of ultraweak magnetic fields of microtesla or nanotesla in detection of ultra fine magnetic particles of 1 micron or submicron.

1) High sensitivity (large $\mu H$), 2) less temperature dependency (a donor impurity-doped, for example, Sn-doped operation layer=Sn-doped conduction layer), 3) low power consumption (high input resistance=thin operation layer), and 4) micro size device have been demanded.

To manufacture a magnetic sensor which satisfies the above-described demands, InSb having the highest electron mobility is optimal. Further, a thin-film material which has high electron mobility enabling manufacturing of a magnetic sensor with high magnetic field detection sensitivity and enabling manufacturing of a high-input resistance magnetic sensor that can be driven with very small voltage and current, that is, an InSb thin film which has a great sheet resistance and is, accordingly, very thin is required.

Conventionally, it is common that an InSb thin-film magnetic sensor such as a Hall element or a magneto resistance element is manufactured by using an InSb thin film obtained by directly growing InSb on an insulating substrate of GaAs, etc. However, when a magnetic sensor is manufactured by using this InSb thin film obtained by directly growing an InSb thin film on a GaAs substrate, if the electron mobility is increased to increase the sensitivity in a magnetic field, as a result, the electric conductivity increases and the sheet resistance lowers. Further, if the film thickness of InSb is increased as a means for improving the crystallinity to have large electron mobility, the sheet resistance lowers again.

Further, InSb must be doped with a donor impurity such as Si and Sn for the purpose of improvement in reduction of temperature dependency, however, all of these means lower the element resistance, and in conventional magnetic sensors having a magnetic sensitive portion formed of an InSb thin film, the element resistance inevitably lowers if the performance such as sensitivity is improved, and it is very difficult to realize both higher sensitivity and higher element resistance.

This problem is solved by thinning the InSb thin film of the element portion and increasing the sheet resistance, however, there is no substrate that has the same lattice constant as that of InSb and is insulative. Therefore, when an InSb thin film is grown on an insulative GaAs substrate, film thickness dependency of the performance such as the electron mobility is extremely great, and further, the crystallinity of the InSb thin film rapidly lowers with the film thickness reduction. As a result, when the InSb film thickness is small, the performance of the InSb thin film directly formed on the GaAs is very poor, and it is very difficult to make this thinner without performance deterioration.

This is caused by a difference in the lattice constant between the substrate on which the InSb thin film is grown and InSb, that is, great lattice mismatch between InSb and the substrate. GaAs and InP substrates are used as insulative single-crystal substrates to be normally used for growth of an InSb thin film thereon, however, these substrates are greatly different in the lattice constant from InSb. For example, the difference in the lattice constant between GaAs and InSb is 14%. There is no group III-V compound semiconductor whose lattice constant is equal to that of InSb. Therefore, GaAs substrates, InP substrates, Si substrates, and sapphire substrates have been used as substrates on which a single-crystal thin film of InSb is grown although lattice constants of these substrates are greatly different from that of InSb.

An attempt to eliminate such a great difference in the lattice constant from the substrates was made. For example, in Patent Document 1, to eliminate the difference in the lattice constant from InSb of an active layer (to match the lattice), a structure in which an InSb buffer layer doped with an acceptor impurity is placed on the substrate, an undoped InSb active layer is further formed, and next, an impurity is doped and a strained AlGaInSb carrier supply layer whose lattice constant in the horizontal direction with respect to the substrate surface is equal to the lattice constant of InSb is formed, and further, on this layer, an undoped InSb cap layer is formed, is proposed, however, as this structure is very complicated, it is difficult to be practically manufactured. The performance of the InSb layer in this structure in the case where a practical element is not manufactured seems good, however, this includes a great problem in the case where a practical element is manufactured.

In other words, in this structure, an undoped InSb layer that is a conductive layer made of the same material as the operation layer is formed on the top in addition to the operation layer. When an element such as a magnetic sensor is manufactured with this structure, normally, an insulating film is formed on and in contact with this conductive layer, however, it is known that the lattice of the InSb thin layer is broken due to lattice mismatch with the insulating film and impact when forming the insulating film, and this results in performance deterioration such as a carrier increase in the InSb layer and extreme lowering in electron mobility.

When a Hall element or a magneto resistance element is manufactured with this structure, the deteriorated InSb layer becomes a simple leak layer of the drive current of the element, the drive current flowing in the operation layer is branched and the current flowing in the operation layer becomes substantially small. This leak layer current remarkably deteriorates the performance such as magnetic field sensitivity. Therefore, this structure is unsuitable for manufacturing a magnetic sensor such as a practical Hall element, so that it is difficult to manufacture practical Hall element and magneto resistance element.

Further, in contact with the undoped InSb layer as an operation layer, formation of an acceptor impurity-doped InSb layer with the same lattice constant is essential. Provision of insulation at room temperature by doping an InSb layer that is an intrinsic semiconductor at room temperature or a higher temperature with an acceptor impurity is generally very difficult due to a small band gap (0.17 eV), so that it is impossible to obtain high insulation and high resistance. At room temperature or a higher temperature, in an InSb that does not serve as a p-type, it is impossible to obtain electric insulation by pn junction.

Thus, in the technique of Patent Document 1, a very complicated structure is necessary to eliminate the lattice constant difference and manufacture a high-performance InSb thin-film operation layer, and InSb that is not an operation layer must also be formed on the top of the structure. This construction has a great problem at room temperature or a higher temperature at which the magnetic sensor is used, and particularly, manufacturing of a practical InSb magnetic sensor usable across a wide temperature range from a low temperature to a high temperature is very difficult. Manufacturing of a practical magnetic sensor usable as a magnetic sensor, etc., installed in a vehicle, required to stably operate in a range of −40 to 150° C. or higher has not been realized yet.

It is conventionally impossible to manufacture a very thin film of InSb and manufacture a high-sensitivity magnetic sensor such as a Hall element by using the conventional technique. Particularly, a technique for manufacturing a high-sensitivity magnetic sensor by obtaining high electron mobility in a very thin InSb single-crystal thin film with a thickness of 0.5 micrometers or less or 0.2 micrometers has not been found yet.

Therefore, the present inventors examined a high-sensitivity, high-resistance, and practical InSb magnetic sensor using an InSb single-crystal thin film which the conventional technique had not realized as an operation layer, and a method for manufacturing this sensor.

It would be convenient if an insulating substrate of a group III-V compound semiconductor lattice-matched with InSb could be manufactured, however, such a substrate does not exist. Therefore, in manufacturing of an InSb thin film, lattice mismatch with the substrate is a great problem. Therefore, it is necessary to create a technique for manufacturing an InSb single-crystal thin film with excellent crystallinity and high electron mobility regardless of this lattice mismatch, and this is an object of the present invention.

Therefore, the inventors have taken on the challenge of researching a crystal growing method by which an InSb thin film could be obtained without the preconditions of lattice matching. That is, they researched a crystal growing technique by which a thin film with excellent performance could be obtained by growing the single crystal of InSb regardless of lattice mismatch with the substrate on which InSb is grown. As a result, they found that InSb being excellent in quality although its thickness was small grown by growing a group III-V mixed crystal layer satisfying special conditions in which it was insulative and had smaller mismatch although its lattice mismatches with InSb, on a substrate, and growing InSb on this mixed crystal layer by means of molecular beam epitaxy (MBE).

That is, it was found that, even if the mixed crystal layer with which the InSb thin film was in direct contact and InSb had a lattice mismatch with each other, when the lattice mismatch was in a certain range, and the composition and crystallinity of the mixed crystal layer satisfied predetermined conditions, the performance of InSb to be grown on the mixed crystal layer was excellent.

For example, when InSb is directly grown on a GaAs substrate, the lattice mismatch is 14%, and in a case of an InSb thin film with a thickness not more than 1 micrometer, high electron mobility cannot be obtained even if it is a single-crystal thin film. Further, with a reduction in film thickness to 0.5 micrometers, and even further, to 0.2 micrometers, the electron mobility of InSb rapidly lowers. This is shown by the experimental data indicated by the line of square marks in FIG. 10.

FIG. 10 is a graph showing a relationship (triangle marks) between the film thickness and electron mobility of the InSb thin film directly formed on a GaAs substrate.

From the data of FIG. 10, it is known that, when the thickness of the InSb thin film is 0.1 micrometer, a very small value of 3,000 cm$^2$/Vs is observed, and manufacturing of a high-sensitivity magnetic sensor is difficult. This is an inevitable result from the 14% lattice mismatch. The electron mobility of InSb grown on this GaAs is also shown in Non-Patent Document 1.

The above-described structure of Patent Document 1 eliminates lattice mismatch by using a p-type or insulating InSb (doped) layer formed on an AlGaInSb layer as a buffer layer, and the film quality of InSb (undoped) as an operation layer formed on the buffer layer is secured.

According to Non-Patent Document 1, in the InSb thin film directly formed on the GaAs substrate, the existence of a low-electron mobility layer formed in the vicinity of a hetero interface between the GaAs substrate and InSb due to lattice mismatch based on a 14% difference in the lattice constant between the GaAs substrate crystal and InSb, and the existence of a low-electron mobility layer naturally formed on the InSb thin film surface are described. Due to low-electron mobility layers on both surfaces of the InSb thin film, the electron mobility becomes smaller (lower) as the InSb film thickness becomes smaller. Particularly, when the InSb film becomes thinner than 0.2 micrometers, the electron mobility lowering of the InSb thin film is remarkable, and manufacturing of an InSb Hall element with practical sensitivity is conventionally difficult.

This electron mobility lowering of the InSb thin film according to film thickness reduction corresponds to the existence of a low-electron mobility layer produced at the hetero interface with the GaAs substrate and the thickness thereof during crystal growth. The thickness of this low-electron mobility layer is generally 0.1 to 0.2 micrometers although this depends on the crystal growth conditions. To increase the electron mobility of the InSb thin film at very small thin film thickness, it is necessary to reduce or eliminate the thickness of the low-electron mobility layer.

According to Non-Patent Document 1, it is known that the InSb thin film grown on the GaAs substrate greatly changes in electron mobility and electron concentration in the thickness direction, and describing based on a simple model of distribution of properties of the thin film, these changes consist of a low-electron mobility layer which is in contact with the hetero interface with the substrate and is grown first (layer which has many defects due to lattice mismatch with the substrate and is not excellent in physical properties), and a high-electron mobility layer (layer which is not influenced by mismatch and is improved in physical properties and have very few defects).

If the high-electron mobility layer with high electron mobility is thick, that is, by reducing the thickness ratio of the low-electron mobility layer, the electron mobility of the InSb thin film increases, and a magnetic sensor such as a high-sensitivity Hall element can be manufactured.

The high-electron mobility layer can be easily increased in thickness by simply increasing the InSb film thickness, however, in this case, an input resistance becomes smaller when a magnetic sensor is manufactured, and this poses a problem such as an increase in power consumption of the magnetic sensors, and is disadvantageous in practicability.

To increase the input resistance, the InSb thin film must be thinned, however, in this case, the high-electron mobility layer becomes extremely thin or, depending on circumstances, it completely disappears, so that an InSb thin film with high electron mobility cannot be obtained. For example, with a film thickness smaller than 0.2 micrometers, most of the portion with high electron mobility disappears. Even with the thickness of 0.3 micrometers, the low-electron mobility layer becomes thicker than the high-electron mobility layer, and as a result, the electron mobility is not as high as expected.

Thus, when the InSb film thickness is not more than a thickness substantially corresponding to the thickness of the low-electron mobility layer formed in the vicinity of the hetero interface or occupies 50% or more of the film thickness, the electron mobility extremely lowers, and therefore, it is conventionally impossible to manufacture a practical magnetic sensor such as a high-sensitivity Hall element. This is also obvious from the relationship between the film thickness and the electron mobility when an undoped InSb thin film is directly grown on a GaAs (100) substrate as shown in Non-Patent Document 1 and FIG. 10.

When the film thickness of InSb is thus reduced, the layer with high electron mobility described in Non-Patent Document 1 becomes extremely thin, and most of the InSb thin film lowers in electron mobility, so that the electron mobility of the entire InSb thin film rapidly lowers.

Even when the substrate changes from GaAs to other substrates, the same phenomenon occurs if the film has lattice mismatch with the substrate. Thus, to manufacture a high-sensitivity magnetic sensor, an InSb thin film having great electron mobility is essential, however, if the film thickness of InSb becomes small, the electron mobility rapidly lowers. Therefore, conventionally, with an extremely thin InSb film, a thin-film lamination including a conductive layer of InSb used as an operation layer of a magnetic sensor capable of detecting magnetic fields with high sensitivity and an InSb magnetic sensor using this thin-film lamination in the magnetic sensor section cannot be manufactured.

When the InSb film thickness is reduced, a high sheet resistance can be expected, however, the electron mobility which determines the sensitivity of the magnetic sensor becomes extremely low. For example, the electron mobility of an InSb thin film with a thickness of 1.0 micrometer directly formed on a GaAs (100) substrate exceeds 50,000 $cm^2$/Vs, however, the electron mobility of an InSb thin film with a thickness of 0.3 micrometers is about 20,000 $cm^2$/Vs, and in the case of a film thickness of 0.2 micrometers, the electron mobility is not more than 10,000 $cm^2$/Vs, and in the case of an InSb thin film with a thickness of 0.15 micrometers, the electron mobility is about 7000 $cm^2$/Vs or less, and in the case of 0.1 micrometers, the electron mobility is not more than 5,000 $cm^2$/Vs or less, so that the electron mobility rapidly lowers according to film thickness reduction. From this fact, it is understood that the thickness of the layer portion with low electron mobility of the InSb thin film is 0.15 to 0.2 micrometers.

Thus, the electron mobility rapidly lowers with an InSb film thickness reduction, and reaches an extremely small value. Therefore, the sensitivity of the magnetic sensor using this InSb thin film in the sensor section rapidly lowers with the InSb film thickness, and a magnetic sensor such as a high-sensitivity practical Hall element or magneto resistance element cannot be manufactured. Thus, in the example of the InSb thin film directly formed on the GaAs substrate, it is known that the electron mobility greatly changes according to the film thickness of InSb due to a great lattice mismatch, that is, the electron mobility rapidly lowers with a film thickness reduction.

Reiterating once again, particularly, when the film thickness is reduced to 0.2 micrometers or less, due to the effect of lattice mismatch, the electron mobility of the InSb thin film formed on the GaAs substrate rapidly lowers. This is caused by great changes in properties of the InSb thin film grown on the GaAs substrate in the film thickness direction. Therefore, in the conventional technique, there is no thin film suitable with a thickness not more than 0.2 micrometers for manufacturing a practical high-sensitivity Hall element or magneto resistance element. However, a magnetic sensor such as an InSb Hall element or magneto resistance element with a high input resistance using an InSb thin film for the magnetic sensor section or portion is extremely important in terms of application. The needs for this are also high, however, it is mentioned here that neither an InSb thin film nor a magnetic sensor having high electron mobility usable for a practical magnetic sensor were manufactured in the past.

Next, reasons for production of this low-electron mobility layer will be described.

One of the reasons is, in particular, the existence of a portion with a high lattice defect density in the vicinity of the hetero interface between the substrate and InSb. That is, through analysis of electron transfer unique to the InSb thin film, it was found that InSb had a great lattice mismatch with GaAs, and a layer with a thickness not more than 0.2 microns from the hetero interface with GaAs had a high lattice defect density, poor crystallinity of InSb, and low electron mobility, and as a result, it formed a layer with extremely low electron mobility, and the electron mobility thereof was as extremely low as several thousand or less (for example, refer to Non-Patent Document 1). As a result, it is inevitable that the electron mobility of the InSb thin film has great film thickness dependency, and as the InSb becomes thinner, the physical properties such as electron mobility important in manufacturing a magnetic sensor rapidly lower.

However, if an insulating substrate whose lattice constant is equal to that of InSb is obtained, this problem may be solved, however, it is known that an insulating or insulative material of a group III-V compound semiconductor does not exist. As a result, phenomenologically and logically, mass production on an industrial scale of an InSb thin film or a thin-film lamination with a thickness not more than 0.3 micrometers, further, not more than 0.2 micrometers from which a practical InSb thin film magnetic sensor such as an InSb Hall element or magneto resistance element with high sensitivity and high input resistance is likely to be manufactured, is impossible.

Further, as described in Non-Patent Document 1, a thin layer which has low electron mobility and an about 50 nanometer thickness was also found on the surface layer of the InSb thin film from a detailed examination of the phenomenon of electron transfer in the InSb thin film. The cause of this is considered that, when the substance is neither air in nor a vacuum, the lattice of the portion with a thickness of about 50 nanometers inside the InSb surface is strained and forms a thin layer with low electron mobility. This low-electron mobility layer on the surface portion also influences the film thickness dependency which lowers with the InSb film thickness reduction.

Therefore, with a thickness not more than the thickness added with the thicknesses of the two low-electron mobility layers formed at the hetero interface between the surface and the substrate, an InSb thin film with high electron mobility cannot be manufactured. The thickness of this is about 0.2 micrometers.

To manufacture a practical magnetic sensor such as a high-sensitivity InSb thin-film Hall element, the comparatively thick low-electron mobility layers formed in the vicinities of the interface between the InSb thin film and the substrate and the surface of the InSb thin film caused by the above-described various factors are a big problem. That is, it is a big obstacle or problem to manufacture a practical magnetic sensor using an extremely thin film of InSb as a magnetic sensor section, and elimination or reduction in thickness of the low-electron mobility layers to be extremely thin are extremely important technical issues that should be solved.

In practical use of a magnetic sensor such as a Hall element, high reliability has been conventionally demanded. That is, in industrial use or use as an in-vehicle sensor, provision of high performance in reliability relating to practical use such as improvement in reliability, durability, and environment resistance performance have been demanded. Therefore, it has been demanded that a protective film, that is, a passivation film for the InSb thin film surface is formed. In other applications, for example, in magnetic microparticle detection by using an InSb Hall element, it has been demanded that the sensor section of the InSb thin film is made to approach a distance of several tens of micron, micron, and still further, submicron to a measuring target and detects the magnetic field. Therefore, it is required that a protective film of the InSb thin-film surface is formed so as not to damage the InSb thin film or the surface thereof when measuring the magnetic field.

On the surface of the InSb thin film of the magnetic sensor section, for the purpose of securing reliability of the element or the purpose of relaxing the stress on the thin film caused by heat generated during heat curing of a package resin, etc., an insulating film, for example, an insulating film of $Si_3N_4$ or $SiO_2$, etc., is formed. That is, a protective layer or a protective film is formed. This protective layer is different not only in the crystal lattice but also in the lattice constant from InSb, and further, in the case of manufacturing by plasma CVD, the surface of InSb is exposed to collision of plasma ions, and is frequently damaged. By way of exception, the protective layer may not be formed, however, in the manufacturing process of the magnetic sensor, this protective layer is ordinarily formed and is essential.

Thus, on the upper surface of the InSb thin film constituting the magnetic sensor section, formation of a protective film is needed. However, this formation of a protective film damages the thin film portion proximal to the surface of the InSb thin film constituting the magnetic sensor section, and results in great deterioration in the performance of the thin film, and desired magnetic sensor performance cannot be obtained. This is a process fluctuation and damage inevitably occurring in the process of forming the protective layer.

As the damage of the InSb thin film due to formation of the protective film, the sensitivity lowers by about 10% (electron mobility lowering of the InSb thin film) according to the insulating film formation when an InSb thin film with a thickness of 1 micrometer is manufactured as a Hall element, however, if the thickness is reduced, this lowering remarkably increases, and in the case of a thickness of 0.3 microns, this sensitivity lowering amount is 40% to 70% and more depending on circumstances.

Table 1 shown below shows the relationship between the lowering in electron mobility of the InSb thin film and the InSb film thickness when SiN with a thickness of 0.3 micrometers is formed on the surface.

TABLE 1

| InSb film thickness (μm) | Electron mobility lowering (%) |
|---|---|
| 0.6 | 10% |
| 0.5 | 20% |
| 0.4 | 30% |
| 0.3 | 40% |

Therefore, it is impossible to manufacture a desired high-sensitivity magnetic sensor. The reason for this is considered that the surface of the InSb thin film is broken due to an impact of the plasma CVD or lattice mismatch, and the electron mobility of the broken portion becomes lower, and a comparatively thick layer with low electron mobility is formed in the vicinity of the surface in the InSb thin film, and as a result, great performance deterioration in the InSb thin film is caused.

Formation of a protective layer and an impact when forming a protective layer forms a low-electron mobility layer with a certain thickness in the surface of the InSb thin film as a result, and causes deterioration in the performance of the element. This low-electron mobility layer has a thickness of 50 to 100 nanometers (0.10 to 0.05 micrometers) although this depends on the conditions of protective layer formation, and is thicker than the thickness of 50 nanometers of the low-electron mobility layer which is naturally formed on the surface of the InSb thin film. Therefore, to increase the electron mobility of the InSb thin film formed by epitaxial growth on the substrate, it is essential to make the InSb thin film as thin and small as possible or eliminate the low-electron mobility layer formed in contact with a hetero interface between the InSb thin film surface and the substrate.

A solution for such problems of performance deterioration in the InSb layer relating to the protective film formation has been demanded for a long time. That is, an InSb magnetic sensor structure which does not cause performance fluctuation in the process of manufacturing the InSb thin film as an element by avoiding deterioration in performance of the InSb thin film due to formation of insulation, that is, a protective layer on the surface of the magnetic sensor section or realization of an element structure which does not structurally cause performance deterioration in the InSb thin film has been demanded.

The present invention was made in view of these problems, and an object thereof is to provide a thin film lamination to be used for a micro InSb thin film magnetic sensor which can directly detect magnetic flux density with high sensitivity and whose power consumption are small, an InSb thin film magnetic sensor using the same thin film lamination, and a method for manufacturing the same.

[Patent Document 1] Japanese Patent Laid-Open No. 2000-183424

[Non-Patent Document 1] Journal of Crystal Growth, Vol. 251, pp. 560-564 and Vol. 278, pp. 604-609

DISCLOSURE OF THE INVENTION

The present invention was made to achieve the above-described object, and the present invention provides a thin film lamination that includes an InSb layer as an InSb thin film formed on a substrate and an $Al_xGa_yIn_{1-x-y}Sb$ ($0 \leq x, y \leq 1$) mixed crystal layer which shows the property of resistance higher than that of the InSb layer or insulation and has a band gap larger than that of InSb, wherein the mixed crystal layer is provided between the substrate and the InSb layer, the content of Al and Ga atoms (x+y) is in the range of 5.0 to 17% ($0.05 \leq x+y \leq 0.17$) or lattice mismatch with the mixed crystal layer in contact with the InSb layer is in the range of 0.25 to 1.0%.

In addition, the full width at half maximum of a rocking curve of the mixed crystal layer by X-ray diffraction from a (004) lattice plane is not less than 1 second and not more than 1300 seconds.

The electron concentration of the InSb layer at room temperature is in the range of $1.2 \times 10^{16}$ to $5.0 \times 10^{18}$ $cm^{-3}$.

The InSb layer is doped with any of donor impurities Sn, Si, S, Te, and Se.

A second $Al_xGa_yIn_{1-x-y}Sb$ mixed crystal layer that is the same as the above-described $Al_xGa_yIn_{1-x-y}Sb$ mixed crystal layer is provided as an insulative semiconductor protective layer on the surface of the InSb layer opposite to the surface in contact with the substrate.

The InSb layer has a low-electron mobility layer, and the low-electron mobility layer is in contact with the $Al_xGa_yIn_{1-x-y}Sb$ mixed crystal layer, and has a thickness not less than 0.5 nanometers and not more than 30 nanometers.

The low-electron mobility layer is in contact with the interfaces between the InSb layer (or operation layer) and the substrate, and the second $Al_xGa_yIn_{1-x-y}Sb$ mixed crystal layer.

The $Al_xGa_yIn_{1-x-y}Sb$ mixed crystal layer or the second $Al_xGa_yIn_{1-x-y}Sb$ mixed crystal layer is an $Al_xIn_{1-x}Sb$ mixed crystal layer.

The present invention provides a method for manufacturing a thin film lamination, includes at least the step of laminating the predetermined $Al_xGa_yIn_{1-x-y}Sb$ mixed crystal layer on the substrate, then forming a low-electron mobility layer of InSb at a substrate temperature set so that its difference from the substrate temperature is within is $\pm 5°$ C., and subsequently forming a high-electron mobility layer.

The present invention provides an InSb thin film magnetic sensor using the InSb layer of the thin film lamination as a magnetic sensor section.

The InSb layer is an operation layer of any of a Hall element, an element using the Hall effect, an element using the Hall effect, a magneto resistance element, and an element using the magneto resistance effect.

The thickness of the InSb layer is not less than 8 nanometers and not more than 2,000 nanometers.

The thickness of the $Al_xGa_yIn_{1-x-y}Sb$ mixed crystal layer is not less than 50 nanometers and not more than 3000 nanometers.

The InSb layer is a single crystal.

The thickness of the InSb layer is not less than 8 nanometers and not more than 300 nanometers.

A second $Al_xGa_yIn_{1-x-y}Sb$ mixed crystal layer is provided as a semiconductor protective layer on the InSb layer.

The $Al_xGa_yIn_{1-x-y}Sb$ mixed crystal layer or second $Al_xGa_yIn_{1-x-y}Sb$ mixed crystal layer, or both of these are $Al_xIn_{1-x}Sb$ mixed crystal layers which do not contain Ga.

The $Al_xGa_yIn_{1-x-y}Sb$ mixed crystal layer or second $Al_xGa_yIn_{1-x-y}Sb$ mixed crystal layer, or both of these are $Al_{0.1}In_{0.9}Sb$ mixed crystal layers.

On the second $Al_xGa_yIn_{1-x-y}Sb$ mixed crystal layer, a GaAs layer is further provided.

The InSb layer is doped with a donor impurity.

The donor impurity belongs to group 4 or group 6 like Sn, Si, S, Te, or Se, etc.

The InSb layer is doped with a donor impurity at a portion except 1.5 to 20 nanometers from the interface with the $Al_xGa_yIn_{1-x-y}Sb$ mixed crystal layer.

A metal thin film as an electrode is formed in contact with a predetermined surface portion of the InSb tin film, and on at least the surface of the InSb thin film at the portion where the metal thin film is formed, and the donor impurity is doped with a large amount of a donor impurity than at other portions.

The InSb thin film magnetic sensor is a Hall element or magneto resistance element.

The present invention provides a method for manufacturing an InSb thin film magnetic sensor, including the step of laminating the $Al_xGa_yIn_{1-x-y}Sb$ mixed crystal layer at a predetermined substrate temperature on the substrate, then forming a low-electron mobility layer of the InSb thin film at a substrate temperature whose difference from the above-described substrate temperature is set within $\pm 5°$ C., and further forming a high-electron mobility layer.

The inventors examined a technique for forming a new insulative or high-resistance layer between the thin film and the substrate for the purpose of solving electron mobility lowering relating to such film thickness dependency. There is no insulative substrate or insulating layer of a group III-V compound semiconductor with the same crystal structure as that of InSb. A group III-V semiconductor which lattice-matches with InSb is only InSb, and InSb is still an n-type conductor at room temperature or a higher temperature even if it is doped with an impurity, so that InSb cannot be used as an insulating layer below the operation layer.

When a group III-V semiconductor including strain is used for a lattice match with InSb, the semiconductor including strain may cause strain relaxation from a high-temperature thermal effector an impact from the outside, so that the inventors considered that use of this for a practical magnetic sensor usable even at a high temperature should be avoided.

Therefore, the inventors examined the possibility of magnetic sensor manufacturing, completely different from the conventional concept, by growing a high-quality InSb thin film involving crystal growth and a thin-film structure without assuming lattice match, that is, while assuming lattice mismatch although lattice match was preferable. As a result, the inventors found that a high-quality InSb thin film could be grown without assuming lattice match.

First, the inventors focused on an $Al_xGa_yIn_{1-x-y}Sb$ (0<x<1) mixed crystal layer which was a less-mismatch material having a lattice constant close to that of InSb although it was not equal to InSb and whose insulation or high-resistance could be expected across a wide temperature range.

When the Al content is zero or close to zero, this mixed crystal layer composed of three kinds of atoms becomes a material with a narrow band gap close to that of InSb, not an insulating layer. However, when a certain amount of Al is contained, the crystal in this composition shows high-resistance, insulation, or p-type conductivity, and may function as an insulating layer on the substrate, and the examiners examined this.

In manufacturing of this $Al_xIn_{1-x}Sb$ (0<x<1) mixed crystal layer, for example, crystal can be grown on, for example, a GaAs substrate by selecting appropriate growth conditions according to molecular beam epitaxy. However, when the Al proportion is small, it becomes conductive and does not function as an insulating layer. In the case of a composition including a high Al proportion, the lattice match to InSb is remarkably lost, so that lattice mismatch is great. Therefore, manufacturing of this $Al_xIn_{1-x}Sb$ mixed crystal layer was not researched in detail in the past, and this material was impossible as an insulating layer for growing InSb thereon. Focusing on this material, the inventors repeatedly conducted experiments of growing an insulating layer by means of molecular beam epitaxy and growing an InSb thin layer on this insulating layer.

As a result, it was found that this $Al_xIn_{1-x}Sb$ (0<x<1) mixed crystal layer served as an insulative or high-resistance layer when appropriate proportions of Al and In were selected, and further, when the $Al_xIn_{1-x}Sb$ (0<x<1) mixed crystal layer satisfied predetermined conditions, even if it does not have the same crystal lattice interval (lattice constant) as that of InSb, that is, it had lattice mismatch, if a certain condition is satisfied, an InSb thin film grown by means of molecular beam epitaxy on this mixed crystal layer had extremely high electron mobility although it was thin in thickness. That is, the thickness of the low-electron mobility layer with low electron mobility is reduced.

Further, it was found that an $Al_xGa_yIn_{1-x-y}Sb$ (0<x<1, 0≦y<1) mixed crystal layer composed of four kinds of atoms obtained by adding a slight amount of Ga to the $Al_xIn_{1-x}Sb$ (0<x<1) mixed crystal layer composed of three kinds of atoms also served as an insulative or high-resistance layer by selecting appropriate composition parameters x and y, and further, when a certain condition was satisfied, an InSb thin film grown by means of molecular beam epitaxy on this layer had extremely high electron mobility.

In this specification, $Al_xGa_yIn_{1-x-y}Sb$ (0<x<1, 0≦y<1) may be abbreviated to AlGaInSb, and similarly, $Al_xIn_{1-x}Sb$ (0<x<1) may be abbreviated to AlInSb as appropriate.

Further, in the present invention, unless a specific meaning is specified, the AlGaInSb mixed crystal layer (0≦x, y≦1) means that the content of Al and Ga atoms (x+y=) of the $Al_xGa_yIn_{1-x-y}Sb$ mixed crystal layer (0≦x, y≦1) is in the range from 5.0 to 17% (0.05≦x+y≦0.17) or the lattice mismatch with the insulative $Al_xGa_yIn_{1-x-y}Sb$ mixed crystal layer in contact with the InSb conductive layer is in the range from 0.25 to 1.0%. Of course, $Al_xIn_{1-x}Sb$ when y=0 is also included in this range.

The $Al_xGa_yIn_{1-x-y}Sb$ mixed crystal layer (0<x<1, 0≦y<1) of the present invention which has resistance higher than that of the InSb layer or insulation or p-type conductivity and has a band gap larger than that of InSb, and further has a content of Al and Ga atoms (x+y) in the range from 5.0 to 17% (0.05≦x+y≦0.17) or lattice mismatch with the insulative $Al_xGa_yIn_{1-x-y}Sb$ mixed crystal layer that is in the range from 0.25 to 1.0% in contact with the InSb conductive layer is called an insulating layer or buffer layer, and this layer is equivalent to a layer that has resistance higher than that of the InSb layer or insulation or p-type conductivity, equivalent to a layer having a band gap larger than that of InSb, and serves substantially as an insulating layer, and this may be called simply an insulating layer, however, this means as described above normally.

According to the inventors' research, it was found that, in an example in which a thin film of $Al_xIn_{1-x}Sb$ (0<x<1) was grown on a GaAs substrate by means of molecular beam epitaxy, and further, InSb was grown thereon, the electron mobility of a grown InSb layer greatly depended on the crystallinity of the $Al_xIn_{1-x}Sb$ (0<x<1) layer. It was further found that according to an increase in Al content, the crystallinity of the $Al_xIn_{1-x}Sb$ (0<x<1) mixed crystal layer deteriorated generally, and its lattice mismatch with InSb also increased as the Al content increased, so that when the Al content was not less than 17% (lattice constant difference: 1.0% or more), an InSb single-crystal thin film with high electron mobility did not grow.

Further, at the case of the Al composition with a lattice constant very close to that of InSb, that is, at the case of the Al content is not more than 5% (lattice constant difference: 0.25% or less), the resistivity of the mixed crystal layer rapidly decreases and becomes a conductive layer, and the $Al_xIn_{1-x}Sb$ (0<x<1) layer does not play the role of the insulating layer. As a result, only when the Al proportion is between 17% and 5% and the crystallinity of the mixed crystal layer is more than a certain level, the electron mobility becomes 27,000 cm$^2$/Vs or more or, depending on the crystal growth conditions, 40,000 cm$^2$/Vs or more even if the thickness is 0.15 micrometers.

It was found that an InSb layer with a thickness of 0.3 micrometers is grown, an InSb single-crystal thin film with high electron mobility of 36,000 cm$^2$/Vs or more or, depending on the crystal growth conditions, 50,000 cm$^2$/Vs or more could be manufactured. Therefore, crystallinity of an $Al_xIn_{1-x}Sb$ (0<x<) layer for growing an InSb thin film with high electron mobility was investigated by means of X-ray diffraction.

Specifically, crystallinity of the $Al_xGa_yIn_{1-x-y}Sb$ (0<x≦1) mixed crystal layer grown on the GaAs substrate and further, crystallinity of the $Al_xGa_yIn_{1-x-y}Sb$ (0<x≦1, 0≦y<1) mixed crystal layer were investigated by using Kα beam of Cu as an X-ray source and by investigating the relationship between the full width at half maximum of the rocking curve at a peak corresponding to the mixed crystal layer obtained from a (004) diffracted surface of the $Al_xGa_yIn_{1-x-y}Sb$ mixed crystal layer, in the X-ray diffraction conducted by using parallel beam optics of X-ray and InSb electron properties or a thickness of a low-electron mobility layer formed in the vicinity of the hetero interface.

When an InSb thin film is directly grown on a GaAs substrate, at a hetero interface between InSb and GaAs substrate, a layer with low electron mobility (layer with a large electron concentration derived from a lattice defect of the portion with low electron mobility with more implantation caused by lattice mismatch) is formed. The thickness of a layer with low electron mobility of 10,000 cm$^2$/Vs or less is about 0.2 micrometers or 200 nanometers. Therefore, in an example in which an InSb layer that is thin, for example, has a thickness of 0.15 micrometers that is directly formed on a GaAs substrate, only low electron mobility as low as 7,000 cm$^2$/Vs is obtained.

Therefore, it was found that, when the lattice mismatch with InSb was in the range from 0.25 to 1.0% and the full width at half maximum of the peak of X-ray diffraction obtained from the (004) surface showing the quality of crystal in this AlInSb mixed crystal layer was 1300 seconds or less, more preferably, 1000 seconds or less, and further preferably 500 seconds or less, high electron mobility of the InSb conductive layer was obtained even if the lattice constant was not equal to that of InSb.

In other words, for example, when an $Al_xIn_{1-x}Sb$ (0<x<1) mixed crystal layer satisfying the above-described conditions is formed on a GaAs (100) substrate and InSb is grown to a thickness of 0.15 micrometers thereon, the electron mobility of the InSb layer shows a great value exceeding 27,000 cm$^2$/

Vs. When an InSb layer is directly grown to 0.15 micrometers-on a GaAs substrate, the electron mobility is as low as 7,000 cm$^2$/Vs, and the difference between these mobility values is extremely great, and due to the existence of the insulating layer satisfying the above-described conditions, quadrupling of the electron mobility of the InSb layer can be obtained. FIG. 10 shows a comparison between the example of the present invention and conventional technique.

The reason why this great difference is caused is considered that, although it is not completely explained, it is presumed that the lattice constant of the AlInSb mixed crystal layer on which InSb grows is close to that of InSb, and further, excellent crystallinity with a full width at half maximum not more than 1300 seconds of the X-ray diffraction peak provide ideal crystal growth conditions which minimize the influence from lattice mismatch in the InSb crystal growth. As a result, the low-electron mobility layer of InSb adjacent to the hetero interface becomes extremely thin, so that an InSb thin film with excellent crystallinity and high electron mobility is obtained.

For example, a low-electron mobility layer formed within the InSb thin film at the hetero interface between the AlInSb mixed crystal layer as a ternary mixed crystal and InSb was extremely thin, and from thickness dependency of electron concentration, etc., the thickness was about 10 nanometers or at most 30 nanometers, so that it was found that this layer could be made extremely thin. Depending on circumstances, it was found that the low-electron mobility layer was about 3 nanometers in thickness.

As in the case of this example, according to the present invention, there is an extremely large difference in electron mobility of the InSb layer between the case where an extremely thin InSb conductive layer is formed on an $Al_xGa_yIn_{1-x-y}Sb$ (0<x<1, 0≦y<1) mixed crystal layer satisfying the conditions of the above-described lattice mismatch and the full width at half maximum of 1300 seconds of X-ray diffraction of the above-described mixed crystal layer and the case where the InSb layer is directly formed on the GaAs (100) substrate without forming the mixed crystal layer.

However, in the above-described example, it is not easy to obtain the AlInSb mixed crystal layer satisfying the conditions for obtaining high electron mobility of InSb. It is a matter of course that the crystal growth conditions when using MBE determine the crystallinity of the mixed crystal layer. In addition, the AlInSb mixed crystal layer must be insulative, and has a lattice constant close to that of InSb, so that its lattice mismatch with the substrate exists, and is not zero. Therefore, unless the AlInSb mixed crystal layer has a thickness not less than a certain level, the full width at half maximum of the X-ray diffraction peak is out of the range between 1 second and 1300 seconds, and further, if the crystal growth conditions are not appropriate, the full width at half maximum of the X-ray diffraction peak is not 1300 seconds or less.

In this case, as a matter of course, high electron mobility of the InSb conductive layer cannot be obtained. Generally, this minimum thickness also depends on the growth conditions of mixed crystals and the situation of the surface of the substrate, so that it is not obvious, however, in the case where appropriate crystal growth conditions are selected and maintained constantly, the quality of the mixed crystal layer is improved according to a thickness increase, so that it is preferable in normal cases that the thickness of the mixed crystal layer is at least 50 nanometers or more except in a special case, and when it is 600 nanometers or more, a mixed crystal-layer whose full width at half maximum of the X-ray diffraction peak is 1300 seconds or less is stably obtained.

It was found that, if the mixed crystal layer became thicker, the full width at half maximum of the X-ray diffraction peak further lowered from 1300 seconds or less to 1000 seconds or less, and further, to 500 seconds or less, and conditions for good crystallinity were also obtained, and accordingly, higher electron mobility of the InSb conductive layer was obtained.

Thus, through the inventors' research, correlation between the electron mobility of the InSb conductive layer and the crystallinity of the mixed crystal layer became clear, and the crystallinity of mixed crystals for obtaining high electron mobility of the InSb layer and conditions therefor became clear.

Further, it is important that, in InSb manufactured on and in contact with the AlInSb mixed crystal layer satisfying the above-described conditions, a low-electron mobility layer formed at a hetero interface with the AlInSb mixed crystals is extremely thin.

In the present invention, it is important on how to reduce the thickness of the low-electron mobility layer (electron mobility is about 7,000 cm$^2$/Vs or less) produced at a portion in contact with the hetero interface with InSb as described above. When an InSb layer is formed on the above-described AlInSb mixed crystals, the thickness of the low-electron mobility layer is 30 nanometers at maximum, 20 nanometers or less normally, and 10 nanometers or less when more preferable conditions are set. The minimum thickness is 1.5 nanometers. In other words, the thickness of the low-electron mobility layer is extremely thin. The conditions of the above-described x-ray diffraction thus determine the quality of the crystal for thinning the low-electron mobility layer of InSb.

In other words, even if InSb and AlInSb have lattice mismatch with each other, when the AlInSb layer has crystallinity of the full width at half maximum of 1300 seconds or less of the peak of the X-ray diffraction, the low-electron mobility layer becomes extremely thin, and as a result, high electron mobility of the InSb conductive layer formed on AlInSb is obtained. The high-electron mobility layer with excellent crystallinity dominates electric conduction.

Conventionally, a good-quality InSb crystal could not grow when there was lattice mismatch, however, according to the experiment conducted by the inventors, even if the lattice constant is not equal to that of InSb, for example, when the lattice mismatch between InSb and AlInSb mixed crystal layer is in the range from 0.25 to 1.0% and the full width at halt maximum of the X-ray diffraction peak showing the quality of the crystals of the $Al_xGa_yIn_{1-x-y}Sb$ (0<x<1, 0≦y<1) mixed crystal layer is 1300 seconds or less, the electron mobility of the InSb conductive layer becomes extremely high.

However, the growth conditions for forming such a thin low-electron mobility layer are that the substrate temperature changes when the process shifts to the next InSb layer growing after finishing growing of the AlGaInSb layer is small. In addition, the substrate temperature changes when growing the AlGaInSb layer on InSb must also be small. The permissible difference in substrate temperature between the time of finishing the AlInSb growth and the time of starting the crystal growth of InSb is preferably 0° C. and ±5° C. at most when the optimal substrate temperature of InSb is set. As a substrate temperature at the time of the AlInSb crystal growth, an optimal value ±5° C. from the optimal temperature of InSb crystal growth is selected and determined. Particularly, as a substrate temperature when finishing the AlInSb growth, a temperature ±5° C. from the optimal temperature of InSb crystal growth is determined. The substrate temperature when growing the second AlInSb layer on InSb layer and setting conditions for this are also the same.

The effect of AlInSb layer thus grown is remarkable especially when InSb is thin. According to the inventors' research, when a comparison is made by using the same InSb thickness, the electron mobility of the obtained InSb layer increases several times or more. The thinner the thickness of InSb, the greater the effect. As the thickness of the InSb layer is reduced to 0.5 micrometers or less and further to 0.3 micrometers or less, the effect increases. Particularly, when the InSb layer is as thin as 0.1 micrometers or less, the effect increases 7 to 10 times. FIG. 10 shows an experimental comparison between the electron mobility of the InSb layer of the thin film lamination of the present invention and the electron mobility of the conventional InSb thin film.

As a result of these examinations, as conditions enabling growth of the InSb thin film with high electron mobility from which a high-sensitivity magnetic sensor could be manufactured although the film thickness of the InSb layer was thin, the inventors found 1) composition of the AlGaInSb layer (contents of Al and Ga atoms in the range from 5.0 to 17%), 2) lattice constant difference, that is, lattice mismatch (lattice mismatch with the $Al_xGa_yIn_{1-x-y}Sb$ mixed crystal layer in contact with InSb conductive layer in the range of 0.25 to 1.0%), and 3) full width at half maximum of 1300 seconds or less of the peak corresponding to the mixed crystal layer of a rocking curve of X-ray diffraction showing the quality of the crystallinity of the AlGaInSb mixed crystal layer. Further, the difference in substrate temperature between the time of AlGaInSb growth and the time of InSb growth is within ±5° C.

Further, in this case, it was found that the low-electron mobility layer formed inside the InSb thin film formed according to small lattice mismatch at the hetero interface between the InSb and the $Al_xGa_yIn_{1-x-y}Sb$ mixed crystal layer could be set to be extremely thin in the range between 0.5 nanometers and 30 nanometers, 0.5 to 20 nanometers or less when more appropriate crystal growth conditions were selected (full width at half maximum is smaller, for example, 500 seconds or less) and the thickness was small, and 0.5 to 10 nanometers or less. The same effect is obtained even in the InSb conductive layer containing InSb doped with a donor impurity such as Sn, Si, S, Te, or Se, and the above-described result does not change (electron mobility of the InSb thin film with small electron concentration, for example, undoped InSb thin film generally lowers at a low temperature, however, by doping a donor impurity such as Sn, Si, S, Te, or Se, high electron mobility can be obtained even in a low-temperature region.

Further, the inventors investigated and researched the case where an insulative or high-resistance $Al_xGa_yIn_{1-x-y}Sb$ mixed crystal layer was grown on an InSb thin film. As a result, it was found that formation of the $Al_xGa_yIn_{1-x-y}Sb$ mixed crystal layer on the InSb thin film did not deteriorate the performance of remaining InSb layer. As a substrate temperature at the time of crystal growth of the second AlInSb mixed crystals, an optimal temperature within ±5° C. from the optimal temperature of InSb crystal growth is selected and determined. Particularly, a substrate temperature at the time of starting AlInSb growth is most preferably the same as the optimal temperature of the InSb crystal growth, however, the temperature may be set to a temperature within ±5° C. from the optimal temperature.

When the InSb layer is extremely thin, if the surface is in contact with the air or it is used for manufacturing a magnetic sensor such as a Hall element or a magneto resistance element, remarkable deterioration in performance due to contact with inorganic films of $SiO_2$ or $Si_3N_4$ to be used as a protective film, stress when resin-packaging, or influences from heterogeneous organic materials frequently occurs. When the protective film was directly formed on InSb, 40 to 70% deterioration in performance was observed, however, when the $Al_xGa_yIn_{1-x-y}Sb$ mixed crystal layer was formed on the InSb thin film, performance deterioration in InSb due to formation of the mixed crystal film does not occur. It was found that great influence from the protective film, stress when resin-packaging, and influences from heterogeneous organic materials became extremely small when the above-described protective layer of $SiO_2$ or $Si_3N_4$ was formed via this mixed crystal layer. As a result, it was observed that the 40 to 70% performance deterioration in the InSb layer due to protective layer formation was reduced to a value as small as 3%.

In other words, the $Al_xGa_yIn_{1-x-y}Sb$ mixed crystal layer has a great function like a semiconductor protective film for preventing deterioration in performance of the InSb layer, and further preventing performance deterioration in the InSb layer due to influences from the above-described protective film and package.

Such an insulative thin layer or protective layer formed on the operation layer of the InSb thin film is also called a cap layer (or a semiconductor protective layer). The $Al_xGa_yIn_{1-x-y}Sb$ mixed crystal layer as such an insulative semiconductor protective layer has a band gap larger than that of InSb, so that it also serves as a potential barrier layer constituting a quantum well of InSb when the InSb layer is extremely thin, so that it may simply be called a potential barrier layer or a barrier layer. On the $Al_xGa_yIn_{1-x-y}Sb$ semiconductor protective layer, a GaAs layer is often further formed to make the protective layer firmer by the combination of these layers. This GaAs layer has oxidation resistance more excellent than that of AlGaInSb layer and is frequently used. The same substrate temperature at the time of AlGaInSb growth is preferable, however, it is not especially limited.

The present inventors found that, although the above-described conditions about lattice matching must be satisfied, if the lattice mismatch with InSb was in the range of 0.25 to 1.0%, the $Al_xGa_yIn_{1-x-y}Sb$ mixed crystal layer was extremely effective as a surface protective layer of the InSb thin film. In the case of this surface protective layer, it was also found that crystal of InSb was not grown thereon, so that the condition about the full width at half maximum of the X-ray did not influence greatly.

However, when it is used as a barrier such as a quantum well, the thickness of InSb is extremely small, so that the crystallinity comes into question as in the case of the buffer layer formed on the hetero interface, and the conditions about lattice matching and the conditions about the X-ray full width at half maximum must be satisfied to obtain high electron mobility of InSb. The degree of crystallinity depends on the film thickness of InSb, and more excellent crystallinity is required as the InSb thickness becomes smaller.

When such a cap layer is formed, the low-electron mobility layer formed in the vicinity of the surface of the InSb thin film in contact with the cap layer is thinner than in the case where no cap layer is formed, and is as thin as 30 nanometers or less, 20 nanometers or leas, or 10 nanometers or less in thickness, and the minimum thickness is 0.5 nanometers.

From this examination result, in a high-sensitivity InSb thin film Hall element using an epitaxially-grown InSb thin film lamination as a magnetic sensor section, the inventors found 1) a lamination structure of the InSb thin film of the magnetic sensor section with the low-electron mobility layer to be formed in the vicinity of the hetero interface with the substrate was made extremely thin. They further found 2) a technique for thinning the low-electron mobility layer formed in the vicinity of the surface of the InSb thin film on the opposite side of the substrate, that is, a technique for making extremely thin the low-electron mobility layer which was naturally formed in some cases but inevitably formed in many cases in the vicinity of the InSb surface of the magnetic sensor section due to formation of a protective film in direct contact with InSb and surface strain caused by resin-package, etc., in the process of manufacturing the Hall element.

Thus, the inventors found a technique for forming a surface protective layer of InSb which made extremely small the performance fluctuation (=performance reduction) of the InSb conductive layer thin film of the thin film lamination according to formation of a passivation protective film and the performance fluctuation caused by strain or stress of the sensitive magnetic surface according to resin-packaging of the magnetic sensor, that is, a technique for forming a cap layer or a semiconductor protective layer. They also found that a thin layer of a group III-V compound semiconductor which was insulative and has a lattice constant close to that of InSb was preferable and excellent as the semiconductor protective layer.

As a result, the inventors completed a technique for obtaining electron mobility not less than 30,000 cm$^2$/Vs even when the thickness of InSb is as thin as 0.15 micrometers or less, and electron mobility of 20,000 cm$^2$/Vs or more even when the thickness is 0.05 micrometers and completed a technique for manufacturing a high-sensitivity InSb thin-film magnetic sensor by applying said technique to the magnetic detecting section of a high-sensitivity practical magnetic sensor such as a Hall element or a magneto resistance element for the first time.

In other words, the inventors manufactured a thin-film lamination in which the low-electron mobility layer at the hetero interface was extremely thin, or the low-electron mobility layer on the InSb surface was made extremely thin, and completed and realized a magnetic sensor such as an InSb Hall element or magneto resistance element in which both of the low-electron mobility layers were extremely thin and a technique for manufacturing this magnetic sensor. Further, in the thin-film lamination and InSb magnetic sensor of the present invention, the low-electron mobility layer can be made extremely thin in both cases where the InSb thin film of the magnetic sensor section is doped and not doped with donor atoms. As a result of this invention, in both of a doped InSb Hall element and an undoped InSb Hall element, the low-electron mobility layer can be made extremely thin. The same applies to the case of a magneto resistance element.

In other words, the high-sensitivity InSb thin-film magnetic sensor is provided, having, as a magnetic sensor section, a thin-film lamination in which a conductive layer of an InSb thin film epitaxially formed on a substrate is used as an operation layer, on at least one side of this operation layer, an $Al_xGa_yIn_{1-x-y}Sb$ mixed crystal layer ($0 \leq x$, $0 \leq y$) that has resistance higher than that of the operation layer or insulation, or p-type conductivity and has a band gap larger than that of InSb is formed, and this mixed crystal layer has the content of Al atoms in the range of x=5.0 to 17% ($0.05 \leq x \leq 0.17$), or lattice mismatch with an insulative mixed crystal layer ($Al_xGa_yIn_{1-x-y}Sb$) in contact with the InSb conductive layer is in the range of 0.25 to 1.0%, and a full width at half maximum of a peak corresponding to the mixed crystal layer of a rocking curve of X-ray diffraction is 1300 seconds or less, and the operation layer is in direct contact with the $Al_xGa_yIn_{1-x-y}Sb$ mixed crystal layer.

The high-sensitivity InSb thin-film magnetic sensor is provided, having a magnetic sensor section of the thin-film lamination in which an InSb thin film that is epitaxially formed on a substrate and has electron concentration in the range of $1.2 \times 10^{16}$ to $5.0 \times 10^{18}$ cm$^{-3}$ at room temperature is used as an operation layer, on at least one side of this operation layer, an $Al_xGa_yIn_{1-x-y}Sb$ mixed crystal layer ($0 \leq x$, $0 \leq y$) that has resistance higher than that of the operation layer or insulation, or p-type conductivity and has a band gap larger than that of InSb is formed, and this mixed crystal layer has the content of Al atoms in the range of x=5.0 to 17% ($0.05 \leq x \leq 0.17$), or lattice mismatch with an insulative mixed crystal layer ($Al_xGa_yIn_{1-x-y}Sb$) in contact with the InSb conductive layer is in the range of 0.25 to 1.0%, and a full width at half maximum of a peak corresponding to the mixed crystal layer of a rocking curve of X-ray diffraction is 1300 seconds or less, and the operation layer is in direct contact with the $Al_xGa_yIn_{1-x-y}Sb$ mixed crystal layer.

The high-sensitivity InSb thin-film magnetic sensor is provided, having a magnetic sensor section of a thin-film lamination in which an InSb thin film that is epitaxially formed on a substrate and has electron concentration in the range of $1.2 \times 10^{16}$ to $5.0 \times 10^{18}$ cm$^{-3}$ at room temperature is used as an operation layer, on at least one side of this operation layer, an $Al_xGa_yIn_{1-x-y}Sb$ mixed crystal layer ($0 \leq x$, $y \leq 1$) that has resistance higher than that of the operation layer or insulation, or p-type conductivity and has a band gap larger than that of InSb is formed, and this mixed crystal layer has the content of Al atoms in the range of x=5.0 to 17% ($0.05 \leq x \leq 0.17$), or lattice mismatch with an insulative mixed crystal layer ($Al_xGa_yIn_{1-x-y}Sb$) in contact with the InSb conductive layer is in the range of 0.25 to 1.0%, and the InSb thin film as the operation layer is in direct contact with the $Al_xGa_yIn_{1-x-y}Sb$ mixed crystal layer having a full width at half maximum of 1 second or more and 1300 seconds or less of a peak corresponding to the mixed crystal layer of a rocking curve of X-ray diffraction, and is doped with a donor impurity such as Sn, Si, S, Te, or Se for InSb.

The high-sensitivity InSb thin-film magnetic sensor is provided, having a magnetic sensor section consisting of a thin-film lamination in which an InSb thin film that is epitaxially formed on a substrate and has electron concentration in the range of $1.2 \times 10^{16}$ to $5.0 \times 10^{18}$ cm$^{-3}$ at room temperature is used as an operation layer (magnetic sensor section), on at least one side of this operation layer, an $Al_xGa_yIn_{1-x-y}Sb$ mixed crystal layer ($0 \leq x$, $0 \leq y$) that has resistance higher than that of the operation layer or insulation, or p-type conductivity and has a band gap larger than that of InSb is formed, and this $Al_xGa_yIn_{1-x-y}Sb$ mixed crystal layer has the content of Al atoms in the range of x=5.0 to 17% ($0.05 \leq x \leq 0.17$) or ($0.05 \leq x+y \leq 0.17$), or lattice mismatch with an insulative mixed crystal layer ($Al_xGa_yIn_{1-x-y}Sb$) in contact with the InSb layer is in the range of 0.25 to 1.0%, and a full width at half maximum of a peak corresponding to the mixed crystal layer of a rocking curve of x-ray diffraction is 1300 seconds or less, and a thickness of a low-electron mobility layer formed in contact with a hetero interface with the $Al_xGa_yIn_{1-x-y}Sb$ mixed crystal layer ($0 \leq x$, $y \leq 1$) is 0.5 nanometers or more and 30 nanometers or less.

The high-sensitivity InSb thin-film magnetic sensor is provided, having a magnetic sensor section of a thin-film lamination in which InSb thin-film that is epitaxially formed on a substrate is used as an operation layer, on at least one side of this operation layer, an $Al_xGa_yIn_{1-x-y}Sb$ mixed crystal layer ($0 \leq x$, $y \leq 1$) that has resistance higher than that of the operation layer or insulation, or p-type conductivity and has a band gap larger than that of InSb is formed, and this mixed crystal layer has the content of Al atoms in the range of x=5, 0 to 17% ($0.05 \leq x \leq 0.17$), and lattice mismatch with an insulative mixed crystal layer ($Al_xGa_yIn_{1-x-y}Sb$) in contact with the InSb conductive layer is in the range of 0.25 to 1.0%. Further, the high-sensitivity InSb thin film magnetic sensor has a magnetic sensor section of a thin film lamination in which a sheet resistance of the $Al_xGa_yIn_{1-x-y}Sb$ layer is not less than 10 KΩ and not more than 2000 MΩ.

The high-sensitivity InSb thin-film magnetic sensor is provided, having, as a magnetic sensor section, an InSb thin-film lamination in which InSb thin-film that is epitaxially formed on a substrate is used as an operation layer, on at least one side of this operation layer, an $Al_xGa_yIn_{1-x-y}Sb$ mixed crystal layer that has resistance higher than that of the operation layer or insulation, or p-type conductivity and has a band gap larger than that of InSb is formed, and this mixed crystal layer has the content of Al or Ga atoms in the range of x+y=5.0 to 17% (0.05≦x≦0.17), a band gap difference between (surfaces in contact with each other of) these layers is preferably 0.3 eV or more and 2.4 eV or less, and lattice mismatch with an insulative layer in contact with the InSb conductive layer is in the range of 0.25 to 1.0%, and further, a sheet resistance of the $Al_xGa_yIn_{1-x-y}Sb$ layer is 10 KΩ or more and 2000 MΩ or less.

In the present invention, the high-sensitivity InSb thin film magnetic sensor has a magnetic sensor section consisting of an InSb thin film lamination in which a thickness of a low-electron mobility layer formed in the vicinity of a hetero interface between an InSb layer and an $Al_xGa_yIn_{1-x-y}Sb$ mixed crystal layer is preferably 20 nanometers or less, and more preferably, 10 nanometers or less. The band gap difference at the hetero interface at which the $Al_xGa_yIn_{1-x-y}Sb$ mixed crystal layer and the InSb are in contact with each other is not especially limited as long as the $Al_xGa_yIn_{1-x-y}Sb$ layer has insulation or high resistance, however, it is preferably 0.3 eV or more. Further, a high-sensitivity InSb thin film magnetic sensor has a magnetic sensor section that is a Hall element, an element using the Hall effect, a magneto resistance element, or an element using the magneto resistance effect.

The full width at half maximum of X-ray diffraction peak of the $Al_xGa_yIn_{1-x-y}Sb$ mixed crystal layer is preferably 1000 seconds or less, more preferably 500 seconds or less.

In the high-sensitivity InSb thin film magnetic sensor, the thickness of the InSb thin film of the magnetic sensor section is not especially limited, however, preferably 8 nanometers or more and 2,000 nanometers or less, more preferably 1,000 nanometers or less, still more preferably 500 nanometers or less, and the most preferable range is 300 nanometers or less.

When the thickness is 200 nanometers or less, the effect of the present invention is great, and even when the thickness is 100 nanometers or less, the electron mobility of InSb is extremely high, so that a magnetic sensor with high sensitivity for magnetic fields and high input resistance can be manufactured.

The permissible thickness of the low-electron mobility layer to be formed in contact with the hetero interface of the InSb thin film layer of the operation layer with the $Al_xGa_yIn_{1-x-y}Sb$ mixed crystal layer changes depending on the thickness of the InSb layer. When the thickness of the operation layer is 150 nanometers or more, 30 nanometers is permissible, however, a smaller thickness is preferable. In the case of an InSb layer with a thickness of 100 nanometers or less, the thickness of the low-electron mobility layer is preferably 20 nanometers or less, and in the case of an operation layer with a thickness of 50 nanometers or less, the thickness of the low-electron mobility layer must be 5 nanometers or less. In other words, it is necessary to reduce the thickness of the low-electron mobility layer to 20% or less of the thickness of the operation layer. The full width at half maximum of the X-ray diffraction peak of the mixed crystal layer is preferably small, however, when the thickness of the InSb thin film of the operation layer is thin, a smaller full width at half maximum is preferable, and in the case of a thickness of 200 nanometers or less of InSb, 1300 seconds or less is permissible, however, 1000 seconds or less is preferable, and more preferably, 500 seconds or less. These conditions are obtained when the thickness of the AlGaInSb layer is set to 0.7 to 1.0 micrometers.

In the description above, the InSb layer formed on the $Al_xGa_yIn_{1-x-y}Sb$ mixed crystal layer as an insulating layer formed on the substrate is shown by way of example, however, in some cases, on the upper surface (on the opposite side of the substrate) of the InSb layer, an $Al_xGa_yIn_{1-x-y}Sb$ mixed crystal layer (0≦x, y≦1) is formed which is the same insulating layer as described above, and has a content of Al and Ga atoms (x+y) in the range of 5.0 to 17% (0.05≦x+y≦0.17), or lattice mismatch with the insulative $Al_xGa_yIn_{1-x-y}Sb$ mixed crystal layer in contact with the InSb conductive layer is in the range of 0.25 to 1.0%. Further, in this case, it is a matter of course that the $Al_xGa_yIn_{1-x-y}Sb$ mixed crystal layer as an insulating layer formed on the upper surface of the InSb thin film operation layer preferably has crystallinity with a full width at half maximum of 1300 seconds or less of a rocking curve of X-ray diffraction from the (004) lattice plane although this is not essential.

Generally, the low-electron mobility layer formed on the surface of the InSb layer in contact with an air layer is thin and estimated to be 50 nanometers or less at a maximum, however, when an inorganic protective layer, for example, $Si_3N_4$ or $SiO_2$, etc., is formed on the surface of InSb for the purpose of provision of reliability and forming a protective layer when manufacturing a magnetic sensor, a thickness of a damaged layer of the InSb surface layer when the damage is caused when forming or lattice mismatch and in-plane strain after forming is more than 50 nanometers, and the performance such as electron mobility of the InSb thin film is frequently lost. The low-electron mobility layer of InSb formed according to this damage (in this case, can be referred to as a damaged layer) reaches a thickness of 50 to 100 nanometers according to great performance deterioration and film thickness dependency of the InSb thin film due to formation of the protective film, etc. Such performance change due to the protective film formation is generally grasped as fluctuation in the element manufacturing process, and must be reduced. When the InSb layer is extremely thin, this process fluctuation is extremely great, so that it becomes impossible to manufacture a high-sensitivity magnetic sensor.

For the purpose of preventing damage in the vicinity of the surface of the InSb layer according to formation of protective film of InSb and impact during formation, in the present invention, an insulative semiconductor protective layer may be formed in contact with the upper surface of InSb.

Thus, as a thin film to be formed in contact with the InSb layer, an insulative compound semiconductor thin layer is preferably used. As this semiconductor protective layer, a material whose lattice mismatch with InSb is small is selected so as not to damage the surface of InSb. Therefore, this is also effective for reducing the thickness of the low-electron mobility layer formed in contact with the surface of InSb when appropriate conditions are selected.

Therefore, in the present invention, an $Al_xGa_yIn_{1-x-y}Sb$ mixed crystal layer is formed on the upper surface (surface on the opposite side of the substrate) of the InSb thin film operation layer mainly for the purpose of protecting the surface portion of the InSb layer from strain from the protective layer and the package resin and damage in the element manufacturing process for forming these.

In this case, by forming the $Al_xGa_yIn_{1-x-y}Sb$ mixed crystal layer on the surface of InSb, formation of a thick damaged layer with low electron mobility on the surface of the InSb thin film when forming the protective film can be prevented or the thickness of the damaged layer can be minimized. For example, by forming this mixed crystal layer, the low-electron mobility layer on the InSb thin film surface can be set to a thickness equal to or less than that of a natural surface. In other words, the thickness of the low-electron mobility layer on the surface is minimized as in the case of the interface of InSb. When the InSb thickness of the operation layer is not more than 0.5 micrometers, the effect of formation of the $Al_xGa_yIn_{1-x-y}Sb$ mixed crystal layer in contact with the upper surface of the InSb thin film is especially remarkable and preferable. The $Al_xGa_yIn_{1-x-y}Sb$ mixed crystal layer that functions as described above may be called a cap layer. Therefore, formation of the $Al_xGa_yIn_{1-x-y}Sb$ mixed crystal layer in contact with upper and lower surfaces of the InSb thin film of the magnetic sensor section is most preferable for manufacturing a magnetic sensor such as an InSb thin film Hall element sliding the thin film lamination of InSb of the present invention as a magnetic sensitive portion. Further, a GaAs layer is further formed on the AlGaInSb protective layer to form a firmer protective layer by the combination of these layers. This GaAs layer has more excellent oxidization resistance than the AlGaInSb layer and is frequently used.

When the thickness of the InSb layer is 8 nanometers or more and 200 nanometers or less, that is, not more than 200 nanometers, it is necessary that the $Al_xGa_yIn_{1-x-y}Sb$ mixed crystal layer is formed on both surfaces of the InSb thin film, the low-electron mobility layer is reduced, and process fluctuation causing the performance reduction of the InBs is reduced or prevented, and these are preferably realized according to the present invention. The present invention for manufacturing a magnetic sensor including an operation layer with a thickness of 100 nanometers or less, more specifically, an InSb layer with a thickness of 60 nanometers or less is used for the purpose of manufacturing a quantum well structure, that is, confining electrons as carriers in the InSb layer.

Thus, according to the present invention, an $Al_xGa_yIn_{1-x-y}Sb$ mixed crystal layer may be formed on the upper surface (surface on the opposite side of the substrate) of the InSb thin film operation layer, and even in this case, reduction, etc., of the low-electron mobility layer in the above-described $Al_xGa_yIn_{1-x-y}Sb$ mixed crystal layer and the InSb layer is equally realized in the vicinity upper and lower surfaces. The thickness of the low-electron mobility layer is at the same level on the upper and lower surfaces.

In the present invention, the InSb thin film of the magnetic sensor section is manufactured by means of molecular beam epitaxy, however, the method is not limited and MOCVD or other methods may be used as long as the desired controlled properties such as electron mobility and sheet resistance are obtained. Further, in the present invention, the InSb thin film operation layer may be single crystal or polycrystal, however, single crystal is more preferable.

According to the present invention, a thin film lamination includes an InSb layer as an InSb thin film formed on a substrate; and an $Al_xGa_yIn_{1-x-y}Sb$ mixed crystal layer ($0<x<1$, $0 \leq y<1$) which shows resistance higher than in the InSb layer, insulation, or p-type conductivity, and has a band gap larger than in InSb, the mixed crystal layer is provided between the substrate and the InSb layer and has a content of Al and Ga atoms (x+y) in the range of 5.0 to 17% ($0.05 \leq x+y \leq 0.17$) or lattice mismatch in the range of 0.25 to 1.0% with a mixed crystal layer in contact with the InSb conductive layer, so that a thin film lamination to be used for a micro InSb thin film magnetic sensor which can directly detect a magnetic flux density with high sensitivity and has small power voltage and consumption current, and a high-sensitivity InSb thin film magnetic sensor using the same thin film lamination, can be realized.

BEST MODE FOR CARRYING OUT THE INVENTION

Hereinafter, embodiments of the present invention will be described with reference to the drawings.

First Embodiment

Figure 1A:
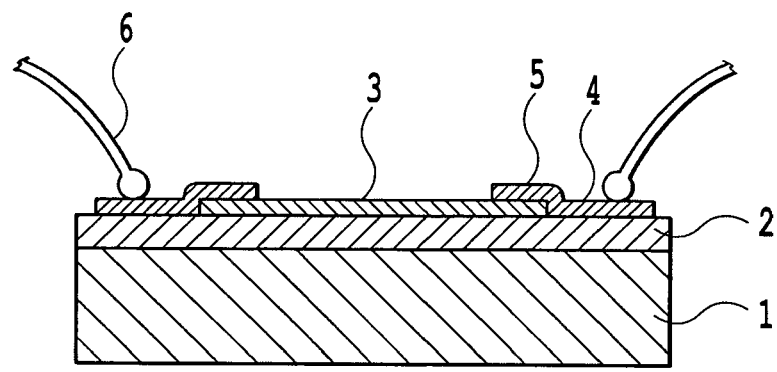
FIG. 1A is a cross-sectional construction view showing an embodiment of an InSb thin film magnetic sensor using a thin film lamination of the present invention as a magnetic sensor section.
Figure 1B:
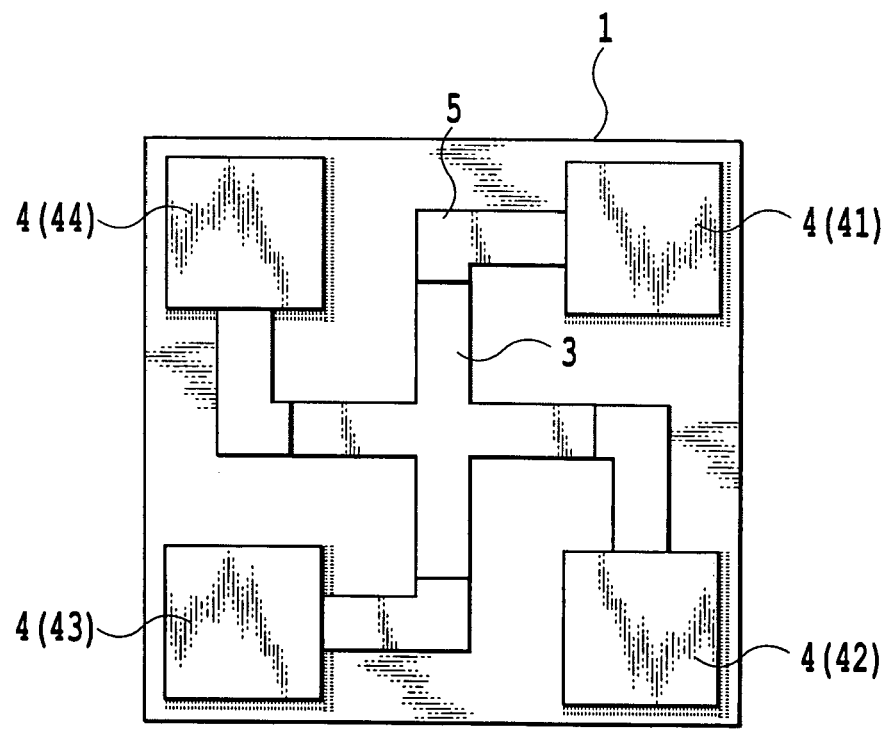
FIG. 1B is a structural view from the upper surface, showing an embodiment of an InSb thin film magnetic sensor using a thin film lamination of the present invention as a magnetic sensor section.

FIG. 1A and FIG. 1B are drawings showing an embodiment of an InSb thin film magnetic sensor using, as a magnetic sensor section, a thin film lamination including an InSb thin film as an operation layer of the present invention, and are construction views of a Hall element as an InSb thin film magnetic sensor using an InSb thin film as a magnetic sensor section or a magnetic detecting section, FIG. 1A is a sectional structural view and FIG. 1B is a structural view from the upper surface.

In the drawings, the reference numeral 1 denotes a substrate, 2 denotes an $Al_xGa_yIn_{1-x-y}Sb$ mixed crystal layer (insulating layer), 3 denotes an operation layer and is an InSb thin film which causes a Hall effect in response to application of a magnetic field, 4 (41, 42, 43, 44) denotes four terminal electrodes for external connection, 5 denotes an electrode connection portion, and 6 denotes a wire connected to a lead. In FIG. 1A, the magnetic sensor section of the central portion shows the sectional structure of the thin film lamination of the present invention.

In the InSb thin film magnetic sensor of the present invention, an $Al_xGa_yIn_{1-x-y}Sb$ mixed crystal layer (insulating layer) 2 is provided on the substrate 1, and on this layer, an InSb thin film which causes a Hall effect in response to application of a magnetic field, that is, operation layer 3 is further provided, and on the ends of this operation layer 3, terminal electrodes 4 are provided via electrode connection portions 5. Further, wires 6 are attached to the respective terminal electrodes 4.

Thus, the thin film magnetic sensor comprises an InSb layer 3 as an InSb thin film formed on an $Al_xGa_yIn_{1-x-y}Sb$ mixed crystal layer ($0 \leq x$, $y \leq 1$) 2 formed on the substrate 1, which shows resistance higher than that of the InSb layer 3, insulation, or p-type conductivity and has a band gap larger than that of InSb.

Figure 9:
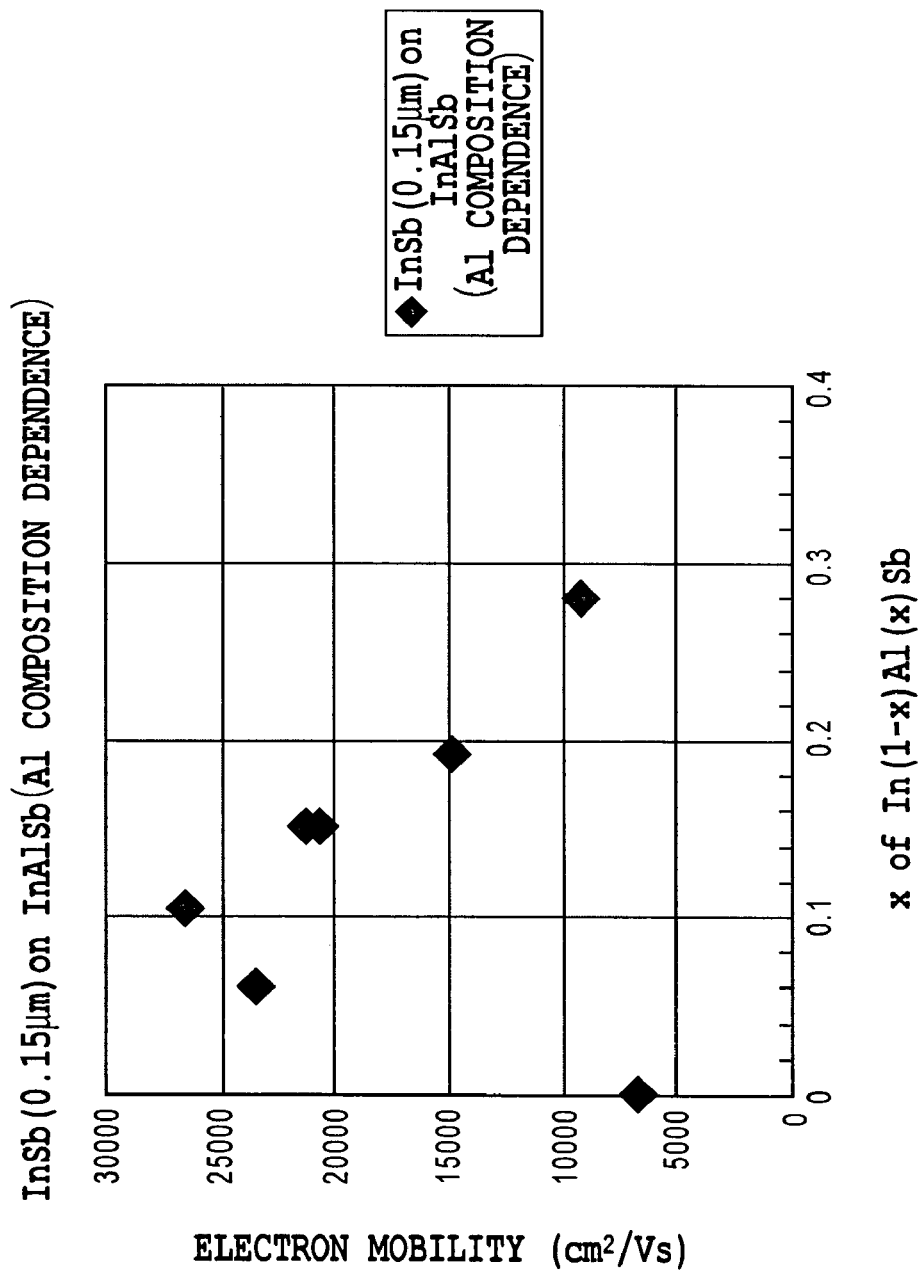
FIG. 9 is a diagram showing the relationship between the content of the mixed crystal layer and the electron mobility of the present invention.
Figure 10:
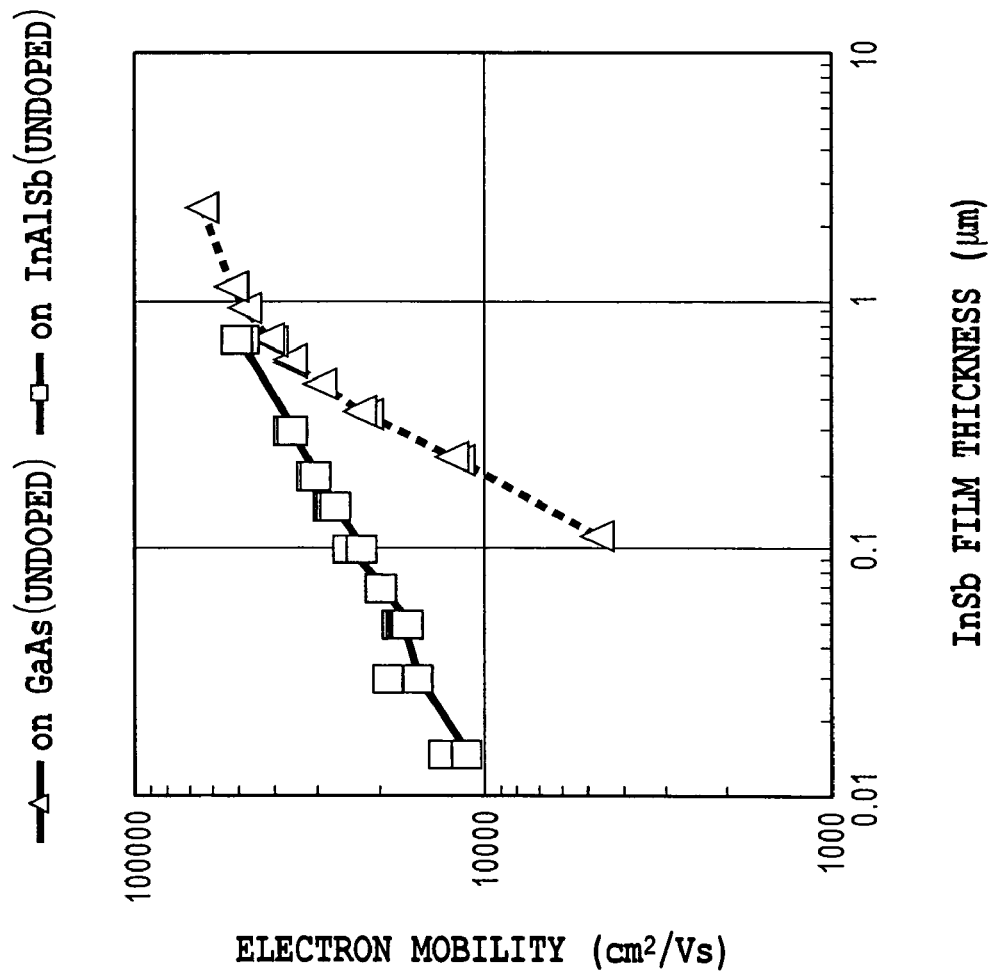
FIG. 10 is a diagram showing the relationship between the film thickness of an InSb thin film directly formed on a GaAs substrate and electron mobility and the relationship between the thin film lamination of the present invention (an AlInSb layer is formed on a GaAs substrate, an InSb thin layer is further formed on the InSb layer, and an AlInSb layer and a GaAs layer are formed on the upper surface of the InSb layer) and the electron mobility.

This mixed crystal layer 2 is constructed so that, as shown in FIG. 9, the content of Al and Ga atoms (x+y) is in the range of 5.0 to 17% ($0.05 \leq x+y \leq 0.17$) and the full width at half maximum of a rocking curve of X-ray diffraction from the (004) lattice plane is 1 second or more and 1300 seconds or less, and is present between the substrate 1 and the InSb layer 3. In FIG. 9, the electron mobility when Ga is not contained is shown in the graph, however, this is in the case of y=0 as described above, and in this case, the mixed crystal layer is an $Al_xIn_{1-x}Sb$ mixed crystal layer, and when the range of x is $0.05 < x < 0.17$, this shows that the electron mobility is high.

Second Embodiment

Figure 2A:
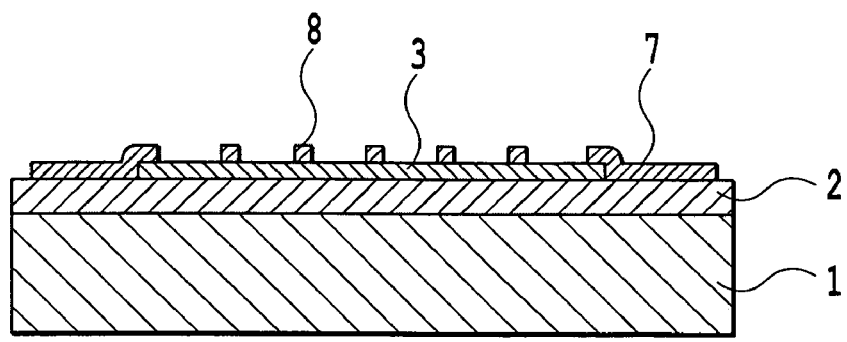
FIG. 2A is a sectional structural view showing another embodiment of the InSb thin film magnetic sensor using the thin film lamination of the present invention as a magnetic sensor section.
Figure 2B:
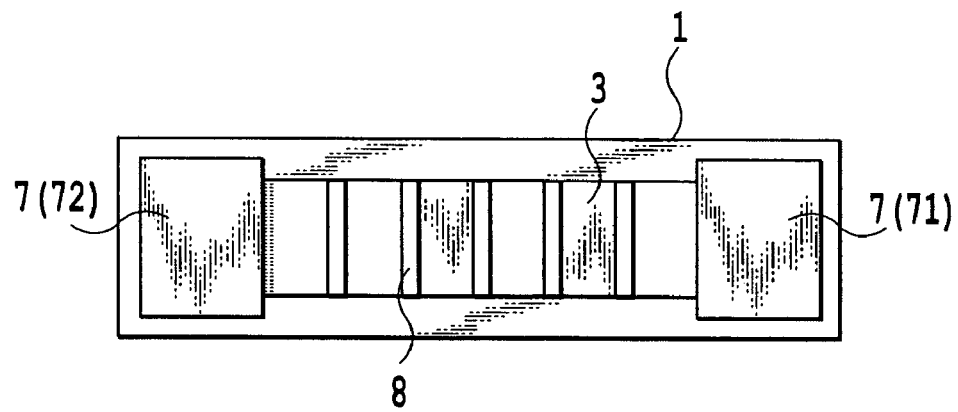
FIG. 2B is a structural view from the upper surface, showing another embodiment of the InSb thin film magnetic sensor using the thin film lamination of the present invention as a magnetic sensor section.

FIG. 2A and FIG. 2B are drawings showing another embodiment of the InSb thin film magnetic sensor using, as a magnetic sensor section, a thin film lamination including the InSb thin film as an operation layer of the present invention, and are construction views of a magneto resistance element having two terminals and a plurality of short-bar electrodes. FIG. 2A is a sectional structural view, and FIG. 2B is a structural view from the upper surface. Components having the same function in FIG. 1A and FIG. 1B are attached with the same reference numerals. In the drawings, the reference numeral 3 denotes an operation layer which shows a resistance change in response to application of a magnetic field.

In the drawings, the reference numerals 7 (71 and 72) denote two terminal electrodes, and 8 denotes short-bar electrodes for increasing magneto resistance changes. The magnetic resistance element section, that is, the magnetic sensor section has two terminal electrodes 7 for external connection on both ends, and on the InSb thin film 3 provided between these terminal electrode 71 and terminal electrode 72, a plurality of short-bar electrodes 8 are arranged.

As the substrate 1 of the thin film lamination using an InSb thin film as an operation layer of the present invention, normally, a substrate which is made of a substance stable at a high temperature and has insulation or high resistance and has a flat surface is used. Therefore, an insulative single-crystal substrate whose surface is a smooth crystal surface is preferably used. Particularly, an insulative substrate of GaAs or InP, etc., is preferably used. Alternatively, an insulative or high-resistance thin layer is formed on the surface so that the surface of the thin film formed to substantially have insulation or high-resistance is equivalent to the flat substrate.

By further forming an insulative compound semiconductor layer of GaAs or the like on the surface of an Si single-crystal substrate having a thin insulating layer formed on the surface, an insulative smooth surface having the same crystal structure as in InSb is obtained, so that this is preferably used as a substrate. Sapphire which has excellent insulation property is also used as a preferable substrate.

Third Embodiment

Figure 3:
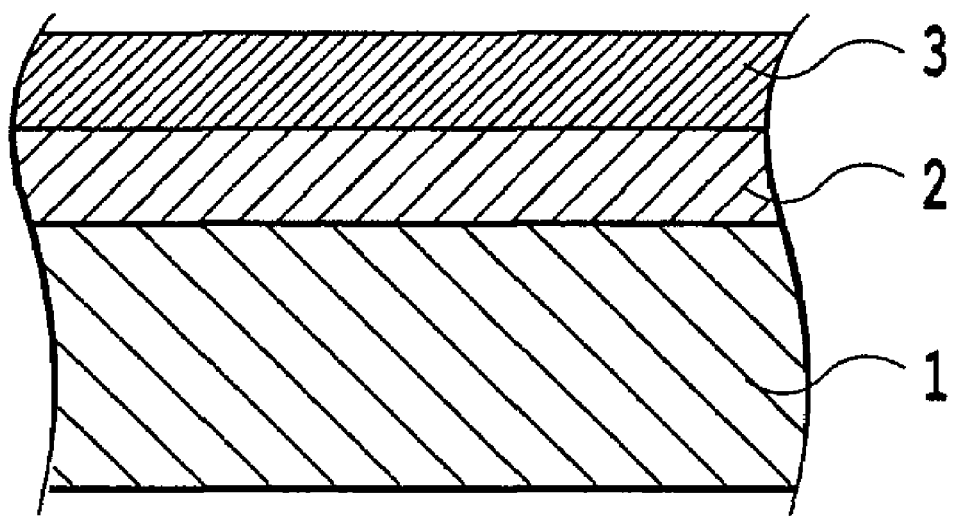
FIG. 3 is a sectional construction view of a thin film lamination as a base of a magnetic sensor section consisting of an InSb thin film of the InSb thin film magnetic sensor of the present invention.

FIG. 3 is a sectional construction view of a thin film lamination as a base of a magnetic sensor section consisting of an InSb thin film of the InSb thin film magnetic sensor of the present invention.

On the substrate 1, an insulating layer 2 that is an $Al_xGa_yIn_{1-x-y}Sb$ mixed crystal layer is provided, and thereon, an operation layer 3 of an InSb thin film which causes a Hall effect or resistance change in response to application of a magnetic field is further provided as a magnetic sensor section.

Fourth Embodiment

Figure 4:
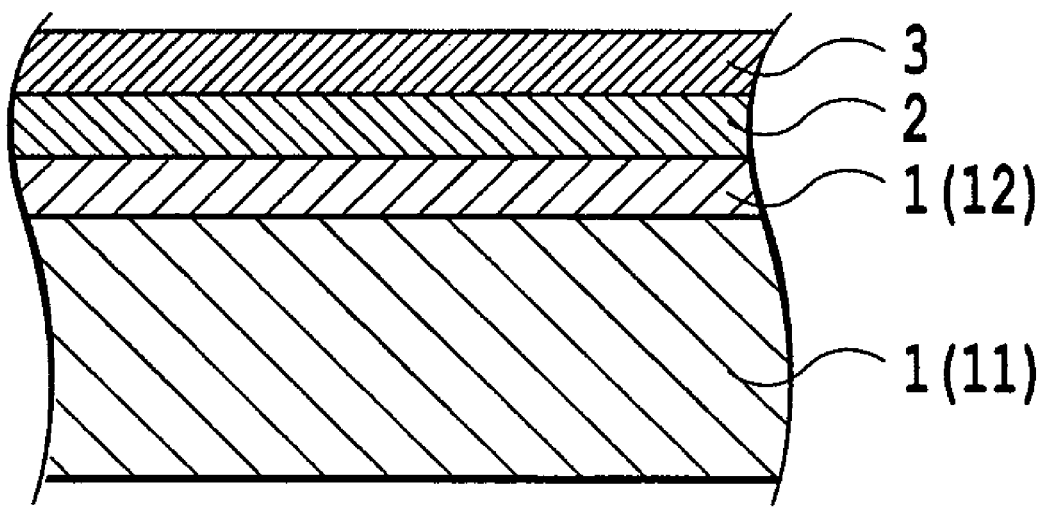
FIG. 4 is a sectional construction view of another thin film lamination of the magnetic sensor section consisting of an InSb thin film of the InSb thin film magnetic sensor of the present invention.

FIG. 4 is a sectional construction view of another thin film lamination of the magnetic sensor section consisting of an InSb thin film of the InSb thin film magnetic sensor of the present invention, and an insulative or high-resistance thin layer made of an insulator such as $SiO_2$ or a semiconductor is formed on the surface of the substrate. The reference numeral 1 (11, 12) denotes a substrate, and on the surface of a first substrate 11, a substrate surface layer 12 that is an insulative or high-resistance thin film is provided. On this substrate surface layer 12, an $Al_xGa_yIn_{1-x-y}Sb$ mixed crystal layer (insulating layer) 2 is provided, and thereon, an operation layer 3 is further provided.

The substrate 1 used in the present invention must have heat resistance and insulation. Further, the insulation is not always necessary as long as an insulative or high-resistance $Al_xGa_yIn_{1-x-y}Sb$ mixed crystal layer 2 can be grown thereon. As shown in FIG. 4, the substrate 11 is preferably insulative, however, the substrate 11 is allowed to have conductiveness as long as the insulative or high-resistance substrate surface layer 12 as shown in FIG. 4 can be formed.

Next, the surface of the substrate 1 must be flat. "Flat" mentioned herein means 0.2 nanometers or more and 10 nanometers or less of surface unevenness, preferably 5 nanometers or less, more preferably 1 nanometer or less, and in the most preferable case, lattice planes of crystals consisting of atoms forming the substrate are arranged with flatness corresponding to a one-atom layer on the surface of the substrate, that is, preferably, the substrate is a single-crystal substrate and has flatness corresponding to one-atom layer or less composed of lattice planes of crystals. Alternatively, flatness of one lattice plane interval or less is the most preferable flatness.

The substrate 1 may be single crystal, polycrystal, or amorphous as long as it has insulation or high resistance, however, most preferably, it is single crystal with the same crystal structure as InSb, and further, single crystal of a group III-V compound semiconductor, and an insulating or semi-insulating substrate of GaAs, InP, GaN, or the like is preferable.

It is preferable that surfaces of these single crystal plates are formed along the crystal lattice planes, and further, the surface may be formed with an angle from the crystal plane so as to make crystals easily grow thereon. For example, in the example of a GaAs substrate, a surface inclined in a range of 0 to 10 degrees from the substrate surface (100), (111), or (110), etc., may be formed and this is preferable. The surface of the substrate 1 can be used even on the index surface described above. Recently, it may be used on a high-index surface on which crystal growth has been attempted. Further, the substrate 1 may be made of single-crystal Si, sapphire, high heat-resistance glass, or ceramic. Preferably, the substrate 1 does not decompose at least when heated to 400° C.

Fifth Embodiment

Figure 5:
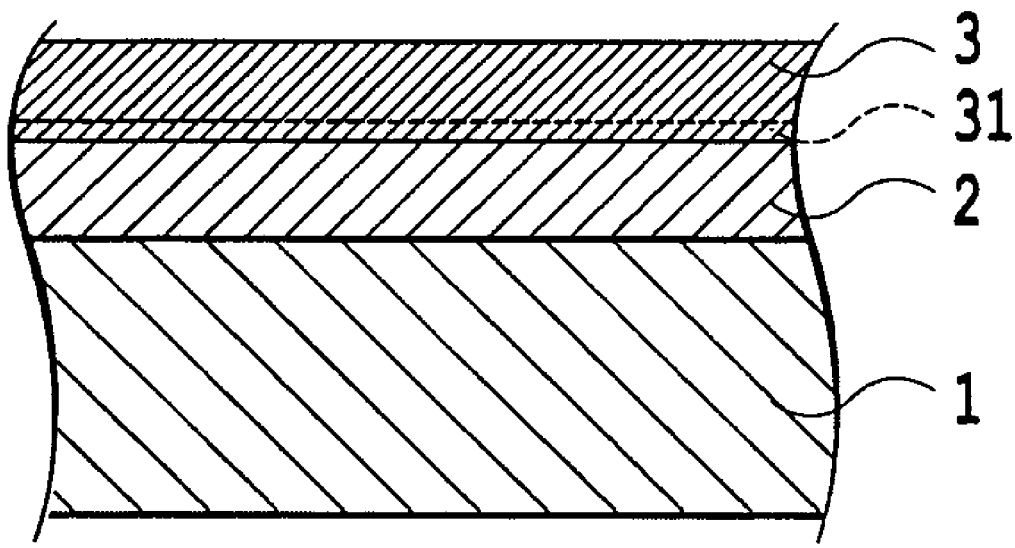
FIG. 5 is a sectional construction view showing details of the thin film lamination of the magnetic sensor section of the InSb thin film magnetic sensor of the present invention.

FIG. 5 is a sectional construction view of details of another thin film lamination of the magnetic sensor section of the InSb thin film magnetic sensor of the present invention, showing a low-electron mobility layer formed inside the InSb thin film at the hetero interface between the InSb thin film and the $Al_xGa_yIn_{1-x-y}Sb$ mixed crystal layer 2 and the substrate, and the reference numeral 31 clearly denotes a low-electron mobility layer.

As shown in the section of the magnetic sensor section of FIG. 5, on the substrate 1, an insulating layer 2 is provided, and thereon, an operation layer 3 is provided, and inside this operation layer 3, generally, a low-electron mobility layer 31 is formed. As the insulating layer 2 formed on the surface of the substrate 1, an insulating layer made of a group III-V compound semiconductor like an AlGaInSb layer is preferably used. As a layer to be used, a thin layer of insulative or high-resistance GaAs or InP or a thin layer of GaN may be used. Further, insulative or high-resistance ternary mixed crystals made of Al, Ga, and Sb, quaternary mixed crystals made of Al, Ga, As, and Sb, quinary mixed crystals made of Al, In, Ga, As, and Sb, and multicomponent mixed crystals according to these elements may be used. A new element may further be added as appropriate to these multicomponent mixed crystals, and this is also included in the technical scope of the present invention.

Binary, ternary, quaternary, and quinary mixed crystals can be generally expressed as $Al_xIn_yGa_zAs_\alpha Sb_\beta N_\gamma$, x+y+z=1, and α+β+γ=1 in the case of a group III-V compound semiconductor. In this case, for simplification, for example, in the case of a quinary mixed crystal, it may be expressed as AlInGaAsSb in this specification, and this means as described above. The insulating layer indicated by the reference numeral 12 may be formed in a plurality with an inclined composition which is changed in order (x, y, z, α, and β are changed). Instead of a plurality of layers, the insulating layer may be formed by continuously changing the composition of one layer. Such an insulating layer of a compound semiconductor or the uppermost surface of the high-resistance layer 12 is single crystal or polycrystal having a lattice constant close to that of InSb, or single crystal or polycrystal with the same crystal structure as that of InSb for growing the mixed crystal layer.

When a substrate made of a material different from group III-V compound semiconductor, such as single-crystal sapphire, Si, glass, silica glass $SiO_2$, or alumina $Al_2O_3$, is used, it can be used without change, however, more preferably, an insulating layer made of a group III-V compound semiconductor or a high-resistance layer 12 must be formed on the surface thereof, and this formation is preferable. Further, more preferably, on the uppermost surface of this layer, for growing an $Al_xGa_yIn_{1-x-y}Sb$ single-crystal or polycrystal layer whose surface is smooth, single crystal or polycrystal having the same crystal structure as $Al_xGa_yIn_{1-x-y}Sb$ is formed.

When Si single-crystal is used as the substrate, it is conductive, so that an insulating or high-resistance layer of a group III-V compound semiconductor such as insulative GaAs, AlGaAs, etc., is directly formed on the surface of Si, or more preferably, for the purpose of securing insulation from the substrate, at least one insulating layer of insulative oxide such as $SiO_2$, $Al_2O_3$, or rare earth metal or insulative nitride such as $Si_3N_4$ is formed in advance on the surface of Si, and then, on the uppermost surface of this layer, single crystal or polycrystal with the same crystal structure as that of AlInSb is formed for growing a single-crystal or polycrystal layer with a smooth surface such as AlInSb.

As described above, in the present invention, with the construction shown in FIG. 1A, FIG. 2A, and FIG. 3, in a super-high vacuum with a total gas pressure of $8\times10^{-9}$ Torr or less of elements which have no relation to crystal growth, such as hydrogen, helium, $CO_2$, various carbon hydrides, oxygen, and nitrogen (excluded when forming nitride), etc., by means of molecular beam epitaxy (MBE), an $Al_xGa_yIn_{1-x-y}Sb$ mixed crystal layer ($0 \leqq x, y \leqq 1$) which has a resistance higher than that of the InSb layer 3 or insulation, or p-type conduction and has a band gap larger than that of InSb is formed on the surface of the substrate 1. This mixed crystal layer has a content of Al and Ga atoms (x+y=) in the range of 5.0 to 17% ($0.05 \leqq x+y \leqq 0.17$), or has lattice mismatch in the range of 0.25 to 1.0% to InSb conductive layer, and this mixed crystal layer also has characteristics in the crystallinity (crystal quality=performance) evaluated by X-ray diffraction, and the full width at half maximum (FWHM) of a peak corresponding to this mixed crystal of a rocking curve of X-ray diffraction from the (004) lattice plane is 1300 seconds or less.

Next, by growing an InSb thin film operation layer 3 in a super-high vacuum by means of MBE at a total gas pressure of $8\times10^{-9}$ Torr or less of elements which have no relation to crystal growth such as hydrogen, helium, $CO_2$, various carbon hydrides, oxygen, nitrogen (excluded when forming nitride), etc. an InSb thin film which can be used for a high-sensitivity magnetic sensor such as a Hall element or magneto resistance element having an InSb conductive layer with high electron mobility even if its thickness is very thin is manufactured. By machining a lamination structure of a thin film including this InSb layer into a desired shape, and a high-sensitivity InSb thin film magnetic sensor including a magnetic sensor section using this InSb thin film as an operation layer is manufactured.

In a conventional example, that is, when an InS thin film is directly grown on a GaAs substrate whose lattice mismatch is as large as 14%, in the hetero interface between GaAs and InSb, a 0.2 micrometers or 200 nanometers order low-electron mobility layer (region) is formed regardless of the thickness of the InSb thin film. Due to the presence of this low-electron mobility layer, conventionally, when the InSb layer is thin, for example, 0.3 micrometers or less, high electron mobility cannot be obtained. However, according to the present invention, by forming the $Al_xGa_yIn_{1-x-y}Sb$ layer 2 whose lattice constant is very close to that of the InSb thin film operation layer 3, the thickness of the low-electron mobility layer 31 formed in contact with the hetero interface between the InSb thin film 3 and the $Al_xGa_yIn_{1-x-y}Sb$ layer 2 is as extremely thin as 20 nanometers or less.

This small thinness of the low-electron mobility layer is characteristic of the thin film lamination including the InSb thin film operation layer of the present invention. Therefore, even if the operation layer is thin, in the case of the present invention, high electron mobility of the InSb layer is obtained. In the present invention, the thickness of the InSb thin film 3 is not especially limited. The preferable thickness is in the range of 8 to 2000 nanometers, more preferably 8 to 700 nanometers.

As described above, FIG. 5 shows a part of a section of the magnetic sensor section of the InSb thin film magnetic sensor of the present invention. A low-electron mobility layer 31 formed at the hetero interface between the InSb thin film and the substrate is shown. The thickness of the layer indicated as a thin low-electron mobility layer 31 becomes extremely small according to formation of the $Al_xGa_yIn_{1-x-y}Sb$ mixed crystal layer 2 satisfying the conditions of the present invention, and becomes, for example, 30 nanometers or less or 20 nanometers or less. In other words, due to a defect in InSb near the hetero interface with the $Al_xGa_yIn_{1-x-y}Sb$ layer caused by lattice mismatch with $Al_xGa_yIn_{1-x-y}Sb$ formed on the substrate, the number of electrons that moved in the hetero interface when carrying a current were greatly reduced, and accordingly, the influence from the low-electron mobility on the electron mobility of the hetero interface became extremely small.

As a result, the electron mobility was dramatically increased even if the InSb thin film was extremely thin. In other words, in the case where the thickness of the InSb layer is the same, when an $Al_xGa_yIn_{1-x-y}Sb$ layer satisfying the conditions of the present invention is formed, the electron mobility increases several times in comparison with the case where this layer is not formed. For example, in the case of an InSb layer with a thickness of 8 nanometers or more and 300 nanometers or less, this electron mobility difference is especially remarkable, and an InSb thin film which dynamically improved the electron mobility, had a high sheet resistance, and was usable in a high-sensitivity magnetic sensor was realized. As a result, a high-sensitivity InSb thin film magnetic sensor which could not been realized if the film thickness of InSb was 0.3 micrometers or less is realized by the present invention.

The thickness of this low-electron mobility layer depends on the thickness of the InSb layer, however, generally, it is about 20% or more of the thickness of the InSb layer when the thickness of the InSb layer is 0.3 micrometers or less. Thus, in the present invention, a condition for thinning the low-electron mobility layer at the hetero interface formed due to lattice mismatch is found, and as a result, even if the InSb thin film operation layer is thin, high electron mobility is obtained. Accordingly, a technique for a high-sensitivity magnetic sensor material and a technique for an insulating layer which could increase the electron mobility of InSb of an operation layer were newly born, and a high-sensitivity InSb thin film magnetic sensor was realized. Further, this brought about great effects such as realization, provision, improvement in performance, and reduction in cost, etc., of the new function of an electronic device system to which the high-sensitivity InSb thin film magnetic sensor was applied.

The InSb thin film magnetic sensor of the present invention is used with the structure shown in a section in FIG. 1A, FIG. 2A, or FIG. 3. When applying the InSb thin film magnetic sensor, it may be required to have extremely high durability and reliability.

Sixth Embodiment

Figure 6:
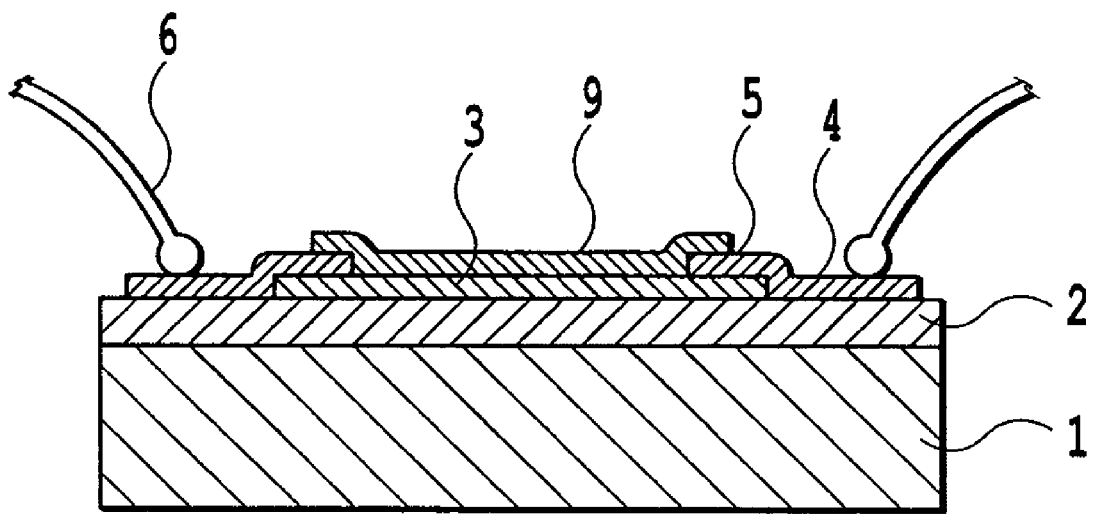
FIG. 6 is a drawing showing still another embodiment of the InSb thin film magnetic sensor of the present invention.

FIG. 6 is a drawing showing still another embodiment of the InSb thin film magnetic sensor of the present invention in which a protective layer that is an insulating layer is formed on the surface of an InSb thin film. The reference numeral 9 denotes a protective layer. In the structure shown FIG. 1, a protective layer 9 is provided so as to cover the portion above the operation layer 3 of the InSb thin film and the ends of the electrode connection portions 5. This protective layer is generally formed in the process of manufacturing a magnetic sensor.

For the purpose of preventing performance deterioration in the InSb thin film of the magnetic sensor section and providing the magnetic sensor with high reliability and durability, as shown in FIG. 6, a protective layer 9 that is an inorganic or organic insulating layer different from the group III-V compound semiconductor is formed on the surface of the magnetic sensor section made of an InSb thin film in some cases.

In this case, a preferable material example of the protective layer 9 that is an inorganic insulating layer is $Si_3N_4$, $SiO_2$, $Al_2O_3$, etc. An example of the protective layer 9 of a preferable organic insulating layer is a polyimide or polyimide-based organic insulating layer. This protective layer 9 may have a lamination structure made of a plurality of materials, and this lamination structure may be a plurality of inorganic or organic layers, or may be an inorganic and organic composite layer formed by laminating an inorganic layer and an organic layer in order.

Although this protective layer 9 is important, if InSb is thin, provision of the protective layer 9 poses a problem although it does not pose a problem when the thickness of InSb is 1 micrometer or more. In other words, when such an inorganic or organic insulating layer 9 is directly formed on the InSb thin film, it damages the surface of the InSb thin film 3, and causes great lowering in electron mobility. This lowering is 30 to 70% or more as shown in Table 1 although this depends on the thickness of InSb. Particularly, when the thickness of InSb is as extremely thin as 0.7 micrometers or less, 0.5 micrometers or less, or 0.3 micrometers or less, the influence from this protective layer 9 is great, and due to the impact and strain when forming the surface of the InSb thin film 3, it strains or damages the InSb thin film, and causes great lowering in electron mobility. It depends on the thickness of InSb, however, the lowering is 30 to 70% or more. Further, when the InSb thickness is 0.3 micrometers or less, normally, the lowering is about 40%, however, depending on the conditions, it reaches 70% or more, and causes performance deterioration such as a great change in sheet resistance of InSb although this depends on the thickness.

Therefore, when a high-sensitivity magnetic sensor is manufactured by using this InSb thin film for the magnetic sensitive portion or the magnetic sensor section, according to such a great performance fluctuation of InSb due to the protective layer 9, it becomes impossible to manufacture the high-sensitivity magnetic sensor. Particularly, when the thickness of InSb is as extremely small as 0.5 micrometers or less or 0.3 micrometers or less, even if the InSb thin film has desired performance, it is impossible to manufacture a high-sensitivity element due to performance deterioration caused by the protective film.

Figure 7A:
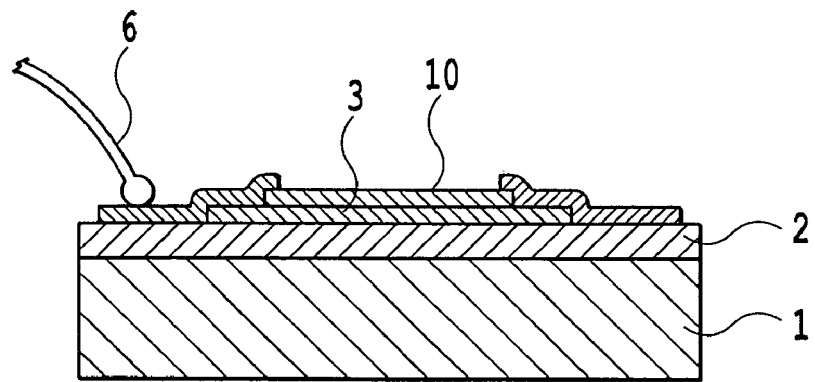
FIG. 7A is a sectional structural view of a Hall element having an insulative semiconductor protective layer formed on the surface of an InSb thin film, showing still another embodiment of the InSb thin film magnetic sensor of the present invention.
Figure 7B:
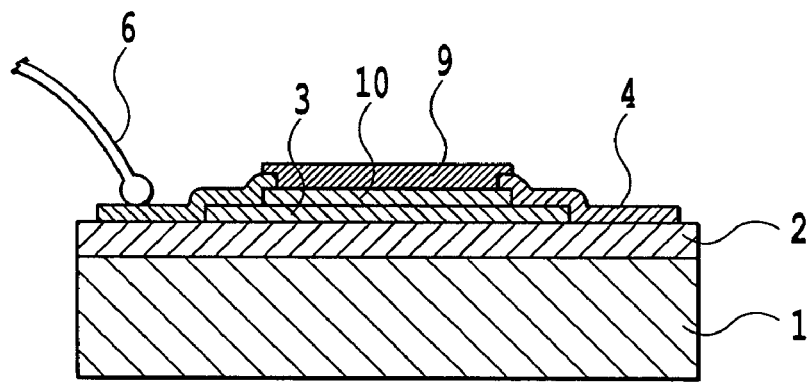
FIG. 7B is a sectional structural view of a Hall element having an insulative semiconductor protective layer and a protective layer formed on the surface of the InSb thin film, showing still another embodiment of the InSb thin film magnetic sensor of the present invention.

An InSb thin film magnetic sensor which uses the thin film lamination of the present invention structured as shown in FIG. 7A and FIG. 7B as the magnetic sensor section to solve the problem and prevent performance deterioration even in the case where the protective layer 9 is provided, is shown. An example of a Hall element is shown in a section.

Seventh Embodiment

FIG. 7A and FIG. 7B show still another embodiment of the InSb thin film magnetic sensor of the present invention. FIG. 7A is a sectional structural view of a Hall element including an insulative semiconductor protective layer (may be called cap layer) 10 formed on the surface of an InSb thin film. This semiconductor protective layer 10 may be formed by a plurality of layers, however, for simplicity, it is shown as one layer.

If the protective layer 9 is formed in direct contact with the InSb layer, due to lattice mismatch with the protective layer 9 and the impact in the step of forming the protective layer 9, the performance of InSb greatly deteriorates, so that the semiconductor protective layer 10 is formed by forming an insulating layer made of a compound semiconductor whose mismatch with InSb is small in advance on the InSb for the purpose of reducing performance deterioration even if the protective layer 9 is formed. Therefore, a typical preferable semiconductor protective layer is an $Al_xGa_yIn_{1-x-y}Sb$ mixed crystal layer. FIG. 7B is a sectional structural view of a Hall element including the insulative semiconductor protective layer 10 and the protective layer 9 which are formed on the surface of an InSb thin film.

In the present invention, an $Al_xGa_yIn_{1-x-y}Sb$ layer 10 which has a band gap larger than that of InSb is often formed on the operation layer 3. In other words, as an insulative semiconductor protective layer for preventing damage on the InSb thin film, an $Al_xGa_yIn_{1-x-y}Sb$ layer 10 which has a content of Al or Ga atoms in the range of x+y=5.0 to 17% ($0.05 \leq x+y \leq 0.17$) or a lattice mismatch in the range of 0.25 to 1.0% with the insulating layer in contact with the InSb conductive layer, and has a sheet resistance of 10 K$\Omega$ or more is formed. As shown in FIG. 7B, on this insulative semiconductor protective layer 10 formed in advance, a protective layer 9 as a normal protective layer is preferably formed. The high-sensitivity InSb thin film magnetic sensor of the present invention is preferably used by forming such a semiconductor protective layer 10 in contact with the InSb thin film, however, depending on circumstances, only the semiconductor protective layer 10 is formed without forming the protective layer 9.

Eighth Embodiment

Figure 8:
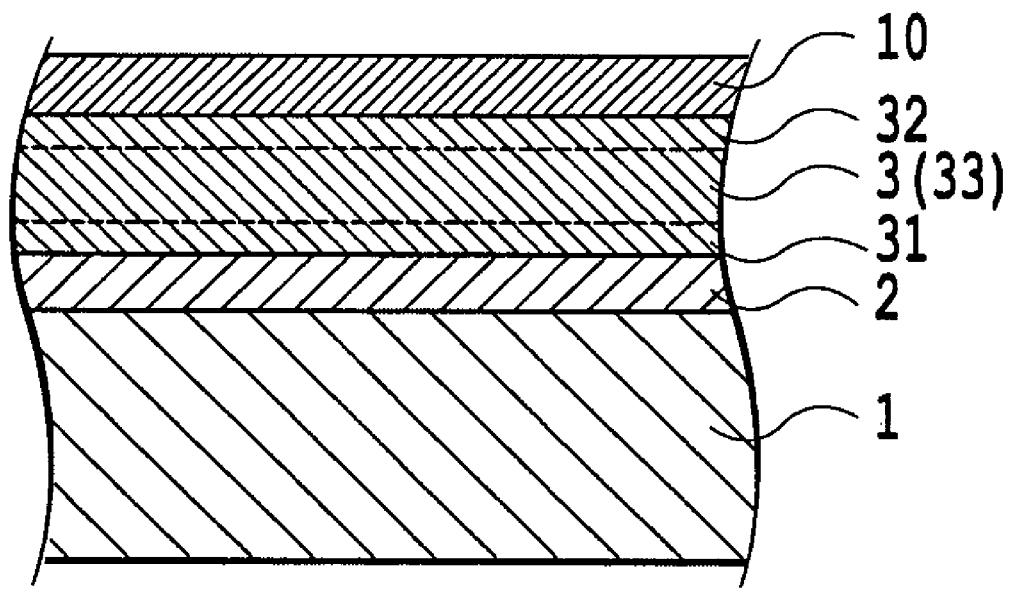
FIG. 8 is a sectional structural view of details of still another thin film lamination of the magnetic sensor section of the InSb thin film magnetic sensor of the present invention.

FIG. 8 is a sectional structural view of still another thin film lamination of the magnetic sensor section of the InSb thin film magnetic sensor of the present invention, showing a low-electron mobility layer formed in contact with the hetero interface between the surface of the InSb thin film in contact with the $Al_xGa_yIn_{1-x-y}Sb$ semiconductor protective layer 10 and the $Al_xGa_yIn_{1-x-y}Sb$ mixed crystal layer 2.

An insulating layer 2 is provided on the substrate 1, and thereon, an operation layer 3 is provided. Inside this operation layer 3, a low-electron mobility layer 31 is formed on the insulating layer 2 side and a low-electron mobility layer 32 is formed on the opposite side. On these layers, an insulative semiconductor protective layer 10 is further provided.

As an advantage of this semiconductor protective layer, as shown in a section of the thin film lamination of the magnetic sensor section of the InSb magnetic sensor of the present invention in FIG. 8, the thickness of the low-electron mobility layer 32 naturally formed on the InSb thin film surface becomes 10 nanometers or less according to formation of the insulative semiconductor protective layer 10 although this thickness is normally about 50 nanometers, and its influence is reduced, so that the electron mobility of the InSb thin film is improved. This effect is especially great when the film thickness of InSb is small. By forming this structure in which the $Al_xGa_yIn_{1-x-y}Sb$ mixed crystal layer is arranged on the lower surface and the upper surface of the InSb layer, the InSb thin film conductive layer shows high electron mobility even with a film thickness of 0.1 micrometers or less.

In the InSb thin film magnetic sensor of the present invention, by sandwiching the InSb thin film of the magnetic sensor section by the $Al_xGa_yIn_{1-x-y}Sb$ insulating layer 2 whose lattice constant is close to that of InSb and the $Al_xGa_yIn_{1-x-y}Sb$ semiconductor protective layer 10 or the semiconductor cap layer 10, extremely high electron mobility can be obtained even if the film thickness of the InSb is small. Particularly, reduction in thickness of the electron mobility layers on both surfaces of the InSb thin film to 10 nanometers or less is very advantageous. When the thin InSb layer is sandwiched by the $Al_xGa_yIn_{1-x-y}Sb$ insulating layer 2 and the $Al_xGa_yIn_{1-x-y}Sb$ semiconductor protective layer 10, an InSb quantum well structure is formed, and both layers form a potential barrier layer.

The thickness of the semiconductor protective layer 10 is not especially limited, however, preferably, not less than a certain thickness, and can be determined as appropriate. The effect as a cap layer is obtained even with the thickness of about 5 nanometers, however, as a thickness enabling this protective layer to sufficiently perform its function, for example, the range of 10 nanometers to 200 nanometers is preferable. Of course, a larger thickness is also allowed. Alternatively, the thickness is allowed to be smaller.

By further forming a high-insulation second semiconductor thin layer on the semiconductor protective layer, the effect of the semiconductor protective layer is preferably made more perfect. A preferable example is a high-insulation GaAs layer. An other semiconductor protective layer may be thus formed on the semiconductor protective layer 10 or the semiconductor protective layer 10 consists of two layers although this is not shown. This two-layer semiconductor protective layer structure is effective and frequently used. In other words, in the present invention, the $Al_xGa_yIn_{1-x-y}Sb$ insulating layer 2 and the cap layer 10 as an $Al_xGa_yIn_{1-x-y}Sb$ semiconductor protective layer may consist of a plurality of layers. In this case, a layer on the side in contact with InSb must have a lattice constant close to that of InSb and high insulation. However, the second semiconductor insulating layer which does not come into contact with InSb or a second semiconductor protective layer is allowed to have lattice mismatch with InSb. For example, it is also preferable that in a cap layer, an $Al_xGa_yIn_{1-x-y}Sb$ layer made of a group III-V compound semiconductor whose lattice constant difference is 0.25 to 1.0% or less to InSb is formed in advance on the surface of InSb, and then, a layer of $Al_xIn_yGa_zAs_\alpha Sb_\beta N_\gamma$ or the like satisfying x+y+z=1 and $\alpha+\beta+\gamma=1$ which has a band gap larger than that of InSb, insulation, or high resistance is formed, and thereafter, an inorganic or organic protective layer 9 is formed. Insulative GaAs is preferably used as the second semiconductor insulating layer or semiconductor protective layer.

In the InSb thin film magnetic sensor including, as a magnetic sensor section, a thin film lamination using the InSb thin film of the present invention as an operation layer, it is required that the insulating layer 2 made of $Al_xGa_yIn_{1-x-y}Sb$ mixed crystals or a cap layer 10 that is a semiconductor protective layer made of $Al_xGa_yIn_{1-x-y}Sb$ mixed crystals is formed in contact with the InSb thin film, and InSb thin film laminations having these basic structures are all included in the technical scope of the present invention.

The film thickness of the InSb layer of the present invention is not especially limited. Therefore, the film thickness of 1 micrometer or more is allowed, and in particular, even when the thickness of InSb is as extremely small as 0.7 microns or less, 0.5 micrometers or less, or 0.3 micrometers or less, the high electron mobility is maintained, and a great sheet resistance is obtained. In the present invention, when the InSb thin film is sandwiched by the $Al_xGa_yIn_{1-x-y}Sb$ insulating layer 2 and the cap layer 10 that is an $Al_xGa_yIn_{1-x-y}Sb$ semiconductor protective layer, a magnetic sensor section which shows high electron mobility even if the thickness of InSb is 0.1 micrometers or less is obtained, and this is in the technical scope of the present invention.

Thus, according to the technique of the present invention, the low-electron mobility layer formed at the hetero interface of the InSb thin film can be thinned.

Further, in the present invention, doping of the InSb thin film with a donor impurity for the purpose of reducing temperature changes in resistance and electron mobility is also performed. As the donor impurity, a group VI element is preferable, and a group IV element is also preferably used. For example, S, Se, Te, Si, Ge, Sn, or the like is used. Among these, Si and Sn are preferably used as a donor impurity when manufacturing the InSb lamination of the present invention by means of molecular beam epitaxy. In particular, Sn is a preferable material since its vapor pressure is easily controlled at a comparatively low temperature.

As a method for doping the impurity, it is preferable that, an area up to 10 nanometers from the hetero interface with $Al_xGa_yIn_{1-x-y}Sb$ is not doped with an impurity, and the remaining area, that is, an area from 10 nanometers to the surface is doped with the impurity. Alternatively, a method can be selected among several methods in which a part of the InSb layer is doped, or the entirety is doped with an impurity.

Thus, in the above-described structure of the InSb thin film of the present invention, even if the InSb thin film is thin in thickness, in particular, 1 micrometer or less, or further 0.7 micrometers or less or 0.5 micrometers or less or 0.3 micrometers or less, the electron mobility of the InSb thin film is 30,000 $cm^2/Vs$ or more. According to an example described later, even if the thickness of the InSb layer is 0.15 micrometers, an electron mobility of 28,000 $cm^2/Vs$ is obtained.

Thus, according to the present invention, a magnetic sensor which includes a thin film of InSb and has high electron mobility and high sensitivity, and further, a Hall element and a magneto resistance element including a thin film of InSb and having high sheet resistance, high input resistance, and small power consumption can be manufactured. In detail, according to the present invention, in the case of the same InSb layer thickness, when an $Al_xGa_yIn_{1-x-y}Sb$ layer satisfying the conditions of the present invention is formed, electron mobility being several times as high as that in the case where the $Al_xGa_yIn_{1-x-y}Sb$ layer is not formed is obtained. This difference is great, and increases and becomes conspicuous as the film thickness of InSb becomes thinner. Particularly, when the InSb layer is as extremely thick as 0.5 micrometers or less, 0.3 micrometers or less, or 0.1 micrometers or less, the difference becomes remarkable, and therefore, the electron mobility which enables manufacturing of a high-sensitivity magnetic sensor was realized for the first time by forming the $Al_xGa_yIn_{1-x-y}Sb$ layer of the present invention.

Next, the effects of the present invention will be described based on examples. When manufacturing a magnetic sensor by forming an InAlSb layer 2 as an example of the $Al_xGa_yIn_{1-x-y}Sb$ layer shown in FIG. 1, its effect of improving the electron mobility corresponding to the sensitivity for magnetic field detection is extremely great.

For example, when InSb with a thickness of 0.15 micrometers is directly formed on a GaAs (100) substrate, the electron mobility is about 7,000 $cm^2/Vs$. When an InSb thin film with a thickness of 0.15 micrometers is manufactured on a GaAs substrate, only low electron mobility is obtained as described above, however, by forming an XnAlSb layer 2 as an example of the $Al_xGa_yIn_{1-x-y}Sb$ layer shown in FIG. 1 of the present invention, an electron mobility of 28,000 $cm^2/Vs$ or, depending on the crystal growth conditions, 40,000 $cm^2/Vs$ or more can be obtained in comparison with the case where the InAlSb layer is not formed. This value is 4 to 5 times as high as that in the case where the InSb layer is directly grown. In the case where an InSb layer with a thickness of 0.3 micrometers is grown, an InSb single-crystal thin film with electron mobility as high as 40,000 $cm^2/Vs$ or, depending on the crystal growth conditions, 50,000 $cm^2/Vs$ or more can be manufactured. Thus, according to the present invention, the effect of improving the electron mobility corresponding to the sensitivity for magnetic field detection of the magnetic sensor is extremely great.

Further, in the case where the $Al_xGa_yIn_{1-x-y}Sb$ layer of the present invention was formed as a cap layer on the surface of the InSb layer, when the InSb layer was extremely thin and an inorganic protective layer of $Si_3N_4$ or $SiO_2$, etc., was formed, 50% or more process fluctuation (sensitivity lowering) was observed if no cap layer was provided, however, according to the present invention, the process fluctuation was reduced to 5% or less, further, to 3% or less. Thus, the process fluctuation becomes so small that it does not pose a problem in performance of the magnetic sensor. In other words, by using the technique of the present invention, even if the InSb layer is extremely thin, extremely high electron mobility is obtained, and in this process, performance deterioration rarely occurs, so that a high-sensitivity magnetic sensor can be manufactured. The effect of the present invention is thus great in manufacturing of a high-sensitivity magnetic sensor, and its influence on industry will be immeasurable.

Particularly, the electron mobility increases 1.5 times or more when the thickness of the InSb layer is 0.7 micrometers or less, 2 times or more in the case of a thickness of 0.5 micrometers or less, 3 times or more in the case of a thickness of 0.35 micrometers or less, 4 times or more in the case of a thickness of 0.25 micrometers or less, and six times or more in the case of a thickness of 0.10 micrometers or less, and thus, the effect of the InAlSb layer is remarkable. Even if the InSb film thickness is reduced due to the InAlSb layer, the effect of obtaining high electron mobility of the InSb layer does not substantially change even when the InSb layer is doped with a donor impurity such as Si, Sn, Te, S, or Se. By doping the InSb layer 3 with a donor impurity, a high-sensitivity thin film magnetic sensor whose temperature dependencies of sensitivity, input resistance, and Hall coefficient are small can be manufactured. As the donor impurity mentioned herein, any one is usable as long as it provides n-type conduction for InSb, and as a preferable example, it is a group VI or IV element such as Sn, Si, Ge, C, S, Se, or Te.

Even in the case where, instead of direct doping of InSb layer 3, a proximal layer 2 of insulative or high-resistance $Al_xIn_yGa_zAs_\alpha Sb_\beta N_\gamma$ (x+y+z=1, α+β+γ=1), etc., is doped with an impurity as a donor and electrons are implanted into the InSb thin film layer in a modulation doping manner, the temperature dependencies are also remarkably improved, so that this method is also frequently used.

Next, a method for manufacturing an InSb thin film magnetic sensor of the present invention will be described.

In the present invention, to manufacture an InSb thin film magnetic sensor, generally, an $Al_xGa_yIn_{1-x-y}Sb$ mixed crystal layer 2 is grown on a substrate 1 by means of molecular beam epitaxy, and then, an InSb thin film is epitaxially grown on the mixed crystal layer.

Next, the manufactured InSb thin film is processed according to a wafer process unique to the magnetic sensor of the present invention including the steps of pattern etching of the InSb thin film based on photolithography using a photosensitive resist, exposing the surface of the InSb layer by opening a window in a necessary portion of the $Al_xGa_yIn_{1-x-y}Sb$ mixed crystals of the cap layer, forming an electrode pattern by forming a metal thin film on a necessary portion of InSb or an electrode contact portion where a window is opened and the surface of InSb is exposed by means of vapor deposition, sputtering, wet plating, etc., forming an inorganic protective layer on portions except for external connection bonding electrodes so as to cover the magnetic sensitive portion surface of the element as appropriate, and further, forming a thin layer having rubber elasticity of Si resin or the like so as to cover the magnetic sensitive portion by means of photolithography as appropriate, and then, many micro high-sensitivity InSb thin film magnetic sensors such as Hall elements or magneto resistance elements are manufactured at one time on a wafer.

Next, the wafer is cut into individual Hall element chips, etc., by a dicing saw. Further, the chip of this InSb thin film magnetic sensor is generally packaged through a standard transfer mold process, subjected to performance inspection, and then completed as a product.

Hereinafter, detailed examples will be described.

EXAMPLE 1

A molecular beam epitaxy apparatus to be used for manufacturing a thin film lamination of the present invention is formed of a cylindrical vacuum chamber for maintaining a vacuum and includes at least a mechanism which holds horizontally a GaAs substrate for growing crystals thereon and a mechanism which provides periodic movement such as rotation for irradiating equally and uniformly vapors of constituent elements of the thin film to be formed on the substrate surface from evaporation sources. Further, the molecular beam epitaxy apparatus is a crystal growing apparatus which includes means for carrying the substrate in and out of a crystal growth chamber in a state where a vacuum in the crystal growth chamber is maintained. This apparatus includes a resistance heater as a heat radiation source which is in proximity to a substrate having a GaAs (100) surface on which an InSb thin film is grown at the subsequent step and electrically heated to a high temperature and set on the opposite side of the InSb thin film growing surface, and a temperature sensor which can measure the substrate temperature.

Further, the apparatus includes a plurality of evaporation sources which can irradiate the substrate surface with vapor beams of elements charged in the evaporation sources at a predetermined intensity for a predetermined time, that is, a plurality of evaporation sources (Knudsen cells, called K-cells) as means for generating vapors of constituent elements for forming a thin film by electrical heating, temperature measuring sensors set in the respective evaporation sources to control the intensities of the vapors, and power supply means which are set corresponding to the respective evaporation sources to maintain a state of generating vapors of elements charged in the evaporation sources corresponding to predetermined vapor intensities and maintain the evaporation sources at a predetermined evaporation source temperature, and in addition, a power supply means.

Further, in the molecular beam epitaxy apparatus as a crystal growing apparatus including a crystal growth chamber that has means such as shutters or valves which can cut off vapors generated from the evaporation sources, and further has a vapor intensity measuring device capable of measuring intensities of the vapors, while an accumulated vapor pressure of remaining impurity gases such as $H_2$, CO, $CO_2$, He, $N_2$, $O_2$, etc., (excluding vapors of elements forming the thin film, for example, $As_4$, $As_2$, $Sb_2$, $Sb_4$, etc.) was maintained at $2\times10^{-8}$ Torr or less when the substrate is heated and irradiating As vapor containing $As_4$ or $As_2$ onto the (100) surface of the insulative GaAs substrate with a thickness of 0.35 millimeters and a diameter of 2 inches, the substrate was heated to 630° C., and then controlled within 420±2 cc.

Next, by simultaneously making Al, In, and Sb incident at a predetermined vapor pressure ratio (beam intensity ratio measured with a beam monitor), on the GaAs (100) surface, a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance was grown to 0.7 micrometers.

Next, In and Sb were simultaneously evaporated at the substrate temperature of 420±2° C. to form a single-crystal InSb thin film with a thickness of 0.7 micrometers on the $Al_{0.1}In_{0.9}Sb$ layer formed on the GaAs (100) surface. Further, the AlInSb layer grown on the GaAs (100) surface under these trial manufacturing conditions was subjected to an experiment of X-ray diffraction, and the crystallinity of the $Al_{0.1}In_{0.9}Sb$ mixed crystal layer was evaluated. As a result, the full width at half maximum (FWHM) at the peak of the $Al_{0.1}In_{0.9}Sb$ mixed crystals of the rocking curve of the X-ray diffraction from the (004) surface was 1150 seconds. When the film thickness of $Al_{0.1}In_{0.9}Sb$ was set to 1.0 micrometer, the full width at half maximum was reduced to 600 seconds, however, in this example, the thickness was set to 0.7 micrometers.

The electron mobility of the InSb thin film manufactured with this structure is 53,000 $cm^2/Vs$, and the sheet resistance is 101 $\Omega$/square, and these electron mobility and the sheet resistance are extremely high. By using this InSb thin film lamination as the magnetic sensitive portion, a magnetic sensor such as a Hall element or magneto resistance element having high sensitivity and high input resistance (with high sensitivity of 200$\Omega$ or more) can be manufactured. As performance obtained by manufacturing a Hall element using the InSb thin film of this example as a magnetic sensitive portion, the input resistance was 200$\Omega$, and the Hall voltage in response to application of 50 mT magnetic flux density when driven with a constant voltage of 1V was 132 mV. In other words, the sensitivity in a magnetic field was as high as 132 mV/V·50 mT.

EXAMPLE 2

The InSb thin film of Example 1 may be used as it is for manufacturing a magnetic sensor, and further, for the purpose of manufacturing a magnetic sensor with improved environment-resistance performance, a protective layer of $Si_3N_4$ or $SiO_2$, etc., is frequently formed as an environment protective layer by means of plasma CVD on the InSb thin film layer of Example 1. Particularly, when the InSb thin film is as thin as 1 micrometer or less as in the case of Example 1, if $Si_3N_4$ to 0.3 micrometers was directly formed on the surface of InSb, at least 35 to 40% lowering in electron mobility and sheet resistance occurs although this depends on the thickness, and the performance of high sensitivity of the magnetic sensor expected at the beginning is lost and a magnetic sensor with desired high sensitivity cannot be manufactured.

When the InSb thin film becomes thinner, loss of the excellent performance as the magnetic sensor material of the InSb lamination of the present invention due to direct formation of $Si_3N_4$ used as a protective layer on. InSb becomes a huge problem.

To solve this, in the present invention, a semiconductor protective layer which is a semiconductor insulating layer whose lattice constant is close to that of InSb may be formed on the InSb thin film. This semiconductor insulating layer may consist of one layer or two layers, however, as a surface in contact with the InSb thin film, an AlInSb or AlGaInSb layer whose lattice constant is close to that of InSb is formed. In this embodiment, an InSb thin film with the same thickness of 0.7 micrometers as in Example 1 was formed according to the same method. Next, an $Al_{0.1}In_{0.9}Sb$ layer was formed at a substrate temperature of 420±2° C., and thereon, a GaAs layer was further formed to form a cap layer, that is, a semiconductor protective layer that was a semiconductor insulating layer. In other words, a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance was grown to a thickness of 50 nanometers (0.05 micrometers).

Next, 6 nanometer GaAs was grown. A protective layer of this compound semiconductor was formed. The electron mobility of the InSb thin film of this example was 51,600 $cm^2/Vs$, and the sheet resistance was 97 Ω/square. There was no great performance change from Example 1, and high electron mobility and high sheet resistance were obtained. In other words, by using this InSb thin film lamination as the magnetic sensitive portion, a high-sensitivity and high-input resistance (200Ω or more) magnetic sensor such as a Hall element or magneto resistance element could be manufactured, so that it was proved that this InSb thin film lamination could be used for manufacturing a high-sensitivity magnetic sensor.

By forming this semiconductor protective layer, an effect of reducing performance deterioration due to the above-described protective layer was obtained. In other words, in the process of manufacturing a Hall element using the InSb thin film lamination as a magnetic sensor section, 0.3 micrometer $Si_3N_4$ was formed on the GaAs layer that was the top layer by means of plasma CVD to form a protective layer, however, the lowering in electron mobility and sheet resistance was as small as 5% or less. In other words, great performance deterioration due to the protective layer did not occur, and performance of high electron mobility and high sheet resistance did not deteriorate even through the protective layer forming step. As a result, a magnetic sensor such as a Hall element or magneto resistance element having high sensitivity, high input resistance (with high sensitivity of 200Ω or more), and extremely high environment resistance can be manufactured.

As a result of manufacturing a Hall element, the obtained performance of the element showed an input resistance of 205Ω and a Hall voltage of 126 mV at 50 mT when driven with a constant voltage of 1V. In other words, the sensitivity in a magnetic field was as high as 126 mV/V·50 mT. In comparison with Example 1, the performance of the Hall element is not greatly changed, so that most of the influence from the 0.3 micrometer $Si_3N_4$ protective layer was eliminated by the formation of the AlInSb semiconductor insulating layer.

EXAMPLE 3

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, an insulative GaAs substrate with a thickness of 0.35 millimeters and a diameter of 2 inches was heated to 630° C. (controlled within ±2° C.) while the (100) surface thereof was irradiated with As vapor containing $As_4$ or $As_2$ (that is, a step for preventing separation of constituent elements forming the GaAs substrate surface), and then the temperature was lowered to 420° C. while irradiating As vapor, and next, according to a predetermined temperature pattern around 420° C., the temperature of the substrate was controlled within ±2° C. of the central temperature.

Then, vapors of elements charged in the evaporation sources, that is, Al, In, and Sb were simultaneously made incident at a predetermined vapor pressure ratio (beam intensity ratio measured with a beam monitor) to grow 0.7 micrometers of a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance at a growth rate of 1 μm/h on the GaAs (100) surface. Then, In and Sb were simultaneously evaporated from the evaporation sources charged with In and Sb, respectively, whereby a single-crystal InSb thin film with a thickness of 0.3 micrometers and a sheet electron concentration of $5.8\times10^{11}/cm^2$ was formed on the $Al_{0.1}In_{0.9}Sb$ layer formed on the GaAs (100) surface.

Further, on this InSb thin film, a single-crystal $Al_{0.1}In_{0.9}Sb$ mixed crystal thin film (having a lattice constant difference of 0.5% from InSb) which had atomicity proportions of 90% In and 10% Al and had insulation or semi-insulation or high resistance was grown to a thickness of 50-nanometers (0.05 micrometers), and then 6-nanometer GaAs was grown.

An InSb thin film of Example 3 manufactured with this structure has an electron mobility of 37,000 $cm^2/Vs$ and a sheet resistance of 300 Ω/square, and these electron mobility and sheet resistance are extremely high, so that a magnetic sensor such as a Hall element or a magneto resistance element with high sensitivity and high input resistance (500Ω or more) can be manufactured by using this InSb thin film lamination as a magnetic sensitive portion.

By using this InSb thin film as the magnetic sensitive portion, a Hall element with a high input resistance (200Ω or more) was manufactured. As a result, the performance of the element showed an input resistance of 550Ω and a Hall voltage of 92 mV at 50 mT when driven with a constant voltage of 1V. In other words, the sensitivity in a magnetic field was as high as 92 mV/V·50 mT. This element has an extremely high input resistance, so that its driving power is small.

For the purpose of manufacturing a magnetic sensor with improved environment resistance performance, $Si_3N_4$ is frequently formed to about 0.3 micrometers by plasma CVD on the surface of the uppermost GaAs ($Al_{0.1}In_{0.9}Sb$ insulating layer when GaAs is not provided).

Particularly, when the thickness of the InSb thin film is as thin as 1 micrometer or less as in the case of this example, when 0.3 micrometer $Si_3N_4$ is directly formed on the InSb thin film with a thickness of 0.3 micrometers by means of plasma CVD, it involves great performance fluctuation in many cases although the fluctuation depends on the thickness.

A problem was posed that when 0.3 micrometer $Si_3N_4$ is directly formed on the InSb thin film with a thickness of 0.3 micrometers by means of plasma CVD, at least 35 to 50% or more lowering in electron mobility and sheet resistance occurs, and the performance of high sensitivity of the magnetic sensor expected at the beginning is lost, and a magnetic sensor with desired performance cannot be manufactured.

However, in this embodiment, insulative $Al_{0.1}In_{0.9}Sb$ and GaAs (6 nanometers) as a semiconductor protective layer are formed on the InSb thin film, and even if 0.3 micrometer $Si_3N_4$ is formed by plasma CVD, lowering in electron mobility and sheet resistance is as extremely small as 5%.

As a result, in the case of this example, regardless of the small thickness of 0.3 micrometers of the InSb thin film, a magnetic sensor such as a Hall element or magneto resistance element with high sensitivity, high input resistance (500Ω or more) and high environment resistance reliability could be manufactured. Even if the step of forming the protective layer of $Si_3N_4$ to 0.3 micrometers by plasma CVD is added to the magnetic sensor manufacturing process, the performance of the manufactured element is not greatly changed.

In other words, the obtained performance of the element showed an input resistance of 590Ω and a Hall voltage of 89 mV at 50 mT when driven with a constant voltage of 1V. That is, the sensitivity in the magnetic field is as high as 89 mV/V·50 mT, and the influence from sensitivity lowering caused by the protective layer is rarely observed. On the other hand, the formation of this 0.3 micrometer $Si_3N_4$ protective film provided the Hall element with high reliability such as environment resistance performance and a lengthened lifetime.

EXAMPLE 4

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, Her $N_2$, and $O_2$, etc., (excluding vapors of elements forming the thin film, for example, $As_4$, $As_2$, $Sb_2$, $Sb_4$, etc.) was maintained at $1 \times 10^{-8}$ Torr or less when heating the substrate, a GaAs substrate with a thickness of 0.35 millimeters and a diameter of 2 inches was heated to 620° C. while the (100) surface thereof was irradiated with As vapor containing $As_4$ or $As_2$ (that is, a step for preventing separation of constituent elements forming the GaAs substrate surface), and then the temperature was lowered and set to and maintained at 420±2° C. In this state, vapors of elements charged in the evaporation sources, that is, Al, In, and Sb were simultaneously made incident at a predetermined vapor pressure ratio (beam intensity ratio measured with a beam monitor) to grow a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance to a thickness of 0.7 micrometers at a growth rate of 1 micrometer/h on the GaAs (100) surface. Then, In and Sb were simultaneously evaporated, and further, Sn was evaporated from the evaporation source in which Sn is a donor impurity, whereby a single-crystal InSb thin film which had a thickness of 0.3 micrometers, and was doped with Sn, and had a sheet electron concentration of $2.0 \times 10^{12}/cm^2$, a sheet resistance of 77 Ω/square, and an electron mobility of 34,000 $cm^2/Vs$ was manufactured on the $Al_{0.1}In_{0.9}Sb$ layer formed on the GaAs (100) surface.

In the InSb thin film of this example, electrons increased by doping with Sn that is a donor impurity in comparison with the case without doping, and according to this effect, temperature dependencies of the sheet electron concentration and sheet resistance around room temperature (in the range of −40 to 150° C.) were reduced by about one order, that is, reduced to ¹⁄₁₀ to ²⁄₁₀ of those of the undoped thin film of Example 1. As a result, when manufacturing a Hall element by using the InSb thin film of this example, temperature dependency of the Hall voltage (magnetic field detection signal) in constant-current driving was reduced by one order, that is, reduced to ¹⁄₁₀ to ²⁄₁₀. The temperature dependency of the input resistance was also reduced to ¹⁄₁₀ to ²⁄₁₀. Such reduction in temperature dependency of the Hall element is practically very important, and this significantly improved the practical performance and functions of the Hall element.

As the obtained element performance, the input resistance was 164Ω and a Hall voltage was 85 mV at 50 mT when driven with a constant voltage of 1V. In other words, the sensitivity in a magnetic field was as extremely high as 85 mV/V·50 mT.

EXAMPLE 5

In Example 4, a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance was further grown to a thickness of 50 nanometers (0.05 micrometers) on the InSb thin film, and then 6 nanometer GaAs was grown.

The performance of InSb thin film showed an electron mobility of 34,000 $cm^2/Vs$ and a sheet resistance of 80 Ω/square although slight lowering in sheet resistance due to Sn doping and slight lowering in electron mobility due to impurity scattering were observed. The electron mobility and the sheet resistance were extremely high, and by using this InSb thin film as a magnetic sensitive portion, a magnetic sensor such as a Hall element or magneto resistance element with high sensitivity and high input resistance (180Ω or more) can be manufactured, and as in the case of Example 4, this InSb thin film is usable for manufacturing a magnetic sensor with high sensitivity and less temperature dependency.

Further, in this example, temperature dependency (temperature coefficient) of the sheet electron concentration of the InSb thin film in the range of −40 to 150° C. around room temperature was reduced by one order, that is, reduced to ¹⁄₁₀ to ²⁄₁₀ in comparison with Example 1. As a result, dependencies of the Hall voltage (magnetic field detection signal) when driven with a constant current and the input resistance of the Hall element of a Hall element manufactured by using the InSb thin film of this example as a magnetic sensor section were reduced by one order, that is, reduced to ¹⁄₁₀ to ²⁄₁₀ in comparison with the undoped case.

Performance of a Hall element manufactured without forming a 0.3 micrometer insulating layer of $Si_3N_4$ in the process of manufacturing the Hall element showed an input resistance of 175Ω and a Hall voltage of 82 mV at 50 mT when driven with a constant voltage of 1V. In other words, the sensitivity in a magnetic field was as high as 82 mV/V·50 mT. Regardless of doping, the input resistance is as sufficiently high as 175Ω.

Further, a case where $Si_3N_4$ was formed to 0.3 micrometers by plasma CVD on the surface of GaAs of the uppermost layer of the InSb lamination for the purpose of manufacturing a magnetic sensor with improved environment resistance performance will be described.

When the InSb thin film has a thickness of 0.3 micrometers and no semiconductor protective layer is provided, if $Si_3N_4$ is directly formed on InSb, 35 to 50% or more lowering in electron mobility and sheet resistance occurs, and performance of the high sensitivity of the magnetic sensor expected at the beginning is lost. In this example, influence from the step of forming a protective layer of $Si_3N_4$ to 0.3 micrometers by plasma CVD on the element performance was investigated. The semiconductor protective layer is formed, so that the damage due to plasma CVD is as small as 3%, and basic performance of the Hall element such as the sensitivity of the Hall element, temperature dependency, and element resistance were not greatly lowered. Therefore, the performance of the manufactured Hall element was not changed from the element performance described above of this example in which $Si_3N_4$ was not formed.

EXAMPLE 6

By using a molecular beam epitaxy apparatus as a crystal growing apparatus including a crystal growth chamber having the same function and structure as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, an insulative GaAs substrate with a thickness of 0.35 millimeters and a diameter of 2 inches was heated to 630° C. (controlled within ±2° C.) while the (100) surface thereof was irradiated with As vapor containing $As_4$ or $As_2$ (that is, a step for preventing separation of constituent elements forming the GaAs substrate surface), and then the temperature was lowered to 420° C. while irradiating As vapor, and the substrate temperature was set to a predetermined 420±2° C.

At this substrate temperature, Al, In, and Sb were simultaneously made incident with a predetermined vapor pressure ratio (beam intensity ratio measured with a beam monitor) to grow a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance to a thickness of 0.7 micrometers at a growth rate of 1 micrometer/h on the GaAs (100) surface. Then, In and Sb were simultaneously evaporated from the evaporation sources at the substrate temperature of 420±2° C., and whereby a single-crystal InSb thin film with a thickness of 0.15 micrometers was formed on the $Al_{0.1}In_{0.9}Sb$ layer. Further, on the InSb thin film, a single-crystal $Al_{0.1}In_{0.9}Sb$ mixed crystal thin film (with a lattice constant difference of 0.5% from InSb) as a semiconductor protective layer which had atomicity proportions of 90% In and 10% Al and had insulation or semi-insulation or high resistance was grown to a thickness of 50 nanometers (0.05 micrometers), and then 6 nanometer GaAs was grown. The substrate temperature was constantly kept at 420° C. over the entire period of this mixed crystal thin film formation.

The electron mobility of the manufactured InSb thin film was 28,000 cm²/Vs, the sheet resistance was 700 Ω/square, and the sheet electron concentration was $3.3\times10^{11}/cm^2$. These electron mobility and sheet resistance are extremely high, and by using this InSb thin film as the magnetic sensitive portion, a magnetic sensor such as a Hall element or magneto resistance element with high sensitivity and high input resistance (1,000Ω or more) can be manufactured, so that it is obvious that this thin film can be used for manufacturing a high-sensitivity magnetic sensor whose power consumption is extremely small.

Therefore, in this example, a Hall element was manufactured by using this InSb thin film and performing a step of forming a protective layer of $Si_3N_4$ with a thickness of 0.3 micrometers (passivation=RC formation). Particularly, when the InSb thin film is as extremely thin as 0.15 micrometers as in the case of this example, if $Si_3N_4$ is directly formed to 0.3 micrometers on the surface of InSb by means of plasma CVD, 60 to 70% lowering in electron mobility and sheet resistance occurs, and performance of high sensitivity of the magnetic sensor expected at the beginning is lost, so that a Hall element with desired performance cannot be manufactured.

However, in the case of this embodiment, even when 0.3 micrometer $Si_3N_4$ is formed by plasma CVD, lowering in electron mobility and sheet resistance is as extremely small as 3% or less, that is, lowering in performance in the protective layer forming step is very small, so that a Hall element with extremely high environment resistance reliability, high sensitivity, and high input resistance was manufactured.

The performance showed a Hall voltage of 70 mV in a magnetic field of 50 mT when driven with 1V, and an input resistance of 1200Ω. The sensitivity in the magnetic field was as high as 70 mV/V50 mT. Further, high resistance showing an input resistance of 1200Ω was obtained, so that a Hall element with extremely small power consumption when driven could be manufactured.

EXAMPLE 7

Example of InP Substrate

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, an insulative GaAs substrate with a thickness of 0.35 millimeters and a diameter of 2 inches was heated to 620° C. while the (100) surface thereof was irradiated with As vapor containing $As_4$ or $As_2$, and then the temperature was lowered to 420° C. and kept at 420±2° C. that was an optimal substrate temperature when growing InSb crystals.

Next, Al, In, and Sb were simultaneously made incident at a predetermined vapor pressure ratio (beam intensity ratio measured with a beam monitor) to grow a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance to a thickness of 0.7 micrometers on the InP (100) surface at a growth rate of 1 micrometer/h. Then, the substrate temperature was kept at 420±2° C., In and Sb were simultaneously evaporated from the evaporation sources, and further, Sn was evaporated from the evaporation source in which Sn is a donor impurity, whereby a single-crystal InSb thin film which had a thickness of 0.3 micrometers and was doped with Sn, and had a sheet electron concentration of $2.42\times10^{12}/cm^2$ was manufactured on the $Al_{0.1}In_{0.9}Sb$ layer formed on the InP (100) surface. Further, on this InSb thin film, a single-crystal $Al_{0.1}In_{0.9}Sb$ mixed crystal thin film (with a lattice constant difference of 0.5% from InSb) as a semiconductor protective layer which had atomicity proportions of 90% In and 10% Al and had insulation or semi-insulation or high resistance was formed to a thickness of 50-nanometers (0.05 micrometers), and then 6-nanometer GaAs was grown.

The performance of the InSb thin film showed an electron mobility of 38,200 cm²/Vs and a sheet resistance of 70 Ω/square although slight lowering in sheet resistance due to Sn doping and slight lowering in electron mobility due to impurity scattering were observed. These electron mobility and sheet resistance are extremely high, so that a magnetic sensor such as a Hall element or magneto resistance element with high sensitivity, high input resistance, and less temperature dependency can be manufactured by using this InSb thin film as the magnetic sensitive portion.

Therefore, a Hall element was manufactured by using the InSb thin film of this example. Performance of a Hall element manufactured without forming an $Si_3N_4$ insulating layer of 0.3 micrometers in the process of manufacturing the Hall element showed an input resistance of 150Ω and a Hall voltage of 95 mV at 50 mT when driven with a constant voltage of 1V. In other words, the sensitivity in a magnetic field was as extremely high as 95 mV/V·50 mT. Regardless of Sn doping, the input resistance is sufficiently high as 150Ω.

In this example of the Hall element using the InSb thin film lamination, according to Sn doping, the temperature dependency (temperature coefficient) of performance of the Hall element at a temperature in the range of −40 to 150° C. around room temperature was reduced by about one order, that is, reduced to $1/10$ to $2/10$ in comparison with the undoped thin film of Example 1. The temperature dependencies of the Hall voltage (magnetic field detection signal) when driven with a constant current and the input resistance of the Hall element were reduced by one order, that is, reduced to $1/10$ to $2/10$.

Further, performance of a Hall element in which a protective layer was formed for the purpose of manufacturing a magnetic sensor with improved environment resistance performance will be described. As a result, a Hall element was manufactured by performing a step of forming a protective layer of $Si_3N_4$ to 0.3 micrometers by plasma CVD on the GaAs thin film that was the uppermost layer, however, its influence was extremely small, and the basic performance of the manufactured Hall element such as sensitivity, temperature dependency, and element resistance were rarely influenced. Therefore, the performance of the manufactured Hall element was not changed from the performance of the example described above. As shown in this example, the result of the present invention does not change even if the substrate is changed from GaAs to InP.

EXAMPLE 8

Example of Si Substrate

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, and an Si single-crystal substrate which had a thickness of 0.35 mm, a diameter of 2 inches, and a $SiO_2$ insulating layer formed by high-frequency sputtering on the surface was set. On the $SiO_2$ surface of this Si substrate, an insulative GaAs layer was formed to 0.5 micrometers by irradiating Ga and As beams. Then, it was heated to 610° C. while irradiating As vapor containing $As_4$ or $As_2$ (that is, a step for preventing separation of constituent elements forming the GaAs substrate surface), and then the temperature was lowered to 420° C. and the substrate temperature was set to a predetermined temperature of 420±2° C. optimal for InSb crystal growth.

At this substrate temperature, Al, In, and Sb were simultaneously made incident with a predetermined vapor pressure ratio (beam intensity ratio measured with a beam monitor) to grow a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance to a thickness of 0.7 micrometers at a growth rate of 1 micrometer/h on the surface of GaAs thin film. Then, In and Sb were simultaneously evaporated from the evaporation sources at the substrate temperature of 420±2° C., and further, Sn was evaporated from the evaporation source in which Sn is a donor impurity, whereby a single-crystal InSb thin film which had a thickness of 0.3 micrometers and was doped with Sn, and had a sheet electron concentration of $2.42\times10^{12}/cm^2$ was formed on the $Al_{0.1}In_{0.9}Sb$ layer.

Temperature dependencies of the performance such as electron mobility, sheet resistance, and Hall coefficient, etc., of the InSb thin film of this example at a temperature in the range of −40 to 150° C. around room temperature were reduced by about one order, that is, reduced to $1/10$ to $2/10$ of those of the undoped InSb thin film of Example 1. As a result, when a Hall element was manufactured, a Hall element which had high sensitivity and whose temperature dependency of Hall voltage (magnetic field detection signal) when driven with a constant current was reduced by one order, that is, reduced to $1/10$ to $2/10$ was obtained.

As shown in this example, even when the GaAs (100) substrate is changed into an Si substrate having an $SiO_2$ insulating layer on its surface, the result of the present invention did not greatly change although the operation procedures slightly changed in the growth processing or crystal growth processing, and the same result as in the case of the GaAs (100) substrate is obtained. The same applies to the case using another substrate of sapphire, etc. In this example, an $SiO_2$ insulating layer was used, however, $SiO_2$ may be omitted when the GaAs thin layer to be formed on the insulating layer has high insulation (the insulation effect of the GaAs thin layer is high when formed at a low temperature).

EXAMPLE 9

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, an insulative GaAs substrate with a thickness of 0.35 millimeters and a diameter of 2 inches was heated to 630° C. (controlled within ±2° C.) while the (100) surface thereof was irradiated with As vapor containing $As_4$ or $As_2$ (that is, a step for preventing separation of constituent elements forming the GaAs substrate surface), and then the temperature was lowered to 420° C., and set to the substrate temperature of 420±2° C.

Next, Ga, Al, In, and Sb were simultaneously made incident at a predetermined vapor pressure ratio (beam intensity ratio measured with a beam monitor) to grow 0.7 micrometers of an $Al_{0.1}Ga_{0.05}In_{0.85}Sb$ mixed crystal thin film (with a lattice constant difference of 0.5% from InSb) which had atomicity proportions of 5% Ga, 85% In, and 10% Al and had insulation or semi-insulation or high resistance at a growth rate of 1 micrometer/h on the GaAs (100) surface. Then, In and Sb were simultaneously evaporated and Sn was further evaporated as a donor impurity, whereby a single-crystal InSb thin film which had a thickness of 0.3 micrometers and was doped with Sn, and had an electron concentration of 2.4×

$10^{12}/cm^2$, a sheet resistance of 74 Ω/square, and an electron mobility of 34,000 $cm^2$/Vs was formed on the $Al_{0.1}GA_{0.05}In_{0.85}Sb$ layer.

The InSb thin film of this Example 9 had increased electrons in the conduction band of InSb according to doping with a donor impurity of Sn in comparison with the undoped case, and according to the effect of this, temperature dependencies (temperature coefficients) of the Hall coefficient, sheet electron concentration, and sheet resistance around room temperature (in the range of −40 to 150° C.) were reduced by about one order, that is, reduced to 1/10 to 2/10 in comparison with the undoped InSb thin film of Example 1. As a result, when a Hall element was manufactured by using the InSb thin film of this example, the temperature dependency of the Hall voltage (magnetic field detection signal) of constant-current driving was reduced by one order, that is, reduced to 1/10 to 2/10. The temperature dependency of the input resistance was also reduced to 1/10 to 2/10. Such reduction in temperature dependency of the Hall element is very important in practical use, and dynamically improved practical performance and function of the Hall element.

The obtained performance of the element showed an input resistance of 168Ω, and a Hall voltage of 90 mV at 50 mT when driven with a constant voltage 1V. In other words, the sensitivity in the magnetic field was as extremely high as 90 mV/V·50 mT.

EXAMPLE 10

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1×10^{−8}$ Torr or less when heating the substrate, an insulative GaAs substrate with a thickness of 0.35 millimeters and a diameter of 2 inches was heated to 620° C. while the (100) surface thereof was irradiated with As vapor containing $As_4$ or $As_2$ (that is, a step for preventing separation of constituent elements forming the GaAs substrate surface), and then the temperature was lowered to 420° C., and the substrate temperature was set to a temperature of 420±2° C.

Next, Al, In, and Sb were simultaneously evaporated at a predetermined vapor pressure ratio (beam intensity ratio measured with a beam monitor) to grow a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance to a thickness of 0.7 micrometers at a growth rate of 1 micrometer/h on the GaAs (100) surface. Then, In and Sb were simultaneously evaporated from the evaporation sources, and further, Sn was evaporated from the evaporation source in which Sn is a donor impurity, whereby a single-crystal InSb thin film which had a thickness of 0.3 micrometers and was doped with Sn, and had a sheet electron concentration of $2.4×10^{12}/cm^2$, a sheet resistance of 77 Ω/square, and an electron mobility of 35,000 $cm^2$/Vs on the $Al_{0.1}In_{0.9}Sb$ layer formed on the GaAs (100) surface was manufactured.

The InSb thin film lamination of this example has a thin film thickness of InSb, high electron mobility, and high sheet resistance, so that it is suitable for manufacturing a magneto resistance element which has high resistance when no magnetic field is applied, and a high resistance rate of change. Further, the InSb thin film of this example had increased electrons in the InSb conduction band due to doping of Sn as a donor impurity in comparison with the case where the donor impurity was undoped, and according to the effect of this, the temperature dependencies (temperature coefficients) of the Hall coefficient and sheet resistance around room temperature (in the range of −40 to 150° C.) were reduced by about one order, that is, reduced to 1/10 to 2/10 of those of the InSb thin film of Example 1. Then, a magneto resistance element was manufactured by using the InSb thin film of this example and performance thereof was investigated.

The manufactured two-terminal magneto resistance element is shown in FIG. 2 as a structure having many short bars. A magneto resistance element section formed of an InSb thin film except for the terminal electrodes has a length of 1450 micrometers, the InSb thin film has a width of 120 micrometers, and short bar electrodes consisting of four layers of Cu, Ni, Au, and Ni formed across the InSb magneto resistance element section with a width of 120 micrometers have a length of 120 micrometers and a width of 9 micrometers, and were formed at even intervals in direct contact with the InSb thin film. The resistance between the electrodes was 650Ω when no magnetic field was applied.

At a magnetic flux density of 0.45 T that was a magnetic flux density region to be applied when the magneto resistance element was used as a magnetic sensor, that is, a magnetic flux density region in which the magneto resistance changed linearly with respect to the magnetic flux density and a bias magnetic flux density region for detecting a weak magnetic field change with high sensitivity, an absolute resistance rate of change was 210%, and this was a great magneto resistance change. With an InSb thin film with this thickness, a magnetic sensor consisting of a magneto resistance element which had an extremely high resistance rate of change and high sensitivity that had not been realized in the past could be manufactured. According to the effect of Sn doping, the temperature dependency of the input resistance of the magneto resistance element of this example was as extremely small as about 0.2%/° C. This improvement in resistance change, high input resistance, and less temperature dependency of the input resistance of the magneto resistance element of the InSb thin film are extremely important in practical use, and dynamically improved the practical performance and functions of the magneto resistance element of the InSb thin film.

EXAMPLE 11

By using a molecular beam epitaxy apparatus as a crystal growing apparatus including a crystal growth chamber having the same function as used in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1×10^{−8}$ Torr or less when heating the substrate, an insulative GaAs substrate with a thickness of 0.35 millimeters and a diameter of 2 inches was heated to 620° C. while the (100) surface thereof was irradiated with As vapor containing $As_4$ or $As_2$ (that is, a step for preventing separation of constituent elements forming the GaAs substrate surface), and then the temperature was lowered to 420° C. Next, the substrate temperature was set to 420±2° C.

Next, Al, In, and Sb were simultaneously evaporated at a predetermined vapor pressure ratio (beam intensity ratio measured with a beam monitor) to grow a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance to a thickness of 0.7 micrometers, at a growth rate of 1 micrometer/h on the GaAs (100)

surface. Then, In and Sb were simultaneously evaporated at the same substrate temperature, whereby a single-crystal InSb thin film which had a thickness of 0.05 micrometers was manufactured on an AlInSb layer formed on the GaAs (100) surface.

Further, on this InSb thin film, a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance was grown to a thickness of 50 nanometers (0.05 micrometers), and then 6 nanometers GaAs was grown.

The InSb thin film of this example manufactured with this structure had an electron mobility of 20,000 $cm^2$/Vs and a sheet resistance of 3,000 Ω/square. As electron mobility of the InSb thin film which IS as extremely thin as 0.05 micrometers, the obtained electron mobility and sheet resistance are extremely high, so that a magnetic sensor such as a Hall element or magneto resistance element with high sensitivity and high input resistance can be manufactured by using this InSb thin film lamination as the magnetic sensitive portion.

As a result, obtained performance of the element showed an input resistance of 6,200Ω and a Hall voltage of 50 mV at 50 mT when driven with a constant voltage of 1V. The sensitivity in a magnetic field was as high as 50 mV/V·50 mT. This element has an extremely high input resistance, so that its driving power is small.

For the purpose of manufacturing a magnetic sensor with improved environment resistance performance, $Si_3N_4$ is frequently formed to 0.3 micrometers by plasma CVD on the surface of GaAs that is the uppermost layer (when no GaAs is provided, on the $Al_{0.1}In_{0.9}Sb$ insulating layer). Particularly, when the thickness of the InSb thin film is as small as 1 micrometer or less as in the case of this example, if 0.3 micrometer $Si_3N_4$ was formed by plasma CVD on the surface of InSb, it involves great performance fluctuation in many cases although the fluctuation depends on the thickness. When $Si_3N_4$ is directly formed to 0.3 micrometers by plasma CVD on 0.5 micrometer InSb, at least 80% or more electron mobility lowering and sheet resistance lowering occur, and the performance of the high sensitivity of the magnetic sensor expected at the beginning is lost, and a magnetic sensor with desired performance cannot be manufactured.

However, in this example, insulative $Al_{0.1}In_{0.9}Sb$ and GaAs (6 nanometers) were further formed on the InSb thin film, so that even when $Si_3N_4$ was formed to 0.3 micrometers by plasma CVD, the lowering in the electron mobility and sheet resistance was as small as 5% or less. As a result, in the case of this example, regardless of the small thickness of 0.05 micrometers of the InSb thin film, a magnetic sensor such as a Hall element or magneto resistance element having high sensitivity, high input resistance, and extremely high environment resistance performance could be manufactured. Even when the step of forming a protective layer of $Si_3N_4$ with a thickness of 0.3 micrometers by plasma CVD is added to the magnetic sensor manufacturing process, the element performance is rarely changed.

Obtained performance of the element showed an input resistance of 5,900Ω and a Hall voltage of 50 mV at 50 mT when driven with a constant voltage of 1V. The sensitivity in a magnetic field was as high as 50 mV/V·50 mT, and influence such as sensitivity lowering from the protective layer was rarely observed. On the other hand, the Hall element was provided with high reliability such as environment resistance performance and a lengthened lifetime according to formation of the $Si_3N_4$ protective layer with a thickness of 0.3 micrometers.

EXAMPLE 12

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1 \times 10^{-8}$ Torr or less when heating the substrate, an insulative GaAs substrate with a thickness of 0.35 millimeters and a diameter of 2 inches was heated to 620° C. while the (100) surface thereof was irradiated with As vapor containing $As_4$ or $As_2$ (that is, step for preventing separation of constituent elements forming the GaAs substrate surface), and the temperature was lowered to 420° C., and then the substrate temperature was set to 420±2° C.

Next, Ga, Al, In, and Sb were simultaneously made incident at a predetermined vapor pressure ratio (beam intensity ratio measured with a beam monitor) to grow 0.7 micrometers of a single-crystal $Al_{0.1}Ga_{0.05}In_{0.85}Sb$ mixed crystal thin film (with a lattice constant difference of 0.5% from InSb) which had atomicity proportions of 5% Ga, 85% In, and 10% Al and had insulation or semi-insulation or high resistance.

Then, In and Sb were simultaneously evaporated, and further, Sn was evaporated from the evaporation source in which Sn is a donor impurity, whereby a single-crystal InSb thin film which had a thickness of 0.3 micrometers and was doped with Sn was grown on the $Al_{0.1}Ga_{0.05}In_{0.95}Sb$ layer, and further, on this InSb, as a semiconductor protective layer consisting of two layers, a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance was grown to a thickness of 50 nanometers (0.05 micrometers), and then, 6 nanometer GaAs was grown.

As a result, a single-crystal InSb thin film having a sheet electron concentration of $2.4 \times 10^{12}/cm^2$, a sheet resistance of 76 Ω/square, and an electron mobility of 35,000 $cm^2$/Vs was manufactured.

The InSb thin film of this Example 12 has increased electrons in the conduction band of InSb due to doping with Sn as a donor impurity in comparison with the undoped case, and according to this effect, the temperature dependencies (temperature coefficients) of the Hall coefficient, sheet electron concentration, and sheet resistance around room temperature (in the range of −40 to 150° C.) were reduced by about one order, that is, reduced to $^{1}/_{10}$ to $^{2}/_{10}$ of those of Example 1. As a result, when a Hall element was manufactured by using the InSb thin film of this Example, the temperature dependency of the Hall voltage (magnetic field detection signal) when driven with a constant current was reduced by one order, that is, reduced to $^{1}/_{10}$ to $^{2}/_{10}$. The temperature dependency of the input resistance was also reduced to $^{1}/_{10}$ to $^{2}/_{10}$. Such reduction in temperature dependency of the Hall element is extremely important in practical use, and thinned the InSb layer and dynamically improved the practical performance and functions of the Hall element.

The obtained performance of the element showed an input resistance of 170Ω, and a Hall voltage of 90 mV at 50 mT when driven with a constant voltage of 1V. In other words, the sensitivity in a magnetic field was as extremely high as 90 mV/V·50 mT.

EXAMPLE 13

A molecular beam epitaxy apparatus to be used for manufacturing a thin film lamination of the present invention is formed of a cylindrical vacuum chamber for maintaining a vacuum and includes at least a mechanism which holds horizontally a GaAs substrate for growing crystals thereon and a mechanism which provides periodic movement such as rotation for irradiating equally and uniformly vapors of constituent elements of the thin film to be formed on the substrate surface from evaporation sources.

Further, the molecular beam epitaxy apparatus is a crystal growing apparatus which includes means for carrying the substrate in and out of a crystal growth chamber in a state where a vacuum in the crystal growth chamber is maintained. This apparatus includes a resistance heater as a heat radiation source which is in proximity to a substrate having a GaAs (100) surface on which an InSb thin film is grown and electrically heated to a high temperature and set on the opposite side of the InSb thin film growing surface, and further includes a plurality of evaporation sources which are set at a distance of 30 cm or more from the GaAs substrate surface and can irradiate vapor beams of elements charged in the evaporation sources at a predetermined intensity for a predetermined time, that is, a plurality of evaporation sources (Knudsen cells, called K-cells) as means for generating vapors of constituent elements for forming a thin film by electrical heating, temperature measuring sensors set in the respective evaporation sources to control the intensities of the vapors, and heating means and power supply means (mechanisms) which are set corresponding to the respective evaporation sources to maintain a state of generating vapors of elements charged in the evaporation sources corresponding to predetermined vapor intensities and maintain the evaporation sources at a predetermined evaporation source temperature, and means such as shutters or valves which can cut off vapors generated from the evaporation sources.

Further, in the molecular beam epitaxy apparatus as a crystal growing apparatus including a crystal growth chamber that includes a vapor intensity measuring device which can measure the intensities of vapors, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-9}$ Torr or less when heating the substrate, an insulative GaAs substrate with a thickness of 0.35 millimeters and a diameter of 2 inches heated to and kept at 620° C. was irradiated with As vapor containing $As_4$ or $As_2$ (that is, a step for preventing separation of constituent elements forming the GaAs substrate surface), and then the temperature was set and kept at to 420±2° C., and Al, In, and Sb were simultaneously made incident at a predetermined vapor pressure ratio (beam intensity ratio measured with a beam monitor) to grow 0.7 micrometers of a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high resistance, at a growth rate of 1 micrometer/h on the GaAs (100) surface. The $Al_{0.1}In_{0.9}Sb$ layer grown on the GaAs (100) surface under these trial manufacturing conditions were subjected to an experiment of X-ray diffraction, and the crystallinity of the $Al_{0.1}In_{0.9}Sb$ mixed crystal layer was evaluated.

As a result, the full width at half maximum of the peak of the $Al_{0.1}In_{0.9}Sb$ mixed crystal of the rocking curve of X-ray diffraction was 1150 seconds. Next, in and Sb were simultaneously evaporated to grow an InSb layer on the $Al_{0.1}In_{0.9}Sb$ layer while the substrate temperature was kept at the same temperature as in the case of the $Al_{0.1}In_{0.9}Sb$ growth. At the beginning of growth, lattice mismatch with the $Al_{0.1}In_{0.9}Sb$ layer is 0.5%, so that a low-electron mobility layer is formed, however, the influence of lattice mismatch is eliminated as the film thickness InSb becomes gradually thicker, and a layer with high electron mobility, that is, a high-electron mobility layer is formed. In this case, the thickness of the formed low-electron mobility layer was 20 nanometers in this example although this depended on conditions of temperature, etc., when growing. In other words, a single-crystal InSb thin film with a total thickness of 0.7 micrometers was grown, and a thin film lamination using the InSb thin film as an operation layer was manufactured.

The InSb thin film manufactured with this structure had an electron mobility of 53,000 $cm^2/Vs$ and a sheet resistance of 101 Ω/square, and these electron mobility and sheet resistance are extremely high. By using this InSb thin film lamination as the magnetic sensitive portion, a magnetic sensor such as a Hall element or magneto resistance element with high sensitivity and high input resistance (200Ω or more) can be manufactured. Obtained performance as a result of manufacturing of the Hall element by using the InSb thin film of this example as a magnetic sensitive portion showed an input resistance of 200Ω and a Hall voltage of 132 mV in response to application of a magnetic flux density of 50 mT when driven with a constant voltage of 1V. In other words, the sensitivity in a magnetic field was as high as 132 mV/V·50 mT.

EXAMPLE 14

The InSb thin film of trial example 1 may be used as it is for manufacturing a magnetic sensor, however, for the purpose of manufacturing a magnetic sensor with further improved environment resistance performance, a passivation layer of $Si_3N_4$ or $SiO_2$, etc., is frequently formed by plasma CVD as an environment resistance protective layer on the InSb thin film layer of trial example 1.

Ir. Example 14, under the same conditions as in Example 13, an $Al_{0.1}In_{0.9}Sb$ layer was further formed on the surface of the formed single-crystal InSb thin film with a thickness of 0.7 micrometers, and thereon, a thin layer of GaAs was further formed to form a semiconductor protective layer. In other words, a single-crystal $Al_{0.1}In_{0.9}Sb$ mixed crystal thin film (with a lattice constant difference of 0.5% from InSb) was grown to 50 nanometers (0.05 micrometers), and then a 6 nanometer GaAs layer was grown at the same substrate temperature as that when growing InSb to form a compound semiconductor protective layer.

By forming this semiconductor protective layer consisting of two layers of the $Al_{0.1}In_{0.9}Sb$ thin layer and the GaAs layer, on the portion immediately under the InSb surface, a low-electron mobility layer with a thickness of 20 nanometers was formed due to slight lattice mismatch (0.5%) between InSb and $Al_{0.1}In_{0.9}Sb$. This thickness generally differs depending on the conditions. Under the conditions of this example, the thickness was 20 nanometers.

The electron mobility of the InSb thin film of this example was 51,600 cm/Vs and the sheet resistance was 97 Ω/square. According to the semiconductor protective layer formation, high electron mobility and sheet resistance were obtained without great performance deterioration. In other words, by using this InSb thin film lamination as the magnetic sensitive portion, a magnetic sensor such as a Hall element or magneto resistance element with high sensitivity and high input resistance (200Ω or more) can be manufactured, and the thin film lamination is usable for manufacturing a high-sensitivity magnetic sensor.

By forming this semiconductor protective layer, an effect of suppressing performance deterioration caused by the passivation was obtained. Even when $Si_3N_4$ was formed to 0.3 micrometers by means of plasma CVD on the GaAs layer that is the uppermost layer, the lowering in electron mobility and sheet resistance was as extremely small as 5% or less. In other words, great performance deterioration due to passivation is eliminated, and even through the passivation step, the performance of the high electron mobility and high sheet resistance were not deteriorated. As a result, a magnetic sensor such as a Hall element or magneto resistance element having high sensitivity, high input resistance (200Ω or more) and more extremely high environment resistance reliability can be manufactured by using the InSb thin film lamination of this trial example as the magnetic sensor section.

Obtained performance when manufacturing a Hall element showed an input resistance of 205Ω and a Hall voltage of 126 mV at 50 mT when driven with a constant voltage of 1V. In other words, the sensitivity in a magnetic field was as high as 126 mV/V·mT. In comparison with trial example 1, the performance of the Hall element was not greatly changed, so that the influence of passivation was rarely observed according to formation of the AlGaSb semiconductor insulating layer.

EXAMPLE 15

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1 \times 10^{-8}$ Torr or less when heating the substrate, the (100) surface of a GaAs substrate with a thickness of 0.35 millimeters and a diameter of 2 inches heated and maintained at 620° C. was irradiated with As vapor containing $As_4$ or $As_2$ (that is, a step for preventing separation of constituent elements forming the GaAs substrate surface), and then the temperature was lowered and the substrate temperature was set to and kept at 420±2° C., and next, Al, In, and Sb were simultaneously made incident at a predetermined vapor pressure ratio (beam intensity ratio measured with a be an monitor) to grow 0.7 micrometers of a single-crystal $Al_{0.1}In_{0.9}Sb$ mixed crystal thin film (with a lattice constant difference of 0.5% from InSb) at a growth rate of 1 micrometer/h on the GaAs (100) surface.

Then, In and Sb were simultaneously evaporated from the evaporation sources to grow an InSb layer with a thickness of 0.3 micrometers on the $Al_{0.1}In_{0.9}Sb$ layer formed on the GaAs (100) surface while the substrate temperature was kept at the same temperature as in the case of the $Al_{0.1}In_{0.9}Sb$ layer growth. At the beginning of growth, lattice mismatch with $Al_{0.1}In_{0.9}Sb$ is 0.5%, so that a low-electron mobility layer is formed, however, the influence of lattice mismatch is eliminated as the film thickness InSb becomes gradually thicker, and a layer with high electron mobility, that is, a high-electron mobility layer is formed. In this case, the thickness of the formed low-electron mobility layer depends on conditions of the temperature of growing. In this example, the thickness was 20 nanometers. Further, on this InSb thin film, a single-crystal $Al_{0.1}In_{0.9}Sb$ mixed crystal thin film (with a lattice constant difference of 0.5% from InSb) which had atomicity proportions of 90% In and 10% Al and had insulation or semi-insulation or high-resistance was formed to 50 nanometers, and then a 6 nanometer GaAs layer was grown at the same substrate temperature as in the case of InSb. Due to the lattice mismatch between the $Al_{0.1}In_{0.9}Sb$ layer of the cap layer and InSb, the low-electron mobility layer formed immediately under the InSb surface had a thickness of 20 nanometers. A thin film lamination with an InSb thickness of 0.3 micrometers was thus manufactured.

The InSb thin film of this Example 15 manufactured with this structure is a single-crystal InSb thin film having an electron mobility of 37,000 $cm^2/Vs$ and a sheet electron concentration of $5.8 \times 10^{11}/cm^2$. Further, the sheet resistance of the InSb thin film is 300 Ω/square. Electron mobility lowering due to formation of the semiconductor protective layer was small, and the electron mobility and the sheet resistance were extremely high. By using this InSb thin film lamination as the magnetic sensitive portion, a magnetic sensor such as a Hall element or magneto resistance element with high sensitivity and high input resistance (500Ω or more) can be manufactured.

By using this InSb thin film lamination as a magnetic sensitive portion, a Hall element with high sensitivity and high input resistance (500Ω or more) was manufactured. Obtained performance of the element showed an input resistance of 550Ω and a Hall voltage of 92 mV at 50 mT when driven with a constant voltage of 1V. In other words, the sensitivity in a magnetic field is as high as 92 mV/V·50 mT. This element has an extremely high input resistance, so that its driving power is small.

For the purpose of manufacturing a magnetic sensor with further improved environment resistance performance, $Si_3N_4$ is frequently formed to 0.3 micrometers by plasma CVD on the surface of the magnetic sensor section of the thin film lamination. Particularly, when the InSb layer is as thin as 0.3 micrometers as in this example, if $Si_3N_4$ is formed to 0.3 micrometers by plasma CVD in direct contact with the surface of the InSb layer, a problem was posed that at least 40 to 50% or more lowering in electron mobility occurs, and the performance of the high sensitivity of the magnetic sensor expected at the beginning is lost, and a magnetic sensor with desired performance cannot be manufactured.

However, in the present embodiment, as a semiconductor protective layer consisting of two layers, insulative $Al_{0.1}In_{0.9}Sb$ and GaAs (6 nanometers) were further formed on the InSb thin film, and even when $Si_3N_4$ was formed to 0.3 micrometers by plasma CVD, lowering in electron mobility and sheet resistance was as extremely small as 3 to 5%. As a result, in the case of this trial example, although the InSb thin film was as thin as 0.3 micrometers, a magnetic sensor such as a Hall element or magneto resistance element whose performance deterioration in the element manufacturing process was extremely small and had high sensitivity, high input resistance (500Ω or more), and high environment resistance reliability could be manufactured. By thus forming a semiconductor protective layer, even when a passivation step for forming 0.3 micrometer $Si_3N_4$ by plasma CVD is added to the magnetic sensor manufacturing process, the performance of the manufactured element is rarely changed before and after this process.

In other words, the obtained performance of the element showed an input resistance of 590Ω and a Hall voltage of 89 mV at 50 mT when driven with a constant voltage of 1V. That is, the magnetic field sensitivity was as high as 89 mV/V·50 mT. On the other hand, the formation of the 0.3 micrometer $Si_3N_4$ passivation thin film provided the Hall element with high reliability such as environment resistance performance and a lengthened lifetime.

EXAMPLE 16

By using a molecular beam epitaxy apparatus as a crystal growing apparatus including a crystal growth chamber having the same function as in Example 13, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, the (100) surface of a GaAs substrate with a thickness of 0.35 millimeters and a diameter of 2 inches heated and maintained data predetermined temperature of 420° C. or more was irradiated with As vapor containing $As_4$ or $As_2$ (that is, a step for preventing separation of constituent elements forming the GaAs substrate surface), and then the temperature was lowered and the substrate temperature was set and kept at 420±2° C. Next, Al, In, and Sb were simultaneously made incident at a predetermined vapor pressure ratio (beam intensity ratio measured with a beam monitor) to grow 0.7 micrometers of a single-crystal $Al_{0.1}In_{0.9}Sb$ mixed crystal thin film (with a lattice constant difference of 0.5% from InSb) which had insulation or semi-insulation or high resistance at a growth rate of 1 micrometer/h on the GaAs (100) surface.

Then, In and Sb were simultaneously evaporated from evaporation sources charged with In and Sb, respectively, and Sn was further evaporated from an evaporation source in which Sn is a donor impurity to grow an InSb layer on the $Al_{0.1}In_{0.9}Sb$ layer while keeping the substrate temperature at 420±20° C. At the beginning of growth, lattice mismatch with the $Al_{0.1}In_{0.9}Sb$ layer is 0.5%, so that a low-electron mobility layer is formed, however, the influence of lattice mismatch is eliminated as the film thickness InSb becomes gradually thicker, and a layer with high electron mobility, that is, a high-electron mobility layer is formed. In this case, the thickness of the formed low-electron mobility layer was 20 nanometers in this example. Thus, an InSb thin film lamination which was a single crystal and had a total thickness of 0.3 micrometers, and contained Sn evenly doped in the InSb layer was manufactured.

Thus, a single-crystal InSb thin film lamination which had a total thickness of 0.3 micrometers and was doped with Sn, and had a sheet electron concentration of $2.0\times10^{12}/cm^2$, a sheet resistance of 77 Ω/square, and an electron mobility of 37,000 $cm^2/Vs$ was manufactured. Its performance was excellent although the sheet resistance slightly lowered due to Sn doping and the electron mobility slight lowered due to impurity scattering.

In the InSb thin film lamination of this example, according to doping of Sn as a donor impurity, electrons in the conduction band of InSb were increased in comparison with the undoped case, and by this effect, the temperature dependencies (temperature coefficients) of the sheet electron concentration and sheet resistance around room temperature (in the range of −40 to 150° C.) were reduced by about one order, that is, reduced to 1/10 to 2/10 in comparison with the undoped InSb layer of trial example 13 which was not doped with an impurity in the InSb layer. As a result, when a Hall element was manufactured by using the InSb thin film lamination of this example, the temperature dependency of the Hall voltage (magnetic field detection signal) when driven with a constant current was reduced by one order, that is, reduced to 1/10 to 2/10. The temperature dependency of the input resistance was also reduced to 1/10 to 2/10. This reduction in temperature dependency of the Hall element is extremely important in practical use, and thinned the InSb layer and dynamically improved the practical performance and functions of the Hall element.

The obtained performance of the element showed an input resistance of 160Ω and a Hall voltage of 90 mV at 50 mT when driven with a constant voltage of 1V. In other words, the sensitivity in a magnetic field was as extremely high as 90 mV/V·50 mT.

EXAMPLE 17

In Example 16, a single-crystal $Al_{0.1}In_{0.9}Sb$ mixed crystal thin film (with a lattice constant difference of 0.5% from InSb) was further grown as an insulative semiconductor protective layer consisting of two layers to a thickness of 50 nanometers (0.05 micrometers) on the InSb thin film, and then 6 nanometer GaAs was grown at the substrate temperature of 420±2° C.

As a result, a thin film lamination was manufactured which included a low-electron mobility layer with a thickness of 20 nanometers immediately under the surface of InSb due to the lattice mismatch between the $Al_{0.1}In_{0.9}Sb$ layer as a cap layer and InSb, and an InSb thin film operation layer which had a total thickness of 0.3 micrometers and was evenly doped with Sn.

The performance showed an electron mobility of 34,000 $cm^2/Vs$ and a sheet resistance of 80 Ω/square. These electron mobility and sheet resistance are extremely high. By using this InSb thin film as a magnetic sensitive portion, a magnetic sensor such as a Hall element or magneto resistance element with high sensitivity and high input resistance (180Ω or more) can be manufactured, and as in the case of trial example 16, an InSb thin film lamination usable for manufacturing a magnetic sensor with high sensitivity and less temperature dependency is obtained.

Further, in this example, the temperature dependency (temperature coefficient) of the sheet electron concentration of the InSb thin film around room temperature in the range of −40 to 150° C. was reduced by about one order, that is, reduced to 1/10 to 2/10 in comparison with the InSb layer of trial example 13 which was not doped with an impurity in the InSb layer. As a result, in a Hall element manufactured by using the InSb thin film of this trial example as a magnetic sensor section, the temperature dependencies of the Hall voltage (magnetic field detection signal) when driven with a constant current and the input resistance of the Hall element were reduced by one order, that is, reduced to 1/10 to 2/10.

Performance of a Hall element manufactured without forming an 0.3-micrometer insulation layer of $Si_3N_4$ in the Hall element manufacturing process showed an input resistance of 175Ω and a Hall voltage of 82 mV at 50 mT when driven with a constant voltage of 1V. Regardless of Sn doping, the input resistance is sufficiently high as 175Ω.

Further, for the purpose of manufacturing a magnetic sensor with further improved environment resistance performance, a passivation step for forming $Si_3N_4$ to 0.3 micrometers by plasma CVD on the surface of the GaAs layer of the uppermost layer of the InSb thin film lamination was performed. However, its influence was extremely small, and the basic performance of the Hall element such as the sensitivity, temperature dependency, and element resistance of the Hall element were rarely influenced. Therefore, the performance of the manufactured Hall element was not changed from the element performance of this example described above.

EXAMPLE 18

By using a molecular beam epitaxy apparatus as a crystal growing apparatus including a crystal growth chamber having the same function as in Example 13, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, the (100) surface of a GaAs substrate with a thickness of 0.35 millimeters and a diameter of 2 inches heated to and maintained at a predetermined temperature of 420° C. or more was irradiated with As vapor containing $As_4$ or $As_2$ (that is, a step for preventing separation of constituent elements forming the GaAs substrate surface), and then the temperature was lowered, and the substrate temperature was set to and kept at 420±2° C., and vapors of elements charged in the evaporation sources, that is, Al, In, and Sb were simultaneously made incident at a predetermined vapor pressure ratio (beam intensity ratio measured with a beam monitor) to grow 0.7 micrometers of a single-crystal $Al_{0.1}In_{0.9}Sb$ mixed crystal thin film (with a lattice constant difference of 0.5% from InSb) at a growth rate of 1 μm/h on the GaAs (100) surface.

Then, without changing the substrate temperature, while the temperature was set to and kept at 420±2° C., In and Sb were simultaneously evaporated from the evaporation sources, and a little later, Sn was evaporated from the evaporation source in which Sn is a donor impurity. In other words, for the purpose of forming an undoped InSb layer with a thickness of 10 nanometers from the hetero interface with $Al_{0.1}In_{0.9}Sb$, the shutters of the In and Sc cells were opened, and after 36 seconds, the shutter of the Sn cell was opened. According to these procedures, an InSb layer was grown on the AlInSb layer formed on the GaAs (100) surface while the substrate temperature was kept at the same temperature as of $Al_{0.1}In_{0.9}Sb$ growth. At the beginning of the growth, lattice mismatch with the $Al_{0.1}In_{0.9}Sb$ layer is 0.5%, so that a low-electron mobility layer is formed, however, according to a gradual increase in the film thickness of InSb, the influence of the lattice mismatch is eliminated, and a layer with high electron mobility, that is, a high-electron mobility layer is formed. The thickness of the low-electron mobility layer formed in this case was 20 nanometers.

To end the growth of the InSb layer, the shutter for Sn was closed 36 seconds earlier than the shutters of In and Sb cells. Thus, an InSb single-crystal thin film which had undoped layers of 10 nanometers on and under the InSb layer and was evenly doped with Sn at the central portion, and had a total thickness of 0.3 micrometers was grown. Then, a single-crystal InSb thin film lamination was manufactured by using this InSb thin film which had a sheet electron concentration of $1.8 \times 10^{12}/cm^2$, a sheet resistance of 82 Ω/square, and an electron mobility of 40,000 $cm^2/Vs$.

According to Sn doping, this InSb thin film lamination of this trial example 18 had increased electrons in the conduction band of InSb in comparison with the undoped case, and according to this effect, the temperature dependencies (temperature coefficients) of the sheet electron concentration and sheet resistance around room temperature (in the range of −40 to 150° C.) were reduced by about one order, that is, reduced to $1/10$ to $2/10$ in comparison with the InSb layer of the trial example 13 which was not doped with an impurity in the InSb layer. As a result, when a Hall element was manufactured by using the InSb thin film lamination of this example, the temperature dependency of the Hall voltage (magnetic field detection signal) when driven with a constant current was reduced by one order, that is, reduced to $1/10$ to $2/10$. The temperature dependency of the input resistance was also reduced to $1/10$ to $2/10$. This reduction in temperature dependency of the Hall element is extremely important in practical use, and thinned the InSb layer and dynamically improved practical performance and functions of the Hall element.

The obtained performance of the element showed an input resistance of 170Ω and a Hall voltage of 99 mV at 50 mT when driven with a constant voltage of 1V. In other words, the sensitivity in a magnetic field was as extremely high as 99 mV/V·50 mT.

Thus, unless the portions with low electron mobility in contact with the upper and lower surfaces of InSb are doped with Sn, the high electron mobility can be obtained, and the sheet resistance can be prevented from lowering. Therefore, when a magnetic sensor is manufactured, the sensitivity increases and the element resistance also slightly increases. These effects are obtained without depending on the InSb film thickness, however, the thinner the InSb film thickness, the greater the effects.

EXAMPLE 19

In the same manner as in Example 18, an InSb thin film which had undoped layers of 10 nanometers on and under the InSb layer and was doped with Sn at the central portion was grown, and further, on the InSb thin film, a single-crystal $Al_{0.1}In_{0.9}Sb$ mixed crystal thin film (with a lattice constant difference of 0.5% from InSb) was grown to a thickness of 50 nanometers (0.05 micrometers) as a semiconductor protective layer, and then 6 nanometer GaAs was grown.

As a result, due to lattice mismatch between $Al_{0.1}In_{0.9}Sb$ and InSb, a low-electron mobility layer with a small thickness of 20 nanometers was formed immediately under the surface of InSb. Thus, a thin film lamination including an InSb single-crystal thin film that had a 10 nanometers undoped portion in the interface portion in contact with $Al_{0.1}In_{0.9}Sb$ was manufactured.

The performance of the InSb thin film showed an electron mobility of 37,200 $cm^2/Vs$ and a sheet resistance of 75 Ω/square. According to Sn doping only at the central portion, the electron mobility and the sheet resistance were both increased. By using this InSb thin film as a magnetic sensitive portion, a magnetic sensor such as a Hall element or magneto resistance element with high sensitivity and high input resistance (150Ω or more) can be manufactured, and this InSb thin film is usable for manufacturing a magnetic sensor with high sensitivity and less temperature dependency.

Further, in this example, temperature dependency (temperature coefficient) of the sheet electron concentration of the InSb thin film around room temperature in the range of −40 to 150° C. was reduced by about one order, that is, reduced to $1/10$ to $2/10$ in comparison with the InSb layer of trial example 13 which was not doped with an impurity in the InSb layer. As a result, temperature dependencies of the Hall voltage (magnetic field detection signal) when driven with a constant current and the input resistance of a Hall element manufactured by using the InSb thin film of this trial example as a magnetic sensor section were reduced by one order, that is, reduced to $1/10$ to $2/10$.

Performance of a Hall element manufactured without forming the 0.3-micrometer insulating layer of $Si_3N_4$ in the Hall element manufacturing process showed an input resistance of 180Ω and a Hall voltage of 92 mV at 50 mT when driven with a constant voltage of 1V. In other words, the sensitivity in a magnetic field was as extremely high as 92 mV/V·50 mT. Regardless of Sn doping, the input resistance is also sufficiently high as 180Ω.

Further, for the purpose of manufacturing a magnetic sensor with further improved environment resistance performance, a passivation step was performed for forming 0.3 micrometers of $Si_3N_4$ by plasma CVD on the surface of GaAs (when GaAs was not provided, AlInSb insulating layer) that was the uppermost layer of the InSb lamination. However, its influence was extremely small, and the basic performance of the Hall element such as the sensitivity, the temperature dependency, and the element resistance of the Hall element were rarely influenced. Therefore, the performance of the manufactured Hall element was not changed from the element performance of the example described above.

EXAMPLE 20

By using a molecular beam epitaxy apparatus as a crystal growing apparatus including a crystal growth chamber having the same function and structure as those used in Example 13, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, a GaAs substrate with a thickness of 0.35 millimeters and a diameter of 2 inches was heated to 620° C. while the (100) surface thereof was irradiated with As vapor containing $As_4$ or $As_2$ (that is, a step for preventing separation of constituent elements forming the GaAs substrate surface), and then the temperature was lowered to 420° C. while irradiating As, and the substrate temperature was kept at 420±2° C.

Next, by simultaneously making Al, In, and Sb incident at a predetermined vapor pressure ratio (beam intensity ratio measured with a beam monitor), on the GaAs (100) surface, a single-crystal $Al_{0.1}In_{0.9}Sb$ mixed crystal thin film (with a lattice constant difference of 0.5% from InSb) was grown to 1.0 micrometer at a growth rate of 1 micrometer/h. The full width at half maximum of the X-ray diffraction of $Al_{0.1}In_{0.9}Sb$ formed under these conditions was 500 sec. It was also confirmed that the full width at half maximum decreased according to an increase in thickness of AlInSb.

Next, In and Sb were simultaneously evaporated, and further, Sn was evaporated from the evaporation source in which Sn is a donor impurity, the substrate temperature was maintained at the same temperature of 420±2.0° C. as in the case of $Al_{0.1}In_{0.9}Sb$ growth, and at the beginning of the growth where an InSb layer with a thickness of 0.15 micrometers was grown, the lattice mismatch with the $Al_{0.1}In_{0.9}Sb$ layer was 0.5%, so that a low-electron mobility layer was formed on the $Al_{0.1}In_{0.9}Sb$ layer formed on the GaAs (100) surface, however, as the InSb thin film thickness increased, the influence of the lattice mismatch was eliminated and a layer with high electron mobility, that is, a high-electron mobility layer was formed. The thickness of the low-electron mobility layer in this case was 10 nanometers in this example. That is, an InSb thin film which was a single crystal, had a total thickness of 0.15 micrometers, and was evenly doped with Sn as donor atoms was grown.

Further, a single-crystal $Al_{0.1}In_{0.9}Sb$ mixed crystal thin film (with a lattice constant difference of 0.5% from InSb) was grown to a thickness of 50 nanometers (0.05 micrometers) on the InSb thin film, and then 6-nanometer GaAs was grown.

As a result, due to the lattice mismatch between $Al_{0.1}In_{0.9}Sb$ and InSb, a low-electron mobility layer having a 1 nanometer thickness at the portion in contact with the hetero interface between AlInSb and InSb and a low-electron mobility layer having a thickness of 20 nanometers immediately under the InSb surface were formed. Thus, a thin film lamination including an InSb single-crystal thin film which had a total thickness of 0.15 micrometers and was evenly doped with Sn at the central portion was manufactured.

This InSb thin film had an electron mobility of 29,300 $cm^2$/Vs, a sheet resistance of 680 $\Omega$/square, and a sheet electron concentration of $3.2\times10^{-11}/cm^2$. These electron mobility and sheet resistance are extremely high, and by using this InSb thin film as a magnetic sensitive portion, a magnetic sensor such as a Hall element or magneto resistance element with high sensitivity and high input resistance (1,000$\Omega$ or more) can be manufactured, and it is obvious that this InSb thin film is usable for manufacturing a magnetic sensor with extremely small power consumption and high sensitivity.

Further, in this embodiment, by using this InSb thin film, a Hall element was manufactured by performing a protective layer forming (passivation thin film manufacturing) step for forming $Si_3N_4$ to a thickness of 0.3 micrometers. Particularly, as in this example, when the thickness of the InSb thin film is as extremely small as 0.15 micrometers, if $Si_3N_4$ is directly formed to 0.3 micrometers by plasma CVD on the surface of InSb, 60 to 70% or more lowering in electron mobility and sheet resistance occurs, and performance of high sensitivity of the magnetic sensor expected at the beginning is lost, and a Hall element with desired performance cannot be manufactured.

However, in the case of this example, according to the influence of the semiconductor protective layer, even when $Si_3N_4$ was formed to 0.3 micrometers by plasma CVD, the lowering in electron mobility and sheet resistance was as extremely small as 3% or less, that is, performance deterioration in the protective layer forming step is extremely small, and a Hall element with extremely high environment resistance reliability, high sensitivity, and high input resistance could be manufactured.

The performance thereof showed a Hall voltage of 75 mV in a magnetic field of 50 mT when driven with 1V, and an input resistance of 1150$\Omega$. The sensitivity in a magnetic field was as high as 75 mV/V·50 mT. In addition, high resistance such as an input resistance of 1150$\Omega$ was obtained, so that a Hall element whose power consumption when driven was extremely small could be manufactured.

EXAMPLE 21

By using a molecular beam epitaxy apparatus as a crystal growing apparatus including a crystal growth chamber having the same function and structure as those used in Example 13, an accumulated vapor pressure of remaining impurity gases, for example, $H_2$, CO, $CO_2$, He, $N_2$, and $O_2$, etc., (excluding vapors of elements forming the thin film, for example, $As_4$, $As_2$, $Sb_2$, $Sb_4$, etc.) was maintained at $1\times10^{-8}$ Torr or less when heating the substrate, a GaAs substrate with a thickness of 0.35 millimeters and a diameter of 2 inches was heated to 620° C. while the (100) surface thereof was irradiated with As vapor containing $As_4$ or $As_2$ (that is, a step for preventing separation of constituent elements forming the GaAs substrate surface), and then the temperature was lowered to 420° C. while irradiating As, and the substrate temperature was set to and kept at 420±2° C.

Next, by simultaneously making Al, In, and Sb incident at a predetermined vapor pressure ratio (beam intensity ratio measured with a beam monitor), on the GaAs (100) surface, a single-crystal $Al_{0.1}In_{0.9}Sb$ mixed crystal thin film (with a lattice constant difference of 0.5% from InSb) which had insulation or semi-insulation or high-resistance was grown to 1.0 micrometer at a growth rate of 1 micrometer/h. The full width at half maximum of the X-ray diffraction of $Al_{0.1}In_{0.9}Sb$ formed under these conditions was 500 sec.

Next, in and Sb were simultaneously evaporated from the evaporation sources charged with In and Sb, respectively, and further, Sn was evaporated from the evaporation source in which Sn is a donor impurity, and on the $Al_{0.1}In_{0.9}Sb$ layer formed on the GaAs (100) surface, while the substrate temperature was maintained at the same temperature as in the case of the $Al_{0.1}In_{0.9}Sb$ growth, the lattice mismatch with the $Al_{0.1}In_{0.9}Sb$ layer was 0.5% at the beginning of the growth where An InSb layer was grown, so that a low electron mobility layer was formed, however, as the InSb thin film thickness increased, the influence of the lattice mismatch was eliminated and a layer with high electron mobility, that is, a high-electron mobility layer was formed. The thickness of the low-electron mobility layer in this case was 10 nanometers in this example. That is, an InSb thin film which was a single crystal, had a total thickness of 0.15 micrometers, and was evenly doped with Sn as donor atoms was grown.

Further, a high-resistance single-crystal $Al_{0.1}In_{0.9}Sb$ mixed crystal thin film (with a lattice constant difference of 0.5% from InSb) was grown to a thickness of 70 nanometers (0.07 micrometers), and then 6-nanometer GaAs was grown.

As a result, due to the lattice mismatch between $Al_{0.1}In_{0.9}Sb$ and InSb, a low-electron mobility layer having a 10 nanometer thickness was formed immediately under the InSb surface. Thus, a thin film lamination including an InSb single-crystal thin film which had a total thickness of 0.15 micrometers and was evenly doped with Sn at the central portion was manufactured.

This InSb thin film had an electron mobility of 29,800 $cm^2/Vs$, a sheet resistance of 670 $\Omega$/square, and a sheet electron concentration of $3.2\times10^{11}/cm^2$. These electron mobility and sheet resistance are extremely high, and by using this InSb thin film as a magnetic sensitive portion, a magnetic sensor such as a Hall element or magneto resistance element with high input resistance (1,000$\Omega$ or more) can be manufactured, and it is obvious that this InSb thin film is usable for manufacturing a magnetic sensor with extremely small power consumption and high sensitivity.

Therefore, in this embodiment, by using this InSb thin film, a Hall element was manufactured by performing a protective layer forming (passivation layer formation) step for forming $Si_3N_4$ to a thickness of 0.3 micrometers. Particularly, as in this example, when the thickness of the InSb thin film is as extremely small as 0.15 micrometers, if $Si_3N_4$ is directly formed to 0.3 micrometers by plasma CVD on the surface of InSb, 60 to 70% or more lowering in electron mobility occurs, and performance of high sensitivity of the magnetic sensor expected at the beginning is lost, and a Hall element with desired performance cannot be manufactured.

However, in the case of this example, even when $Si_3N_4$ was formed to 0.3 micrometers by plasma CVD, the lowering in electron mobility and sheet resistance was as extremely small as 3% or less, that is, performance deterioration in the protective layer forming step is extremely small, and a Hall element with extremely high environment resistance reliability, high sensitivity, and high input resistance was manufactured.

The performance thereof showed a Hall voltage of 77 mV with a magnetic field of 50 mT when driven with 1V, and an input resistance of 1150$\Omega$. The sensitivity in a magnetic field was as high as 77 mV/V·50 mT.

In addition, high resistance such as an input resistance of 1110$\Omega$ was obtained, so that a Hall element whose power consumption when driven was extremely small was manufactured.

EXAMPLE 22

By using a molecular beam epitaxy apparatus as a crystal growing apparatus including a crystal growth chamber having the same function and structure as those used in Example 13, an accumulated vapor pressure of remaining impurity gases, for example, $H_2$, CO, $O_2$, He, $N_2$, and 2, etc., (excluding vapors of elements forming the thin film, for example, $As_4$, $As_2$, $Sb_2$, $Sb_4$, etc.) was maintained at $1\times10^{-8}$ Torr or less when heating the substrate, a GaAs substrate with a thickness of 0.35 millimeters and a diameter of 2 inches was heated to 610° C. while the (100) surface thereof was irradiated with As vapor containing $As_4$ or $As_2$ (that is, a step for preventing separation of constituent elements forming the GaAs substrate surface), and then the temperature was lowered to 420° C. while irradiating As, and the substrate temperature was set to and kept at 420±2° C.

Next, by simultaneously making Al, In, and Sb incident at a predetermined vapor pressure ratio (beam intensity ratio measured with a beam monitor), on the GaAs (100) surface, a single-crystal $Al_{0.1}In_{0.9}Sb$ mixed crystal thin film (with a lattice constant difference of 0.5% from InSb) which had insulation or semi-insulation or high-resistance was grown to 0.9 micrometers at a growth rate of 1 micrometer/h. The full width at half maximum of the X-ray diffraction of $Al_{0.1}In_{0.9}Sb$ formed under these conditions was 700 sec.

Next, In and Sb were simultaneously evaporated from the evaporation sources charged with In and Sb, respectively, and further, Sn was evaporated from the evaporation source in which Sn is a donor impurity, and on the $Al_{0.1}In_{0.9}Sb$ layer formed on the GaAs (100) surface, while the substrate temperature was maintained at the same temperature of 420±2° C. as in the case of the $Al_{0.1}In_{0.9}Sb$ growth, the shutters for In and Sb were simultaneously opened to start growing InSb. Then, after 36 seconds, the shutter of the evaporation source for Sn as a dopant was opened to start Sn doping. Thus, an InSb layer was grown while doping InSb with Sn. To end the InSb growth, 36 seconds after the shutter for Sn as a dopant was closed, the shutters for In and Sb were closed to end the growth of the InSb thin film with a thickness of 0.15 micrometers.

At the beginning of InSb growth, lattice mismatch with the $Al_{0.1}In_{0.9}Sb$ layer is 0.5%, so that a low-electron mobility layer is formed, however, the influence of lattice mismatch is eliminated as the film thickness InSb becomes gradually thicker, and a layer with high electron mobility, that is, a high-electron mobility layer is formed. In this case, the thickness of the formed low-electron mobility layer was 10 nanometers in this example. In the InSb thin film thus manufactured, the 10 nanometer portion with the low electron mobility laminated at the beginning of the InSb growth is undoped, and 10 nanometers laminated last is also undoped. An InSb thin film with a thickness of 0.15 micrometers structured so that the intermediate 130 nm high-electron mobility portion was doped with Sn was manufactured. Next, at the same substrate temperature, a single-crystal $Al_{0.1}In_{0.9}Sb$ mixed crystal thin film (with a lattice constant difference of 0.5% from InSb) was grown to a thickness of 70 nanometers (0.07 micrometers) on the InSb thin film, and then 6 nanometer GaAs was grown.

As a result, due to the lattice mismatch between $Al_{0.1}In_{0.9}Sb$ and InSb, a lower-electron mobility layer was formed at the portion with a thickness of 10 nanometers which was not doped with Sn immediately under the surface of InSb. Thus, a thin film lamination which had a total thickness of 0.15 micrometers and included an InSb single-crystal thin film whose 10 nanometer lower surface portion and upper surface portion were undoped and whose only high-electron mobility portion with a thickness of 130 nanometers at the central portion was evenly doped with Sn was manufactured.

This InSb thin film had an electron mobility of 31,500 $cm^2/Vs$, a sheet resistance of 630 $\Omega$/square, and a sheet electron concentration of $3.0\times10^{11}/cm^2$. These electron mobility and sheet resistance are extremely high, and by using this InSb thin film as a magnetic sensitive portion, a magnetic sensor such as a Hall element or magneto resistance element with high sensitivity and high input resistance (1,000Ω or more) can be manufactured, and it is obvious that this InSb thin film is usable for manufacturing a magnetic sensor with extremely small power consumption and high sensitivity.

Therefore, in this embodiment, by using this InSb thin film, a Hall element was manufactured by performing a protective layer forming (passivation=RC forming) step for forming $Si_3N_4$ to a thickness of 0.3 micrometers. When the thickness of the InSb thin film is as extremely small as 0.15 micrometers, if $Si_3N_4$ is directly formed to 0.3 micrometers by plasma CVD on the surface of InSb, 60 to 70% or more lowering in electron mobility and sheet resistance occurs. However, in the case of this example, a semiconductor insulating layer was formed on the InSb layer, so that, even when $Si_3N_4$ was formed to 0.3 micrometers by plasma CVD, the lowering in electron mobility and sheet resistance was as extremely small as 3% or less, that is, performance deterioration in the protective layer forming step is extremely small, and a Hall element with extremely high environment resistance reliability, high sensitivity, and high input resistance was manufactured.

The performance thereof showed a Hall voltage of 85 mV with a magnetic field of 50 mT when driven with 1V, and an input resistance of 1050Ω. The sensitivity in the magnetic field was as high as 85 mV/V·50 mT. In addition, high resistance such as an input resistance of 1050Ω was obtained, so that a Hall element whose power consumption when driven was extremely small was manufactured.

EXAMPLE 23

By using a molecular beam epitaxy apparatus as a crystal growing apparatus including a crystal growth chamber having the same function as that in Example 1, an accumulated vapor pressure of remaining impurity gases, for example, $H_2$, CO, $CO_2$, He, $N_2$, and $O_2$, etc. (excluding vapors of elements forming the thin film, for example, $As_4$, $As_2$, $Sb_2$, $Sb_4$, etc.) was maintained at $1 \times 10^{-9}$ Torr or less when heating the substrate, a GaAs substrate with a thickness of 0.35 millimeters and a diameter of 2 inches was heated to 610° C. while the (100) surface thereof was irradiated with As vapor containing $As_4$ or $As_2$ (that is, a step for preventing separation of constituent elements forming the GaAs substrate surface), and then the temperature was lowered to 420° C., and the substrate temperature was set to 420±2° C.

Then, by simultaneously making vapors of elements In, and Sb charged in the evaporation sources incident at a predetermined vapor pressure ratio (beam intensity ratio measured with a beam monitor), on the GaAs (100) surface, a single-crystal $Al_{0.10}Ga_{0.05}In_{0.85}Sb$ mixed crystal thin film (with a lattice constant difference of 0.5% from InSb) which had atomicity proportions of 5% Ga, 85% In, and 10% Al and had insulation or semi-insulation or high-resistance was grown to 0.7 micrometers at a growth rate of 1 micrometer/h.

Next, In and Sb were simultaneously evaporated from the evaporation sources, and further, Sn was evaporated from the evaporation source in which Sn is a donor impurity, and on the AlInSb layer formed on the GaAs (100) surface, an InSb single-crystal thin film which had a thickness of 0.3 micrometers and was doped with Sn was grown, and further, at the same substrate temperature as that of InSb growth, on the InSb thin film, a single-crystal $Al_{0.10}In_{0.90}Sb$ mixed crystal thin film (with a lattice constant difference of 0.5% from InSb) which had atomicity proportions of 90% In, and 10% Al and had insulation or semi-insulation or high-resistance was grown to 50 nanometers (0.05 micrometers), and then, 6 nanometer GaAs was grown.

As a result, a single-crystal InSb thin film with a sheet electron concentration of $2.4 \times 10^{12}/cm^2$, a sheet resistance of 76 Ω/square, and an electron mobility of 35,000 $cm^2/Vs$ was manufactured. According to doping with Sn as a donor impurity, the InSb thin film had increased electrons in the conduction band of InSb in comparison with the undoped case, and according to the effect of this, temperature dependencies of the Hall coefficient, the sheet electron concentration, and the sheet resistance around room temperature (in the range of −40 to 150° C.) were reduced by about one order, that is, reduced to $1/10$ to $2/10$ in comparison with undoped InSb. As a result, when a Hall element was manufactured by using the InSb thin film of this example, the temperature dependency of the Hall voltage (magnetic field detection signal) when driven with a constant current was reduced by one order, that is, reduced to $1/10$ to $2/10$. The temperature dependency of the input resistance was also reduced to $1/10$ to $2/10$. This reduction in temperature dependency of the Hall element is extremely important in practical use, and thinned the InSb layer and dynamically improved the practical performance and functions of the Hall element.

The performance of the obtained element showed an input resistance of 170Ω and a Hall voltage of 90 mV at 50 mT when driven with a constant voltage of 1V. In other words, the sensitivity in the magnetic field was as extremely high as 90 mV/V·50 mT.

EXAMPLE 24

By using a molecular beam epitaxy apparatus as a crystal growing apparatus including a crystal growth chamber having the same function as in Example 1, an accumulated vapor pressure of remaining impurity gases, for example, $H_2$, CO, $CO_2$, He, $N_2$, and $O_2$, etc. (excluding vapors of elements forming the thin film, for example, $As_4$, $As_2$, $Sb_2$, $Sb_4$, etc.) was maintained at $1 \times 10^{-8}$ Torr or less when heating the substrate, a GaAs substrate with a thickness of 0.35 millimeters and a diameter of 2 inches was heated to 620° C. while the (100) surface thereof was irradiated with As vapor containing $As_4$ or $As_2$ (that is, a step for preventing separation of constituent elements forming the GaAs substrate surface), and the temperature was lowered to 420° C., and then set to and kept at 420±2° C.

Then, by simultaneously making Al, In, and Sb incident at a predetermined vapor pressure ratio (beam intensity ratio measured with a beam monitor), on the GaAs (100) surface, a single-crystal $Al_{0.1}In_{0.9}Sb$ mixed crystal thin film (with a lattice constant difference of 0.5% from InSb) which had atomicity proportions of 90% In and 10% Al, and had insulation or semi-insulation or high-resistance was grown to 0.7 micrometers at a growth rate of 1 micrometer/h. Next, In and Sb were simultaneously evaporated from the evaporation sources charged with In and Sb, respectively, and further, Sn was evaporated from the evaporation source in which Sn is a donor impurity, and on the $Al_{0.1}In_{0.9}Sb$ layer formed on the GaAs (100) surface, a single-crystal InSb thin film which had a thickness of 0.3 micrometers and was doped with Sn, and had a sheet electron concentration of $2.4 \times 10^{12}/cm^2$, a sheet resistance of 77 Ω/square, and an electron mobility of 35,000 $cm^2/Vs$ was formed. The performance was excellent although slight sheet resistance lowering due to Sn doping and slight electron mobility lowering due to impurity scattering were observed. Thus, the thin film lamination of the present invention was manufactured.

The InSb thin film lamination of this example has a thin film thickness, a high electron mobility, and a high sheet resistance, so that it is suitable for manufacturing a magneto resistance element which shows a high resistance when no magnetic field is applied and high resistance rate of change. Further, according to doping with Sn as a donor impurity, the InSb thin film of this example had increased electrons in the InSb layer in comparison with the undoped case, and according to the effect of this, temperature dependencies (temperature coefficients) of the Hall coefficient and sheet resistance around room temperature (in the range of −40 to 150° C.) were reduced by about one order, that is, reduced to 1/10 to 2/10 in comparison with the undoped InSb thin film. Therefore, a magneto resistance element was manufactured by using the InSb thin film of this embodiment and the performance thereof was investigated.

The manufactured 2-terminal magneto resistance element was structured so as to have many short bars, and is shown in FIG. 2. Except for the terminal electrodes, the length of the magneto resistance element section formed of an InSb thin film was 1450 micrometers, the width of the InSb thin film was 120 micrometers, and the short bar electrode consisting of four layers of Cu, Ni, Au, and Ni with a width of 120 micrometers formed across the InSb magneto resistance element section had a length of 120 micrometers and a width of 9 micrometers, and the short bars were formed at even intervals so as to be in direct contact with the InSb thin film. To form the short bar electrodes and terminal electrodes, for the purpose of forming n+ layers at the InSb surface portions corresponding to the lower portions of the electrodes, on the terminal electrodes and the InSb layer surfaces of the short bar electrode lower portions, Sn was deposited in advance to 2 nanometers by using a photoresist as a mask according to a lift off method, and then heated for 5 minutes at 300° C. for diffusing Sn onto the surface of the InSb layer. The resistance between electrodes of the magneto resistance element thus manufactured was 650Ω when no magnetic field was applied.

At a magnetic flux density of 0.45 T that was in a magnetic flux density region to be applied when the magneto resistance element was used as a magnetic sensor, that is, a magnetic flux density region in which the magneto resistance changed linearly with respect to the magnetic flux density and a bias magnetic flux density region for detecting a weak magnetic field change with high sensitivity, an absolute resistance rate of change was 210%, and this was a great magneto resistance change. With an InSb thin film with this thickness, a magnetic sensor consisting of a magneto resistance element which had an extremely high resistance rate of change and high sensitivity that had not been realized in the past could be manufactured. According to the effect of Sn doping, the temperature dependency of the input resistance of the magneto resistance element of this example was as extremely small as about 0.2%/° C. This improvement in resistance change, high input resistance, and less temperature dependency of the input resistance of the magneto resistance element of the InSb thin film are extremely important in practical use, and dynamically improved the practical performance and functions of the magneto resistance element of the InSb thin film.

The invention claimed is:

1. A thin film lamination comprising:
    an InSb layer that is an InSb thin film formed on a substrate;
    an $Al_xGa_yIn_{1-x-y}Sb$ mixed crystal layer ($0 \leq x$, $y \leq 1$) which shows resistance higher than that of the InSb layer or insulation, and has a band gap larger than that of InSb; and
    wherein the mixed crystal layer is provided between the substrate and the InSb layer, and has a content (x+y) of Al and Ga atoms in the range of 5.0 to 17% ($0.05 \leq x+y \leq 0.17$), or lattice mismatch with the mixed crystal layer in contact with the InSb layer is in the range of 0.25 to 1.0%.

2. The thin film lamination according to claim 1, wherein the mixed crystal layer has a full width at half maximum of 1 second or more and 1300 seconds or less of a rocking curve of X-ray diffraction from the (004) lattice plane.

3. The thin film lamination according to claim 1, wherein the electron concentration at room temperature of the InSb layer is in the range of $1.2 \times 10^{16}$ to $5.0 \times 10^{18}$ cm$^{-3}$.

4. The thin film lamination according to claim 1, wherein the InSb layer is doped with a donor impurity of any of Sn, Si, S, Te, and Se.

5. The thin film lamination according to claim 1, wherein a second $Al_xGa_yIn_{1-x-y}Sb$ mixed crystal layer similar to the $Al_xGa_yIn_{1-x-y}Sb$ mixed crystal layer is provided as an insulative semiconductor protective layer on a surface of the InSb layer opposite to the surface in contact with the substrate.

6. The thin film lamination according to claim 5, wherein the $Al_xGa_yIn_{1-x-y}Sb$ mixed crystal layer or the second $Al_xGa_yIn_{1-x-y}Sb$ mixed crystal layer is an $Al_xIn_{1-x}Sb$ mixed crystal layer.

7. The thin film lamination according to claim 1, wherein the InSb layer includes a low-electron mobility layer, and the low-electron mobility layer is in contact with the $Al_xGa_yIn_{1-x-y}Sb$ mixed crystal layer, and has a thickness of 0.5 nanometers or more and 30 nanometers or less.

8. The thin film lamination according to claim 7, wherein the $Al_xGa_yIn_{1-x-y}Sb$ mixed crystal layer or the second $Al_xGa_yIn_{1-x-y}Sb$ mixed crystal layer is an $Al_xIn_{1-x}Sb$ mixed crystal layer.

9. The thin film lamination according to claim 1, wherein the low-electron mobility layer is in contact with interfaces between the InSb layer and the substrate, and the second $Al_xGa_yIn_{1-x-y}Sb$ mixed crystal layer.

10. The thin film lamination according to claim 9, wherein the $Al_xGa_yIn_{1-x-y}Sb$ mixed crystal layer or the second $Al_xGa_yIn_{1-x-y}Sb$ mixed crystal layer is an $Al_xIn_{1-x-y}Sb$ mixed crystal layer.

11. A method for manufacturing the thin film lamination according to claim 1, comprising at least the step of: laminating the predetermined $Al_xGa_yIn_{1-x-y}Sb$ mixed crystal layer on the substrate, then forming a low-electron mobility layer of InSb at a substrate temperature set so that its difference from the substrate temperature is within ±5° C., and subsequently forming a high-electron mobility layer.

12. An InSb thin film magnetic sensor using the InSb layer of the thin film lamination according to claim 1 as a magnetic sensor section.

13. The InSb thin film magnetic sensor according to claim 12, wherein the InSb layer is an operation layer of any one of a Hall element, an element using a Hall effect, a magneto resistance element, and an element using a magneto resistance effect.

14. The InSb thin film magnetic sensor according to claim 13, wherein the thickness of the InSb layer is 8 nanometers or more and 2,000 nanometers or less.

15. The InSb thin film magnetic sensor according to claim 12, wherein the thickness of the $Al_xGa_yIn_{1-x-y}Sb$ mixed crystal layer is 50-nanometers or more and 3000 nanometers or less.

16. The InSb thin film magnetic sensor according to claim 12, wherein the InSb layer is a single crystal.

17. The InSb thin film magnetic sensor according to claim 12, wherein the thickness of the InSb layer is 8 nanometers or more and 300 nanometers or less.

18. The InSb thin film magnetic sensor according to claim 12, comprising a second $Al_xGa_yIn_{1-x-y}Sb$ mixed crystal layer as a semiconductor protective layer on the InSb layer.

19. The InSb thin film magnetic sensor according to claim 12, wherein the $Al_xGa_yIn_{1-x-y}Sb$ mixed crystal layer or the second $Al_xGa_yIn_{1-x-y}Sb$ mixed crystal layer, or both of these are $Al_xIn_{1-x}Sb$ mixed crystal layers which do not contain Ga.

20. The InSb thin film magnetic sensor according to claim 12, wherein the $Al_xGa_yIn_{1-x-y}Sb$ mixed crystal layer or the second $Al_xGa_yIn_{1-x-y}Sb$ mixed crystal layer, or both of these are $Al_{0.1}In_{0.9}Sb$ mixed crystal layers.

21. The InSb thin film magnetic sensor according to claim 12, further comprising a GaAs layer on the second $Al_xGa_yIn_{1-x-y}Sb$ mixed crystal layer.

22. The InSb thin film magnetic sensor according to claim 12, wherein the InSb layer is doped with a donor impurity.

23. The InSb thin film magnetic sensor according to claim 22, wherein the donor impurity belongs to Group IV or VI like Sn, Si, S, Te, and Se.

24. The InSb thin film magnetic sensor according to claim 22, wherein in the InSb layer, a portion except for 1.5 to 20 nanometers from the interface with the $Al_xGa_yIn_{1-x-y}Sb$ mixed crystal layer is doped with a donor impurity.

25. The InSb thin film magnetic sensor according to claim 12, wherein a metal thin film as an electrode is formed in contact with a predetermined surface portion of the InSb thin film, and at least the surface of the InSb thin film at the portion where the metal thin film is formed and the donor impurity is doped with a larger amount of a donor impurity than at other portions.

26. The InSb thin film magnetic sensor according to claim 12, wherein the InSb thin film magnetic sensor is a Hall element or magneto resistance element.

27. A method for manufacturing the InSb thin film magnetic sensor according to claim 12, comprising the step of laminating the $Al_xGa_yIn_{1-x-y}Sb$ mixed crystal layer on the substrate at a predetermined substrate temperature, then forming a low-electron mobility layer of an InSb thin film at a substrate temperature set so that its difference from the substrate temperature is within ±5° C., and subsequently forming a high-electron mobility layer.

* * * * *